(12) United States Patent
Millward

(10) Patent No.: US 9,142,420 B2
(45) Date of Patent: Sep. 22, 2015

(54) EXTENSIONS OF SELF-ASSEMBLED STRUCTURES TO INCREASED DIMENSIONS VIA A "BOOTSTRAP" SELF-TEMPLATING METHOD

(75) Inventor: Dan B. Millward, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/470,459

(22) Filed: May 14, 2012

(65) Prior Publication Data

US 2012/0225243 A1  Sep. 6, 2012

Related U.S. Application Data

(62) Division of application No. 11/738,169, filed on Apr. 20, 2007, now Pat. No. 8,372,295.

(51) Int. Cl.
| | |
|---|---|
| *B32B 7/00* | (2006.01) |
| *B32B 3/30* | (2006.01) |
| *H01L 21/308* | (2006.01) |
| *B81C 1/00* | (2006.01) |
| *B82Y 10/00* | (2011.01) |
| *B82Y 40/00* | (2011.01) |
| *G03F 7/00* | (2006.01) |
| *H01L 21/033* | (2006.01) |
| *B82Y 30/00* | (2011.01) |

(52) U.S. Cl.
CPC ........ *H01L 21/3086* (2013.01); *B81C 1/00031* (2013.01); *B82Y 10/00* (2013.01); *B82Y 40/00* (2013.01); *G03F 7/0002* (2013.01); *H01L 21/0337* (2013.01); *B81B 2203/0361* (2013.01); *B81C 2201/0149* (2013.01); *B82Y 30/00* (2013.01); *Y10T 428/24182* (2015.01); *Y10T 428/24612* (2015.01)

(58) Field of Classification Search
None
See application file for complete search history.

(56) References Cited

U.S. PATENT DOCUMENTS

| | | | |
|---|---|---|---|
| 4,623,674 | A | 11/1986 | Bailey et al. |
| 4,797,357 | A | 1/1989 | Mura et al. |
| 4,818,713 | A | 4/1989 | Feygenson |

(Continued)

FOREIGN PATENT DOCUMENTS

| | | |
|---|---|---|
| CN | 1562730 | 1/2005 |
| CN | 1799131 A | 7/2006 |

(Continued)

OTHER PUBLICATIONS

Sang Ouk Kim, et al. "Epitaxial self-assembly of block copolymer on lithographically defined nanopatterned substrates", Jul. 24, 2003, Nature, vol. 424, 411-414.*

(Continued)

*Primary Examiner* — David Sample
*Assistant Examiner* — Donald M Flores, Jr.
(74) *Attorney, Agent, or Firm* — TraskBritt

(57) ABSTRACT

Methods for fabricating sublithographic, nanoscale arrays of openings and linear microchannels utilizing self-assembling block copolymers, and films and devices formed from these methods are provided. Embodiments of the invention use a self-templating or multilayer approach to induce ordering of a self-assembling block copolymer film to an underlying base film to produce a multilayered film having an ordered array of nanostructures that can be removed to provide openings in the film which, in some embodiments, can be used as a template or mask to etch openings in an underlying material layer.

7 Claims, 30 Drawing Sheets

(56) References Cited

U.S. PATENT DOCUMENTS

| | | | |
|---|---|---|---|
| 4,877,647 A | 10/1989 | Klabunde |
| 5,328,810 A | 7/1994 | Lowrey et al. |
| 5,374,367 A | 12/1994 | Edamura et al. |
| 5,382,373 A | 1/1995 | Carlson |
| 5,482,656 A | 1/1996 | Hiraoka et al. |
| 5,512,131 A | 4/1996 | Kumar et al. |
| 5,538,655 A | 7/1996 | Fauteux |
| 5,580,700 A | 12/1996 | Rahman et al. |
| 5,620,850 A | 4/1997 | Bamdad et al. |
| 5,622,668 A | 4/1997 | Thomas |
| 5,772,905 A | 6/1998 | Chou |
| 5,834,583 A | 11/1998 | Hancock et al. |
| 5,849,810 A | 12/1998 | Muller |
| 5,879,582 A | 3/1999 | Havelka et al. |
| 5,879,853 A | 3/1999 | Azuma |
| 5,891,356 A | 4/1999 | Inoue et al. |
| 5,904,824 A | 5/1999 | Oh |
| 5,925,259 A | 7/1999 | Biebuyck et al. |
| 5,948,470 A | 9/1999 | Harrison et al. |
| 5,958,704 A | 9/1999 | Starzl et al. |
| 6,051,869 A | 4/2000 | Pan et al. |
| 6,111,323 A | 8/2000 | Carter et al. |
| 6,143,647 A | 11/2000 | Pan et al. |
| 6,153,495 A | 11/2000 | Kub et al. |
| 6,207,787 B1 | 3/2001 | Fahey et al. |
| 6,251,791 B1 | 6/2001 | Tsai et al. |
| 6,270,946 B1 | 8/2001 | Miller |
| 6,309,580 B1 | 10/2001 | Chou |
| 6,310,138 B1 | 10/2001 | Yonezawa et al. |
| 6,312,971 B1 | 11/2001 | Amundson et al. |
| 6,368,871 B1 | 4/2002 | Christel et al. |
| 6,403,382 B1 | 6/2002 | Zhu et al. |
| 6,414,164 B1 | 7/2002 | Afzali-Ardakani et al. |
| 6,423,465 B1 | 7/2002 | Hawker et al. |
| 6,423,474 B1 | 7/2002 | Holscher |
| 6,503,841 B1 | 1/2003 | Criscuolo |
| 6,506,660 B2 | 1/2003 | Holmes et al. |
| 6,517,933 B1 | 2/2003 | Soane et al. |
| 6,518,194 B2 | 2/2003 | Winningham et al. |
| 6,537,920 B1 | 3/2003 | Krivokapic |
| 6,548,830 B1 | 4/2003 | Noguchi et al. |
| 6,565,763 B1 | 5/2003 | Asakawa |
| 6,565,764 B2 | 5/2003 | Hiraoka et al. |
| 6,566,248 B1 | 5/2003 | Wang et al. |
| 6,569,528 B2 | 5/2003 | Nam et al. |
| 6,573,030 B1 | 6/2003 | Fairbairn et al. |
| 6,592,764 B1 | 7/2003 | Stucky et al. |
| 6,630,520 B1 | 10/2003 | Bruza et al. |
| 6,635,912 B2 | 10/2003 | Ohkubo |
| 6,656,308 B2 | 12/2003 | Hougham et al. |
| 6,679,996 B1 | 1/2004 | Yao |
| 6,682,660 B2 | 1/2004 | Sucholeiki et al. |
| 6,689,473 B2 | 2/2004 | Guire et al. |
| 6,699,797 B1 | 3/2004 | Morris et al. |
| 6,713,238 B1 | 3/2004 | Chou et al. |
| 6,746,825 B2 | 6/2004 | Nealey et al. |
| 6,767,693 B1 | 7/2004 | Okoroanyanwu |
| 6,780,492 B2 | 8/2004 | Hawker et al. |
| 6,781,166 B2 | 8/2004 | Lieber et al. |
| 6,797,202 B2 | 9/2004 | Endo et al. |
| 6,809,210 B2 | 10/2004 | Chandross et al. |
| 6,812,132 B2 | 11/2004 | Ramachandrarao et al. |
| 6,825,358 B2 | 11/2004 | Afzali-Ardakani et al. |
| 6,884,842 B2 | 4/2005 | Soane et al. |
| 6,887,332 B1 | 5/2005 | Kagan et al. |
| 6,890,624 B1 | 5/2005 | Kambe et al. |
| 6,890,703 B2 | 5/2005 | Hawker et al. |
| 6,908,861 B2 | 6/2005 | Sreenivasan et al. |
| 6,911,400 B2 | 6/2005 | Colburn et al. |
| 6,913,697 B2 | 7/2005 | Lopez et al. |
| 6,924,341 B2 | 8/2005 | Mays |
| 6,926,953 B2 | 8/2005 | Nealey et al. |
| 6,940,485 B2 | 9/2005 | Noolandi |
| 6,946,332 B2 | 9/2005 | Loo et al. |
| 6,949,456 B2 | 9/2005 | Kumar |
| 6,952,436 B2 | 10/2005 | Wirnsberger et al. |
| 6,957,608 B1 | 10/2005 | Hubert et al. |
| 6,962,823 B2 | 11/2005 | Empedocles et al. |
| 6,989,426 B2 | 1/2006 | Hu et al. |
| 6,992,115 B2 | 1/2006 | Hawker et al. |
| 6,995,439 B1 | 2/2006 | Hill et al. |
| 6,998,152 B2 | 2/2006 | Uhlenbrock |
| 7,001,795 B2 | 2/2006 | Jiang et al. |
| 7,009,227 B2 | 3/2006 | Patrick et al. |
| 7,030,495 B2 | 4/2006 | Colburn et al. |
| 7,037,738 B2 | 5/2006 | Sugiyama et al. |
| 7,037,744 B2 | 5/2006 | Colburn et al. |
| 7,045,851 B2 | 5/2006 | Black et al. |
| 7,056,455 B2 | 6/2006 | Matyjaszewski et al. |
| 7,056,849 B2 | 6/2006 | Wan et al. |
| 7,060,774 B2 | 6/2006 | Sparrowe et al. |
| 7,066,801 B2 | 6/2006 | Balijepalli et al. |
| 7,077,992 B2 | 7/2006 | Sreenivasan et al. |
| 7,087,267 B2 | 8/2006 | Breen et al. |
| 7,090,784 B2 | 8/2006 | Asakawa et al. |
| 7,112,617 B2 | 9/2006 | Kim |
| 7,115,305 B2 | 10/2006 | Bronikowski et al. |
| 7,115,525 B2 | 10/2006 | Abatchev et al. |
| 7,115,995 B2 | 10/2006 | Wong |
| 7,118,784 B1 | 10/2006 | Xie |
| 7,119,321 B2 | 10/2006 | Quinlan |
| 7,132,370 B2 | 11/2006 | Paraschiv |
| 7,135,144 B2 | 11/2006 | Christel et al. |
| 7,135,241 B2 | 11/2006 | Ferraris et al. |
| 7,135,388 B2 | 11/2006 | Ryu et al. |
| 7,135,523 B2 | 11/2006 | Ho et al. |
| 7,151,209 B2 | 12/2006 | Empedocles et al. |
| 7,163,712 B2 | 1/2007 | Chilkoti et al. |
| 7,166,304 B2 | 1/2007 | Harris et al. |
| 7,172,953 B2 | 2/2007 | Lieber et al. |
| 7,186,613 B2 | 3/2007 | Kirner |
| 7,189,430 B2 | 3/2007 | Ajayan et al. |
| 7,189,435 B2 | 3/2007 | Tuominen et al. |
| 7,190,049 B2 | 3/2007 | Tuominen et al. |
| 7,195,733 B2 | 3/2007 | Rogers et al. |
| 7,202,308 B2 | 4/2007 | Boussand et al. |
| 7,208,836 B2 | 4/2007 | Manning |
| 7,252,791 B2 | 8/2007 | Wasserscheid et al. |
| 7,259,101 B2 | 8/2007 | Zurcher et al. |
| 7,279,396 B2 | 10/2007 | Derderian et al. |
| 7,282,240 B1 | 10/2007 | Jackman et al. |
| 7,291,284 B2 | 11/2007 | Mirkin et al. |
| 7,311,943 B2 | 12/2007 | Jacobson et al. |
| 7,326,514 B2 | 2/2008 | Dai et al. |
| 7,332,370 B2 | 2/2008 | Chang et al. |
| 7,332,627 B2 | 2/2008 | Chandross et al. |
| 7,338,275 B2 | 3/2008 | Choi et al. |
| 7,347,953 B2 * | 3/2008 | Black et al. ............ 216/83 |
| 7,368,314 B2 | 5/2008 | Ufert |
| 7,407,887 B2 | 8/2008 | Guo |
| 7,408,186 B2 | 8/2008 | Merkulov et al. |
| 7,419,772 B2 | 9/2008 | Watkins et al. |
| 7,470,954 B2 | 12/2008 | Lee et al. |
| 7,514,339 B2 | 4/2009 | Yang et al. |
| 7,521,090 B1 | 4/2009 | Cheng et al. |
| 7,553,760 B2 | 6/2009 | Yang et al. |
| 7,569,855 B2 | 8/2009 | Lai |
| 7,585,741 B2 | 9/2009 | Manning |
| 7,592,247 B2 | 9/2009 | Yang et al. |
| 7,605,081 B2 | 10/2009 | Yang et al. |
| 7,632,544 B2 | 12/2009 | Ho et al. |
| 7,655,383 B2 | 2/2010 | Mela et al. |
| 7,658,773 B2 | 2/2010 | Pinnow |
| 7,700,157 B2 | 4/2010 | Bronikowski et al. |
| 7,767,099 B2 | 8/2010 | Li et al. |
| 7,888,228 B2 | 2/2011 | Blanchard |
| 7,959,975 B2 | 6/2011 | Millward |
| 7,964,107 B2 * | 6/2011 | Millward ............ 216/17 |
| 8,039,196 B2 | 10/2011 | Kim et al. |
| 8,080,615 B2 | 12/2011 | Millward |
| 8,083,953 B2 | 12/2011 | Millward et al. |
| 8,083,958 B2 | 12/2011 | Li et al. |
| 8,097,175 B2 | 1/2012 | Millward et al. |
| 8,101,261 B2 | 1/2012 | Millward et al. |

(56) References Cited

U.S. PATENT DOCUMENTS

| | | | |
|---|---|---|---|
| 8,114,300 B2 | 2/2012 | Millward | |
| 8,114,306 B2 | 2/2012 | Cheng et al. | |
| 8,206,601 B2 | 6/2012 | Bosworth et al. | |
| 8,287,749 B2 | 10/2012 | Hasegawa et al. | |
| 8,294,139 B2 | 10/2012 | Marsh et al. | |
| 2001/0024768 A1 | 9/2001 | Matsuo et al. | |
| 2001/0049195 A1 | 12/2001 | Chooi et al. | |
| 2002/0055239 A1 | 5/2002 | Tuominen et al. | |
| 2002/0084429 A1 | 7/2002 | Craighead et al. | |
| 2002/0158342 A1 | 10/2002 | Tuominen et al. | |
| 2002/0167117 A1 | 11/2002 | Chou | |
| 2003/0010241 A1 | 1/2003 | Fujihira et al. | |
| 2003/0034329 A1 | 2/2003 | Chou | |
| 2003/0068639 A1 | 4/2003 | Haneder et al. | |
| 2003/0077452 A1 | 4/2003 | Guire et al. | |
| 2003/0080471 A1 | 5/2003 | Chou | |
| 2003/0080472 A1 | 5/2003 | Chou | |
| 2003/0091752 A1 | 5/2003 | Nealey et al. | |
| 2003/0100822 A1 | 5/2003 | Lew et al. | |
| 2003/0108879 A1 | 6/2003 | Klaerner et al. | |
| 2003/0143375 A1 | 7/2003 | Noguchi et al. | |
| 2003/0157248 A1 | 8/2003 | Watkins et al. | |
| 2003/0178707 A1 | 9/2003 | Abbott | |
| 2003/0180522 A1 | 9/2003 | DeSimone et al. | |
| 2003/0180966 A1 | 9/2003 | Abbott et al. | |
| 2003/0185741 A1 | 10/2003 | Matyjaszewski | |
| 2003/0222048 A1 | 12/2003 | Asakawa et al. | |
| 2003/0235930 A1 | 12/2003 | Bao et al. | |
| 2004/0023287 A1 | 2/2004 | Harnack et al. | |
| 2004/0028875 A1 | 2/2004 | Van Rijn et al. | |
| 2004/0058059 A1 | 3/2004 | Linford et al. | |
| 2004/0084298 A1 | 5/2004 | Yao et al. | |
| 2004/0124092 A1 | 7/2004 | Black et al. | |
| 2004/0125266 A1 | 7/2004 | Miyauchi et al. | |
| 2004/0127001 A1 | 7/2004 | Colburn | |
| 2004/0142578 A1 | 7/2004 | Wiesner et al. | |
| 2004/0159633 A1 | 8/2004 | Whitesides et al. | |
| 2004/0163758 A1 | 8/2004 | Kagan et al. | |
| 2004/0175628 A1 | 9/2004 | Nealey et al. | |
| 2004/0192013 A1 | 9/2004 | Ryu et al. | |
| 2004/0222415 A1 | 11/2004 | Chou | |
| 2004/0242688 A1 | 12/2004 | Chandross et al. | |
| 2004/0254317 A1 | 12/2004 | Hu | |
| 2004/0256615 A1 | 12/2004 | Sirringhaus et al. | |
| 2004/0256662 A1 | 12/2004 | Black et al. | |
| 2004/0265548 A1 | 12/2004 | Ho et al. | |
| 2005/0008828 A1 | 1/2005 | Libera et al. | |
| 2005/0062165 A1 | 3/2005 | Saenger et al. | |
| 2005/0074706 A1 | 4/2005 | Bristol | |
| 2005/0079486 A1 | 4/2005 | Abbott et al. | |
| 2005/0100830 A1 | 5/2005 | Xu et al. | |
| 2005/0120902 A1 | 6/2005 | Adams et al. | |
| 2005/0124135 A1 | 6/2005 | Ayazi et al. | |
| 2005/0133697 A1 | 6/2005 | Potyrailo et al. | |
| 2005/0147841 A1 | 7/2005 | Tavkhelidze et al. | |
| 2005/0167651 A1 | 8/2005 | Merkulov et al. | |
| 2005/0176256 A1 | 8/2005 | Kudelka | |
| 2005/0208752 A1 | 9/2005 | Colburn et al. | |
| 2005/0238889 A1 | 10/2005 | Iwamoto | |
| 2005/0238967 A1 | 10/2005 | Rogers et al. | |
| 2005/0250053 A1 | 11/2005 | Marsh et al. | |
| 2005/0271805 A1 | 12/2005 | Kambe et al. | |
| 2005/0272341 A1 | 12/2005 | Colburn et al. | |
| 2006/0013956 A1 | 1/2006 | Angelescu et al. | |
| 2006/0014001 A1 | 1/2006 | Zhang et al. | |
| 2006/0024590 A1 | 2/2006 | Sandhu | |
| 2006/0030495 A1 | 2/2006 | Gregg | |
| 2006/0035387 A1 | 2/2006 | Wagner et al. | |
| 2006/0038182 A1 | 2/2006 | Rogers et al. | |
| 2006/0046079 A1 | 3/2006 | Lee | |
| 2006/0046480 A1 | 3/2006 | Guo | |
| 2006/0060863 A1 | 3/2006 | Lu et al. | |
| 2006/0062867 A1 | 3/2006 | Choi | |
| 2006/0078681 A1 | 4/2006 | Hieda et al. | |
| 2006/0097134 A1 | 5/2006 | Rhodes | |
| 2006/0105562 A1 | 5/2006 | Yi | |
| 2006/0124467 A1 | 6/2006 | Ho et al. | |
| 2006/0128165 A1 | 6/2006 | Theiss et al. | |
| 2006/0134556 A1 | 6/2006 | Nealey et al. | |
| 2006/0137554 A1 | 6/2006 | Kron et al. | |
| 2006/0141222 A1 | 6/2006 | Fischer et al. | |
| 2006/0141245 A1 | 6/2006 | Stellacci et al. | |
| 2006/0154466 A1 | 7/2006 | Lee et al. | |
| 2006/0163646 A1 | 7/2006 | Black | |
| 2006/0192283 A1 | 8/2006 | Benson | |
| 2006/0205875 A1 | 9/2006 | Cha et al. | |
| 2006/0211871 A1 | 9/2006 | Dai | |
| 2006/0217285 A1 | 9/2006 | Destarac | |
| 2006/0228635 A1 | 10/2006 | Suleski | |
| 2006/0231525 A1 | 10/2006 | Asakawa et al. | |
| 2006/0249784 A1 | 11/2006 | Black et al. | |
| 2006/0249796 A1 | 11/2006 | Tavkhelidze et al. | |
| 2006/0254440 A1 | 11/2006 | Choi et al. | |
| 2006/0255505 A1 | 11/2006 | Sandhu et al. | |
| 2006/0257633 A1 | 11/2006 | Inoue et al. | |
| 2006/0258159 A1 | 11/2006 | Colburn et al. | |
| 2006/0278158 A1 | 12/2006 | Tolbert et al. | |
| 2006/0281266 A1 | 12/2006 | Wells | |
| 2006/0286305 A1 | 12/2006 | Thies et al. | |
| 2006/0286490 A1 | 12/2006 | Sandhu et al. | |
| 2006/0292777 A1 | 12/2006 | Dunbar | |
| 2007/0020749 A1 | 1/2007 | Nealey et al. | |
| 2007/0023247 A1 | 2/2007 | Ulicny et al. | |
| 2007/0023805 A1 | 2/2007 | Wells | |
| 2007/0045562 A1 | 3/2007 | Parekh | |
| 2007/0045642 A1 | 3/2007 | Li | |
| 2007/0071881 A1 | 3/2007 | Chua et al. | |
| 2007/0072403 A1 | 3/2007 | Sakata | |
| 2007/0122749 A1 | 5/2007 | Fu et al. | |
| 2007/0122932 A1 | 5/2007 | Kodas et al. | |
| 2007/0138131 A1 | 6/2007 | Burdinski | |
| 2007/0161237 A1 | 7/2007 | Lieber et al. | |
| 2007/0175859 A1 | 8/2007 | Black et al. | |
| 2007/0181870 A1 | 8/2007 | Libertino et al. | |
| 2007/0183035 A1 | 8/2007 | Asakawa et al. | |
| 2007/0194403 A1 | 8/2007 | Cannon et al. | |
| 2007/0200477 A1 | 8/2007 | Tuominen et al. | |
| 2007/0208159 A1 | 9/2007 | McCloskey et al. | |
| 2007/0218202 A1 | 9/2007 | Ajayan et al. | |
| 2007/0222995 A1 | 9/2007 | Lu | |
| 2007/0224819 A1 | 9/2007 | Sandhu | |
| 2007/0224823 A1 | 9/2007 | Sandhu | |
| 2007/0227383 A1 | 10/2007 | Decre et al. | |
| 2007/0249117 A1 | 10/2007 | Kang et al. | |
| 2007/0272951 A1 | 11/2007 | Lieber et al. | |
| 2007/0281220 A1 | 12/2007 | Sandhu et al. | |
| 2007/0289943 A1 | 12/2007 | Lu et al. | |
| 2007/0293041 A1 | 12/2007 | Yang et al. | |
| 2008/0032238 A1 | 2/2008 | Lu et al. | |
| 2008/0038467 A1 | 2/2008 | Jagannathan et al. | |
| 2008/0038923 A1 | 2/2008 | Edelstein et al. | |
| 2008/0041818 A1 | 2/2008 | Kihara et al. | |
| 2008/0047930 A1 | 2/2008 | Blanchet et al. | |
| 2008/0064217 A1 | 3/2008 | Horii | |
| 2008/0073743 A1 | 3/2008 | Alizadeh et al. | |
| 2008/0083991 A1 | 4/2008 | Yang et al. | |
| 2008/0085601 A1 | 4/2008 | Park et al. | |
| 2008/0093743 A1 | 4/2008 | Yang et al. | |
| 2008/0102252 A1 | 5/2008 | Black et al. | |
| 2008/0103256 A1 | 5/2008 | Kim et al. | |
| 2008/0113169 A1 | 5/2008 | Cha et al. | |
| 2008/0164558 A1 | 7/2008 | Yang et al. | |
| 2008/0174726 A1 | 7/2008 | Kim | |
| 2008/0176767 A1* | 7/2008 | Millward | 506/20 |
| 2008/0193658 A1 | 8/2008 | Millward | |
| 2008/0217292 A1* | 9/2008 | Millward et al. | 216/46 |
| 2008/0233297 A1* | 9/2008 | De Jong et al. | 427/385.5 |
| 2008/0233323 A1 | 9/2008 | Cheng et al. | |
| 2008/0257187 A1 | 10/2008 | Millward | |
| 2008/0260941 A1 | 10/2008 | Jin | |
| 2008/0274413 A1 | 11/2008 | Millward | |
| 2008/0286659 A1 | 11/2008 | Millward | |
| 2008/0311347 A1 | 12/2008 | Millward et al. | |
| 2008/0315270 A1 | 12/2008 | Marsh et al. | |

(56) References Cited

U.S. PATENT DOCUMENTS

| | | |
|---|---|---|
| 2008/0318005 A1 | 12/2008 | Millward |
| 2009/0062470 A1 | 3/2009 | Millward et al. |
| 2009/0155579 A1 | 6/2009 | Greco et al. |
| 2009/0200646 A1 | 8/2009 | Millward et al. |
| 2009/0206489 A1 | 8/2009 | Li et al. |
| 2009/0212016 A1 | 8/2009 | Cheng et al. |
| 2009/0218567 A1 | 9/2009 | Mathew et al. |
| 2009/0236309 A1 | 9/2009 | Millward et al. |
| 2009/0240001 A1 | 9/2009 | Regner |
| 2009/0263628 A1 | 10/2009 | Millward |
| 2009/0267058 A1 | 10/2009 | Namdas et al. |
| 2009/0274887 A1 | 11/2009 | Millward et al. |
| 2009/0317540 A1 | 12/2009 | Sandhu et al. |
| 2010/0092873 A1 | 4/2010 | Sills et al. |
| 2010/0102415 A1 | 4/2010 | Millward et al. |
| 2010/0124826 A1 | 5/2010 | Millward et al. |
| 2010/0137496 A1 | 6/2010 | Millward et al. |
| 2010/0163180 A1 | 7/2010 | Millward |
| 2010/0204402 A1 | 8/2010 | Millward et al. |
| 2010/0279062 A1 | 11/2010 | Millward |
| 2010/0316849 A1 | 12/2010 | Millward et al. |
| 2010/0323096 A1 | 12/2010 | Sills et al. |
| 2011/0232515 A1 | 9/2011 | Millward |
| 2012/0122292 A1 | 5/2012 | Sandhu et al. |
| 2012/0133017 A1 | 5/2012 | Millward et al. |
| 2012/0135159 A1 | 5/2012 | Xiao et al. |
| 2012/0164389 A1 | 6/2012 | Yang et al. |
| 2012/0211871 A1 | 8/2012 | Russell et al. |
| 2012/0223053 A1* | 9/2012 | Millward et al. ............ 216/55 |
| 2013/0330668 A1 | 12/2013 | Wu et al. |

FOREIGN PATENT DOCUMENTS

| | | |
|---|---|---|
| CN | 101013662 A | 8/2007 |
| EP | 0784543 B1 | 4/2000 |
| EP | 1416303 A2 | 5/2004 |
| EP | 1906237 A2 | 4/2008 |
| EP | 1593164 B1 | 6/2010 |
| JP | 11080414 | 3/1999 |
| JP | 2003155365 | 5/2003 |
| JP | 2004335962 | 11/2004 |
| JP | 2005008882 | 1/2005 |
| JP | 2005029779 A | 2/2005 |
| JP | 2006036923 | 2/2006 |
| JP | 2006055982 | 3/2006 |
| JP | 2006110434 A | 4/2006 |
| JP | 2007194175 A | 8/2007 |
| JP | 2008036491 | 2/2008 |
| KR | 20060128378 | 12/2006 |
| KR | 20070029762 A | 3/2007 |
| KR | 100771886 B1 | 11/2007 |
| TW | 200633925 | 10/1994 |
| TW | 200740602 | 1/1996 |
| TW | 200802421 | 2/1996 |
| TW | 200400990 A | 1/2004 |
| TW | 584670 | 4/2004 |
| TW | 200419017 | 10/2004 |
| TW | 200511364 | 3/2005 |
| TW | I253456 | 4/2006 |
| TW | 256110 | 6/2006 |
| WO | 9007575 | 7/1990 |
| WO | 9706013 | 2/1997 |
| WO | 98/39645 | 9/1998 |
| WO | 9947570 | 9/1999 |
| WO | 0031183 A1 | 6/2000 |
| WO | 0218080 A1 | 6/2002 |
| WO | 0281372 A2 | 10/2002 |
| WO | 03045840 A2 | 6/2003 |
| WO | 2005122285 A2 | 12/2005 |
| WO | 2006003592 | 1/2006 |
| WO | 2006003594 | 1/2006 |
| WO | 2006076016 | 7/2006 |
| WO | 2006078952 | 7/2006 |
| WO | 2006112887 | 10/2006 |
| WO | 2007001294 | 1/2007 |
| WO | 2007013889 | 2/2007 |
| WO | 2007019439 A3 | 2/2007 |
| WO | 2007024241 | 3/2007 |
| WO | 2007024323 A2 | 3/2007 |
| WO | 2007055041 | 5/2007 |
| WO | 2008055137 | 5/2008 |
| WO | 2008091741 A2 | 7/2008 |
| WO | 2008096335 A2 | 8/2008 |
| WO | 2008097736 A2 | 8/2008 |
| WO | 2008118635 A2 | 10/2008 |
| WO | 2008124219 A2 | 10/2008 |
| WO | 2008130847 A1 | 10/2008 |
| WO | 2008145268 A2 | 12/2008 |
| WO | 2008156977 A2 | 12/2008 |
| WO | 2009099924 A2 | 8/2009 |
| WO | 2009102551 A2 | 8/2009 |
| WO | 2009117238 A2 | 9/2009 |
| WO | 2009117243 A1 | 9/2009 |
| WO | 2009134635 A2 | 11/2009 |

OTHER PUBLICATIONS

R. Ruiz, R. Sadnstrom, C. Black, "Induced Orientational Order in Symmetric Diblock Copolymer Thin Films". Advanced Materials, vol. 19, No. 4, pp. 587-591, (2007).*

Electronegativity—<http://www.princeton.edu/~achaney/tmve/wiki100k/docs/Electronegativity.html>.*

[NPL #1] J. Cheng, C. Ross, H. Smith, E. Thomas; "Templated Self-Assembly of Block Copolymers: Top-Down Helps Bottom-Up". Adv. Mater. (2006), 18, p. 2505-2521.*

[NPL #2] H. Li, W. Huck; "Ordered Block-Copolymer Assembly Using Nanoimprint Lithography". Nano. Lett. (2004), vol. 4, No. 9, p. 1633-1636.*

Search Report of Taiwanese Patent Application No. 097121922, dated Oct. 16, 2011, 1 page.

Search Report of Taiwanese Patent Application No. 098108789, dated Dec. 18, 2012, 1 page.

Search Report of Taiwanese Patent Application No. 098109253, dated Aug. 22, 2012, 1 page.

Search Report of Taiwanese Patent Application No. 097110156, dated Mar. 22, 2012, 1 page.

Ali, H.A., et al., Solid-State Electronics 46 (2002), 1639-1642.

Arshady et al., Makromol. Chem., 1976, vol. 177, p. 2911-2918.

Bae, Joonwon, Surface Modification Using Photo-Crosslinkable Random Copolymers, Abstract submitted for the Mar. 2006 meeting of The American Physical Society, submitted Nov. 30, 2005.

Balsara et al, CPIMA, IRG Technical Programs, Synthesis and application of Nanostructured Materials, Leland Stanford Junior Univ., 2006, http://www.stanford.edu/group/cpima/irg/irg_1.htm, printed Jul. 1, 2009.

Bang, J., Abstract submitted for the Mar. 6 meeting of the American Physical Society, submitted Nov. 2005 (online), accessed via the Internet (retrieved on Apr. 5, 2010), URL: <http://absimage.aps.org/image/MWS_MAR06-2005-003641.pdf>.

Bang, Joona, The Effect of Humidity on the Ordering of Tri-block Copolymer Thin Films, Abstract submitted for the Mar. 2007 meeting of The American Physical Society, submitted Nov. 20, 2006.

Bass, Robert B., et al., Microcontact Printing with Octadecanethiol, Applied Surface Science, 226(4), pp. 335-340, Apr. 2004, http://www.ece.virginia.edu/UVML/sis/Papers/rbbpapers/assoct.pdf.

Bearinger, J.P., et al., Nature Materials 2, 259-264, 2003.

Berry, B.C., et al., Effects of Zone Annealing on Thin Films of Block Copolymers, National Institute of Standard and Technology, Polymers Division, Gaithersburg, MD., 2007.

Black, C.T., IEEE 2005 Custom Integrated Circuits Conference, pp. 87-91.

Black, C.T., et al., IBM J. Res. & Dev., vol. 51, No. 5, Sep. 2007, pp. 605-633.

Black, C.T., Proc. of SPIE, vol. 6153, 615302 (2006).

Black, Charles T., ACSNano, vol. 1, No. 3, 2007, American Chemical Society, pp. 147-150.

Black, Charles T., et al., IEEE Electronon Device Letters, vol. 25, No. 9, Sep. 2004, pp. 622-624.

(56) References Cited

OTHER PUBLICATIONS

Botelho do Rego, A.M., et al., Surface Science, 482-485 (2001), pp. 1228-1234.
Brydson, Rik M., et al. (chapter authors), Generic Methodologies for Nanotechnology: Classification and Fabrication, Nanoscale Science and Technology, edited by R.W. Kelsall, et al., 2005 John Wiley & Sons, Ltd., (published online: Dec. 20, 2005) (http://www3.interscience.wiley.com/cgi-bin/summary/112217550/SUMMARY).
Bulpitt, Paul et al, Journal of Biomedical Materials Research, vol. 47, Issue 2, pp. 152-169, Abstract only.
Canaria, Christi A., et al., Formation and Removal of Alkylthiolate Self-Assembled Monolayers on Gold in Aqueous Solutions, Lab Chip 6, 289-295 (2006), http://www.rsc.org/publishing/journals/LC/article.asp?doi=b51066c] (Abstract).
Candau et al., Polymer, 1977, vol. 18, p. 1253-1257.
Cavicchi, Kevin A., et al., Macromolecules 2007, vol. 40, 2007, pp. 1181-1186.
Chandekar, Amol, et al., Template-Directed Adsorption of block Copolymers on Alkanethiol-Patterned Gold Surfaces, (circa 2006), http://www.nano.neu.edu/industry/industry_showcase/industry_day/documents/Chandekar.pdf) (Powerpoint template for scientific posters (Swarthmore College)).
Cheng, Joy T., et al., Nano Letters, vol. 0, No. 0, A-E, published on Web Aug. 16, 2006.
Cheng, Joy Y., et al., Nano Letters, vol. 6, No. 9, 2006, pp. 2009-2103.
Cheng, Joy Y., et al., Adv. Mater. 2003, vol. 15, No. 19, pp. 1599-1602.
Cheng, Joy Y., et al., Applied Physics Letters, 91, 143106-143106-3 (2007).
Daoulas Kostas Ch., et al., Physical Review Letters 96, week ending Jan. 27, 2006, pp. 036104-1-036104-3.
Darling, S.B., Progress in Polymer Science, vol. 32, No. 10, Sep. 28, 2007, pp. 1152-1204.
Desai, Dr. Trejal A., et al., Business Briefing: Medical Device Manufacturing & Technology, 2002.
Edwards, Erik W., et al., Journal of Polymer Science: Part B Polymer Physics, vol. 43, 3444-3459, 2005.
Edwards, Erik W., et al., Advanced Mater, 16, No. 15, Aug. 4, 2004, pp. 1315-1319.
Elisseeff J., et al., Journal of Biomedical Materials Research, 51(2): 164-171, Aug. 2000, Abstract only.
Fasolka, Michael J. et al., Macromolecules 2000, vol. 33, No. 15, pp. 5702-5712.
Gates, Byron D., et al., Annu. Rev. Mater. Res. 2004, 34:339-72.
Ge, Zhenbin, et al., PRL 96, 186101-1 186101-4, The American Physical Society, week ending May 12, 2006.
Gelest Inc., Silane Coupling Agents: Connecting Across Boundaries, pp. 1-56, 2006.
Genua, A., et al., Nanotechnology, 18 (2007), pp. 1-7.
Gillmor, S.D., et al., Langmuir 2000, vol. 16, No. 18, 2000, pp. 7223-7228.
Gudipati, Chakravarthy S., et al., Journal of Polymer Science Part A: Polymer Chemistry, vol. 42, pp. 6193-6208.
Guo, Kai, et al., Abstract of Synthesis and Characterization of Novel Biodegradable Unsaturated Poly(ester amide)/ Poly(ethylene glycol) Diacrylate Hydrogels, Journal of Polymer Science Part A: Polymer Chemistry, vol. 43, Issue 17, pp. 3932-3944, 2005 Wiley Periodicals, Inc.
Hamley, I. W., Introduction to Block Copolymers, Developments in Block Copolymers Science and Technology, 2004, John Wiley & Sons, Ltd., pp. 1-29.
Harrison, Christopher et al., Polymer, vol. 39, No. 13, pp. 2733-2744, 1998.
Hawker, et al., Facile Synthesis of Block Copolymers for Nanolithographic Applications; Polymer Reprints, 2005.
He, Yiyong et al., J. Am. Chem. Soc. 2006, 128, 2745-2750.
Hermans, Thomas M., et al., Application of Solvent-Directed Assembly of Block Copolymers to the Synthesis of Nanostructured Materials with Low Dielectric Constants, Angewandte Chem. Int. Ed. 2006, 45, pp. 6648-6652.
Hutchison, J. Brian, et al., Chem. Mater., vol. 17, No. 19, 2005, pp. 4789-4797.
In, Insik, et al., Langmuir, vol. 22, No. 18, 2006, pp. 7855-7860.
Ji, Shengxiang, et al., Preparation of Neutral Wetting Brushes for Block Copolymer Films from Homopolymer Blends, submitted to Advanced Materials, 20[16]: 3054-3060; published online Jul. 7, 2008.
Ji, Shengxiang, et al., Macromolecules, 2008, 41(23): 9098-9103.
Jun, et al., Langmuir, 2002, 18(9), pp. 3415-3417, Abstract only.
Karim, Alamgir et al., Control of Ordering Kinetics and Morphology Using Zone Annealing of Thin Block Copolymer Filmes, Abstract submitted for the Mar. 2007 Meeting of The American Physical Society, Nov. 20, 2006.
Kim, IS, et al., Int J Pharm., Sep. 15, 2000; 205(1-2): 109-16, Abstract only.
Kim, Sang Ouk, et al., Nature, vol. 424, Jul. 24, 2003, pp. 411-414.
Kim, Sang Ouk, et al., Adv. Mater., 2007, 19, pp. 3271-3275.
Kim, Seung Hyun, et al., Adv. Mater. 2004, 16, No. 3, Feb. 3, pp. 226-231.
Kim, Seung Hyun, et al., Macromolecules 2006, vol. 39, No. 24, 2006, pp. 8473-8479.
Kim, Seung Hyun, et al., Advanced Mater., vol. 16, No. 23-24, pp. 2119-2123, Dec. 17, 2004.
Kim, SH, J Biomater Appl., Jul. 2000; 15(1): 23-46 Abstract only.
Kim, SH, J Biomater Res., Mar. 15, 2000; 49(4): 517-27 Abstract only.
Kim, Su-Jin, et al., J. Vac. Sci. Technol. B26(1), Jan./Feb. 2008, 189-194.
Krishnamoorthy, Sivashankar, et al., MaterialsToday, vol. 9, No. 9, Sep. 2006, pp. 40-47.
La, Young-Hye, et al., Chem. Mater, 2007, vol. 19, No. 18, pp. 4538-4544.
La, Young-Hye, et al., J. Vac. Sci. Technol. B 25[6], Nov./Dec. 2007, pp. 2508-2513.
Laracuente, A.R., et al., Surface Science 545, 2003, pp. 70-84.
Lentz, David, et al., Whole Wafer Imprint Patterning Using Step and Flash Imprint Lithography: A Manufacturing Solution for Sub 100 nm Patterning, SPIE Advanced Lithography Paper, http://molecularimprints.com/ NewsEvents/tech_articles/new_articles/SPIE_07_MII_WW_Paper.pdf], Feb. 2007, pp. 1-10.
Li, Mingqi, et al., MaterialsToday, vol. 9, No. 9, Sep. 2006, pp. 30-39.
Li, Wai-kin, et al, J. Vac. Sci. Technol. B 25[6], Nov./Dec. 2007, pp. 1982-1984.
Li, Xue, et al., ScienceDirect, Polymer 48 [2007], pp. 2434-2443.
Lin, Zhiqun, et al., Adv. Mater. 2002, 14 No. 19, Oct. 2, pp. 1373-1376.
Lin-Gibson, Sheng, et al., Macromolecules 2005, 38, pp. 2897-2902.
Lutolf, M.P., et al, Nature Biotechnology, 23, 47-55 (2005), Abstract only.
Malkoch, Michael, et al., Chem. Commun., 2006, pp. 2774-2776.
Mansky, P., et al., Science, vol. 275, Mar. 7, 1997, pp. 1458-1460.
Martens, P., et al., Polymer, vol. 41, Issue 21, Oct. 2000, pp. 7715-7722, Abstract only.
Matsuda, T., et al., ASAIO J, Jul.-Sep. 1992; 38(3): M154-7, Abstract only.
Maye, Mathew A., et al., Journal of Chemical Education, vol. 79, No. 2, Feb. 2002, pp. 207-210.
Metters, Andrew, et al., Biomacromolecules 2005, 6, pp. 290-301, 2005.
Meyer, Evelyn, et al., Macromollecular Mater. Eng., 276/277, 2000, pp. 44-50.
Mezzenga, Raffaele, et al., Langmuir 2003, vol. 19, No. 20, 2003, pp. 8144-8147.
Mindel, Joseph., et.al., A Study of Bredig Platinum Sols, The Chemical Laboratories of New York University, vol. 65 pp. 2112.
Nealey, Paul F., et al., Self-Assembling Resists for Nanolithography, IEEE 2005.
Naito, et al., IEEE Transactions on Magnetics, vol. 38, No. 5, Sep. 2002, pp. 1949-1951.
Nishikubo, T., American Chemical Society Symposium Series, 1997, p. 214-230.

(56) References Cited

OTHER PUBLICATIONS

Niu, Sanjun, et al., Macromolecules, 36(7), 2428-2440, 2003 (web release date: Mar. 13, 2003) http://digitalcommons.uni.edu/cgi/viewcontent.cgi?article+1005&contect=chemeng_nanotechnology).
Olayo-Valles, Roberto et al., J. Mater. Chem, 2004, 14, 2729-2731.
Parejo, Pilar Garcia, et al., J. Mater. Chem., 2006, 16, pp. 2165-2169.
Park, Cheolmin, et al., Polymer 44, 2003, 6725-6760.
Park, Dae-Ho, Nanotechnology 18, 2007, 355304, pp. 1-7.
Park, Miri, et al., Science, v. 276, No. 5317, p. 1401-1404, May 30, 1997.
Park, Sang-Min, et al., Adv. Mater., 2007, 19, pp. 607-611.
Park, Sung Chan, et al., Macromolecules 2007, vol. 40, No. 22, pp. 8119-8124.
Peng, Juan et al., Macromol. Rapid Commun. 2007, 28, 1422-1428.
Peters, Richard D., et al., J. Vac. Sci. Technol. B, vol. 18, No. 6, Nov./Dec. 2000, pp. 3530-3532.
Peters, Richard D., et al., Macromolecules, vol. 35, No. 5, 2002, pp. 1822-1834.
Potemkin, Igor I., et al., Macromol. Rapid Commun., 2007, 28, pp. 579-584.
Resnick, Douglas, J., et al., J. Microlith., Microfab., Microsyst., vol. 3, No. 2, Apr. 2004, pp. 316-321.
Rogers, John A., ACS Nano, vol. 1, No. 3, pp. 151-153, 2007.
Rozkiewicz, Dorota I., et al., Angew. Chem. Int. Ed., 2006, 45, pp. 5292-5296.
Cha, Jennifer N., et al., Chem. Mater. 2007, 19, 839-843.
Chang, Li-Wen, Proc. of SPIE, vol. 6156, 2006, 615611-1 to 615611-6.
Chang, Li-Wen, IEEE International Electron Devices Meeting (IEDM), paper 33.2, Dec. 6-8, San Francisco, 2010, pp. 33.2.1-33.2.4.
Ikeda, Susumu et al., NanotechJapan Bulletin—vol. 3, No. 3, Dec. 17, 2010/Focus Jun. 26.
Ji, Shengxiang et al., ACS Nano, vol. 4, No. 2, 2010, pp. 599-609.
Park, Seung Hak, et al., Soft Matter, 2010, 6, 2010, 120-125.
Yamaguchi, Toru, et al., Microprocesses and Nanotechnology, 2007, Conference date Nov. 5-8, 2007, pp. 434-435.
Zhang, Yuan et al., Applied Physics Letter, 91, 013104, 2007, pp. 013104 to 013104-3.
Black, C.T., Applied Physics Letters 87, 163116-1 to 1163116-3, 2005.
Black, Charles T., IEEE Transactions on Nanotechnology, vol. 3, No. 3, Sep. 2004, pp. 412-415.
Choi et al., IEEE Transactions on Magnetics 41(10):3448-3450 (2005).
Hawker et al.,. "Improving the manufacturability and structural control of block copolymer lithography," Abstracts of Papers, 232nd ACS National Meeting, San Francisco, CA, Sep. 10 14, 2006.
A. Helmbold, D. Meissner, Thin Solid Films, 1996, 283:196-203.
Lutolf et al., Adv. Mater., 2003, 15(11), 888-892.
Nguyen, Kytai, et al., Biomaterials 23, 2002, pp. 4307-4314.
Ruiz, Ricardo et al., Science, vol. 321, Aug. 15, 2008, pp. 936-939.
Truskett, Van N., et al., Trends in Biotechnology, vol. 24, No. 7, Jul. 2006, pp. 312-315.
Zhu et al., Langmuir, 2000, 16, 6766-6772.
Asakawa et al., Fabrication of Subwavelength Structure for Improvement in Light-Extraction Efficiency of Light-Emitting Devices Using a Self-Assembled Pattern of Block Copolymer, Applied Optics, vol. 44, No. 34, Dec. 1, 2005, pp. 7475-7482.
Berry, B. C., et al., Orientational Order in Block Copolymer Films Zone Annealed Below the Order—Disorder Transition Temperature, Nano Letters vol. 7, No. 9 Aug. 2007, Polymers Division, Nat'l. Inst. of Standards and Technology, Maryland, USA, pp. 2789-2794, (published on Web Aug. 11, 2007).
Black et al., Integration of Self-Assembled Diblock Copolymers for Semiconductor Capacitor Fabrication, Applied Physics Letters, vol. 79, No. 3 (2001), pp. 409-411.
Black, C. T., et al., Polymer Self Assembly in Semiconductor Microelectronics, IBM J. Res. & Dev. vol. 51, No. 5, Sep. 2007, pp. 605-633.
Chai et al., Assembly of Aligned Linear Metallic Patterns on Silicon, Nature Nanotechnology, vol. 2, Aug. 2007, pp. 500-506.
Chai et al., Using Cylindrical Domains of Block Copolymers to Self-Assemble and Align Metallic Nanowires, American Chemical Society, www.acsnano.org (2008), pp. A-M.
Chen et al., Highly Ordered Arrays of Mesoporous Silica Nanorods with Tunable Aspect Ratios from Block Copolymer Thin Films, Advanced Materials, vol. 20 (2008), pp. 763-767.
Cho et al., Nanoporous Block Copolymer Micelle/Micelle Multilayer Films with Dual Optical Properties, J. Am. Chem. Soc., vol. 128, No. 30 (2006), pp. 9935-9942.
Clark et al., Selective Deposition in Multilayer Assembly: SAMs as Molecular Templates, Supramolecular Science, vol. 4 (1997), pp. 141-146.
Erlandsson et al., Metallic Zinc Reduction of Disulfide Bonds Between Cysteine Residues in Peptides and Proteins, Int'l J. Peptide Res. & Therapeutics, vol. 11, No. 4, Dec. 2005, pp. 261-265.
Fasolka et al., Block Copolymer Thin Films: Physics and Applications, Annual Reviews Materials Res., vol. 31, Aug. 2001, pp. 323-355.
Fukunaga, K., et al., Self-Assembly of Block Copolymer Thin Films Having a Half-Domain-Spacing Thickness: Nonequilibrium Pathways to Achieve Equilibrium Brush Layers Parallel to Substrate, Macromolecules vol. 39, Aug. 2006, pp. 6171-6179.
Gates, Nanofabrication with Molds and Stamps, Materials Today, Feb. 2005, pp. 44-49.
Grubbs, Hybrid Metal-Polymer Composites from Functional Block Copolymers, Journal of Polymer Science: Part A: Polymer Chemistry, vol. 43 (2005), pp. 4323-4336.
Guarini et al., Nanoscale Patterning Using Self-Assembled Polymers for Semiconductor Applications, J. Vac. Sci. Technol. B 19(6), Nov./Dec. 2001, pp. 2784-2788.
Hadziioannou, Semiconducting Block Copolymers for Self-Assembled Photovoltaic Devices, MRS Bulletin (2002), pp. 456-460.
Hamers, Passivation and activation: How do monovalent atoms modify the reactivity of silicon surfaces? A perspective on the article, The mechanism of amine formation on Si(100) activated with chlorine atoms, Surface Science, vol. 600 (2006), pp. 3361-3362.
Hammond, M. R., et al., Temperature Dependence of Order, Disorder, and Defects in Laterally Confined Diblock Copolymer Cylinder Monolayers, Macromolecules, vol. 38, Jul. 2005; American Chemical Society, p 6575-6585.
Hayward et al., Crosslinked Poly(styrene)-block-Poly(2-vinylpyridine) Thin Films as Swellable Templates for Mesostructured Silica and Titania, Advanced Materials, vol. 17 (2005), pp. 2591-2595.
Helmuth et al., High-Speed Microcontact Printing, J. Am. Chem. Soc., vol. 128, No. 29 (2006), pp. 9296-9297.
Horiuchi et al., Three-Dimensional Nanoscale Alignment of Metal Nanoparticles Using Block Copolymer Films as Nanoreactors, Langmuir, vol. 19 (2003), pp. 2963-2973.
Huang et al., Stretchable gold conductors on elastomeric substrates, Applied Physics Letters, vol. 82, No. 15, Apr. 14, 2003, pp. 2404-2406.
Huang et al., Using Surface Active Random Copolymers to Control the Domain Orientation in Diblock Copolymer Thin Films, Macromolecules, vol. 31 (1998), pp. 7641-7650.
Hur et al., Nanotransfer printing by use of noncovalent surface forces: Applications to thin-film transistors that use single-walled carbon nanotube networks and semiconducting polymers, Applied Physics Letters, vol. 85, No. 23, Dec. 6, 2004, pp. 5730-5732.
Jiang et al., Electrochemical Desorption of Self-Assembled Monolayers Noninvasively Releases Patterned Cells from Geometrical Confinements, J. Am. Chem. Soc., vol. 125, No. 9, 2003, pp. 2366-2367.
Johnson et al., Probing the stability of the disulfide radical intermediate of thioredoxin using direct electrochemistry, Letters in Peptide Science, vol. 10, 2003, pp. 495-500.
Jun et al., Patterning protein molecules on poly(ethylene glycol) coated Si(111), Biomaterials, vol. 25, 2004, pp. 3503-3509.

(56) References Cited

OTHER PUBLICATIONS

Kavakli et al., Single and Double-Layer Antireflection Coatings on Silicon, Turk J Phys, vol. 26, 2002, pp. 349-354.

Kim et al., Hybrid Nanofabrication Processes Utilizing Diblock Copolymer Nanotemplate Prepared by Self-assembled Monolayer Based Surface Neutralization, J. Vac. Sci. Technol. B26(1), Jan./Feb. 2008, © 2008 American Vacuum Society, pp. 189-194.

Knoll et al., Phase Behavior in Thin Films of Cylinder-Forming Block Copolymers, Physical Review Letters vol. 89, No. 3 Jul. 2002, The American Physical Society, pp. 035501-1 to 035501-4.

Krishnamoorthy et al., Block Copolymer Micelles as Switchable Templates for Nanofabrication, Languir, vol. 22, No. 8, Mar. 17, 2006, pp. 3450-3452.

Krishnamoorthy et al., Nanopatterned Self-Assembled Monolayers by Using Diblock Copolymer Micelles as Nanometer-Scale Adsorption and Etch Masks, Advanced Materials (2008), pp. 1-4.

Kuhnline et al., "Detecting thiols in a microchip device using micromolded carbon ink electrodes modified with cobalt phthalocyanine", Analyst, vol. 131 (2006), pp. 202-207.

Li et al., A Method for Patterning Multiple Types of Cells by Using Electrochemical Desorption of Self-Assembled Monolayers within Microfluidic Channels, Angew. Chem. Int. Ed., vol. 46, pp. 1094-1096, 2007.

Liu et al., Pattern Transfer Using Poly(styrene-block-methyl methacrylate) Copolymer Films and Reactive Ion Etching, J. Vac. Sci. Technol. B vol. 25, No. 6, Nov./Dec. 2007, pp. 1963-1968.

Loo et al., Additive, nanoscale patterning of metal films with a stamp and a surface chemistry mediated transfer process: Applications in plastic electronics, Applied Physics Letters, vol. 81, No. 3, Jul. 15, 2002, pp. 562-564.

Lopes et al., Hierarchical Self-Assembly of Metal Nanostructures on Diblock Copolymer Scaffolds, Nature, vol. 414, Dec. 13, 2001, pp. 735-738.

Lutz, 1,3-Dipolar Cycloadditions of Azides and Alkynes: A Universal Ligation Tool in Polymer and Materials Science, Angew. Chem. Int. Ed., vol. 46 (2007), pp. 1018-1025.

Malenfant et al., Self-Assembly of an Organic-Inorganic Block Copolymer for Nano-Ordered Ceramics, Nature Nanotechnology, vol. 2 (2007) pp. 43-46.

Niu et al., Selective assembly of nanoparticles on block copolymer by surface modification, Nanotechnology, vol. 18 (2007), pp. 1-4.

Park et al., Fabrication of Highly Ordered Silicon Oxide Dots and Stripes from Block Copolymer Thin Films, Advanced Materials, vol. 20 (2008), pp. 681-685.

Park et al., High-Aspect-Ratio Cylindrical Nanopore Arrays and Their Use for Templating Titania Nanoposts, Advanced Materials, vol. 20, 2008, pp. 738-742.

Reed et al., Molecular random access memory cell, Appl. Phys. Lett., vol. 78, No. 23, Jun. 2001, pp. 3735-3737.

Ruiz et al., Induced Orientational Order in Symmetric Diblock Copolymer Thin-Films, Advanced Materials, vol. 19, No. 4, pp. 587-591, (2007).

Ryu et a., Surface Modification with Cross-Linked Random Copolymers: Minimum Effective Thickness, Macromolecules, vol. 40, No. 12, 2007, American Chemical Society, pp. 4296-4300.

Saraf et al., Spontaneous Planarization of Nanoscale Phase Separated Thin Film, Applied Physics Letters, vol. 80, No. 23, Jun. 10, 2002, American Institute of Physics, pp. 4425-4427.

Sato et al., Novel Antireflective Layer Using Polysilane for Deep Ultraviolet Lithography, J. Vac. Sci. Technol. B, vol. 17, No. 6 (1999), pp. 3398-3401.

Sawhney et al., Bioerodible Hydrogels Based on Photopolymerized Poly(ethylene glycol)-co-poly(a-hydroxy acid) Diacrylate Macromers, Macromolecules 1993, 26, American Chemical Society, pp. 581-587, Abstract only.

Segalman, R. A., Patterning with Block Copolymer Thin Films, Materials Science and Engineering R 48 (2005), Elsevier B. V., pp. 191-226.

Shahrjerdi et al., Fabrication of Ni Nanocrystal Flash Memories Using a Polymeric Self-Assembly Approach, IEEE Electron Device Letters, vol. 28, No. 9, Sep. 2007, pp. 793-796.

Sharma et al., Ultrathin Poly(ethylene glycol) Films for Silicon-based Microdevices, Applied Surface Science, 206 (2003), Elsevier Science B.V., pp. 218-229.

Sigma-Aldrich, 312-315Tutorial regarding Materials for Lithography/Nanopatterning, http://www.signiaaldrich.com/Area_of_Interest/Chemistry/Materials_Science/Micro_and_Nanoelectronic website, retrieved Aug. 27, 2007.

Sivaniah et al., Observation of Perpendicular Orientation in Symmetric Diblock Copolymer Thin Films on Rough Substrates, Macromolecules 2003, 36, American Chemical Society, pp. 5894-5896.

Sivaniah et al., Symmetric Diblock Copolymer Thin Films on Rough Substrates, Kinetics and Structure Formation in Pure Block Copolymer Thin Films, Macromolecules 2005, 38, American Chemical Society, pp. 1837-1849.

Sohn et al., Fabrication of the Multilayered Nanostructure of Alternating Polymers and Gold Nanoparticles with Thin Films of Self-Assembling Diblock Copolymers, Chem, Mater, vol. 13, pp. 1752-1757 (2001).

Solak, H. H., Nanolithography with Coherent Extreme Ultraviolet Light, Journal of Physics D: Applied Physics, 2006, IOP Publishing Ltd., UK, pp. R171-R188.

Srinvivasan et al., Scanning Electron Microscopy of Nanoscale Chemical Patterns, ACS Nano, vol. 1, No. 3, pp. 191-201, 2007.

Stoykovich et al., Directed Assembly of Block Copolymer Blends into Nonregular Device-Oriented Structures, Science, vol. 308, Jun. 3, 2005, pp. 1442-1446.

Stoykovich, M. P., et al., Directed Self-Assembly of Block Copolymers for Nanolithography: Fabrication of Isolated Features and Essential Integrated Circuit Geometries, ACS Nano, vol. 1, No. 3, 2007, pp. 168-175.

Sundrani et al., Guiding Polymers to Perfection: Macroscopic Alignment of Nanoscale Domains, Nano Lett., vol. 4, No. 2, 2004, American Chemical Society, pp. 273-276.

Sundrani et al., Hierarchical Assembly and Compliance of Aligned Nanoscale Polymer Cylinders in Confinement, Langmuir 2004, vol. 20, No. 12, 2004, American Chemical Society, pp. 5091-5099.

Tadd et al, Spatial Distribution of Cobalt Nanoclusters in Block Copolymers, Langmuir, vol. 18 (2002), pp. 2378-2384.

Tang et al., Evolution of Block Copolymer Lithography to Highly Ordered Square Arrays, Science, vol. 322, No. 5900, Sep. 25, 2008, pp. 429-432.

Trimbach et al., Block Copolymer Thermoplastic Elastomers for Microcontact Printing, Langmuir, vol. 19 (2003), pp. 10957-10961.

Tseng et al., Enhanced Block Copolymer Lithography Using Sequential Infiltration Synthesis, J. of Physical Chemistry, Jul. 11, 2011, 16 pages.

Wang et al., One Step Fabrication and characterization of Platinum Nanopore Electrode Ensembles formed via Amphiphilic Block Copolymer Self-assembly, Electrochimica Acta 52 (2006), pp. 704-709.

Winesett et al., Tuning Substrate Surface Energies for Blends of Polystyrene and Poly(methyl methacrylate), Langmuir 2003, 19, American Chemical Society, pp. 8526-8535.

Wu et al., Self-Assembled Two-Dimensional Block Copolymers on Pre-patterned Templates with Laser Interference Lithography, IEEE, 2007, pp. 153-154.

Xia et al., An Approach to Lithographically Defined Self-Assembled Nanoparticle Films, Advanced Materials, vol. 18, (2006), pp. 930-933.

Xia et al., Soft Lithography, Annu. Rev. Mater. Sci., vol. 28 (1998), pp. 153-184.

Xiao, Shuaigang., et al., Graphoepitaxy of Cylinder-forming Block Copolymers for Use as Templates to Pattern Magnetic Metal Dot Arrays, Nanotechnology 16, IPO Publishing Ltd, UK (2005), pp. S324-S329.

Xu et al., Electric Field Alignment of Symmetric Diblock Copolymer Thin Films, Department of Polymer Science and Engineering, University of Massachusetts (2003), 5 pages.

(56) References Cited

OTHER PUBLICATIONS

Xu et al., Interfacial Interaction Dependence of Microdomain Orientation in Diblock Copolymer Thin Films, Macromolecules, vol. 38 (2005), pp. 2802-2805.

Xu et al., Surface-Initiated Atom Transfer Radical Polymerization from Halogen-Terminated Si(111) (Si—X, X = Cl, Br) Surfaces for the Preparation of Well-Defined Polymer—Si Hybrids, Langmuir, vol. 21, No. 8, 2005, pp. 3221-3225.

Xu, Ting, et al., The Influence of Molecular Weight on Nanoporous Polymer Films, Polymer 42, Elsevier Science Ltd., (2001) pp. 9091-9095.

Yamaguchi, T., et al., Resist-Pattern Guided Self-Assembly of Symmetric Diblock Copolymer, Journal of Photopolymer Science and Technology, vol. 19, No. 3, pp. 385-388 (2006).

Yan, Xiaohu, et al., Preparation and Phase Segregation of Block Copolymer Nanotube Multiblocks, J. Am. Chem. Soc., vol. 126, No. 32, 2004, American Chemical Society, pp. 10059-10066.

Yang et al., Covalently Attached Graft Polymer Monolayer on Organic Polymeric Substrate via Confined Surface Inhibition Reaction, Journal of Polymer Science—A—Polymer Chemistry Edition, 2007, pp. 745-755, vol. 45, Issue 5.

Yang, Xiao M., et al., Guided Self-Assembly of Symmetric Diblock Copolymer Films on Chemically Nanopatterned Substrates, Macromolecules 2000, vol. 33, No. 26, 2000, American Chemical Society, pp. 9575-9582.

Yang, Xiaomin, et al., Nanoscopic Templates Using Self-assembled Cylindrical Diblock Copolymers for Patterned Media, J. Vac. Sci. Technol. B 22(6), Nov./Dec. 2004, American Vacuum Society, pp. 3331-3334.

Yu et al., Contact Printing Beyond Surface Roughness: Liquid Supramolecular Nanostamping, Advanced Materials, vol. 19, 2007, pp. 4338-4342.

Yurt, Serkan, et al., Scission of Diblock Copolymers into Their Constituent Blocks, Macromolecules 2006, vol. 39, No. 5, 2006, American Chemical Society, pp. 1670-1672.

Zaumseil et al., Three-Dimensional and Multilayer Nanostructures Formed by Nanotransfer Printing, Nano Letters, 2003, vol. 3, No. 9, pp. 1223-1227.

Zehner, R. W., et al., Selective Decoration of a Phase-Separated Diblock Copolymer with Thiol-Passivated Gold Nanocrystals, Langmuir, vol. 14, No. 2, pp. 241-244, Jan. 20, 1998.

Zhang et al., Self-Assembled Monolayers of Terminal Alkynes on Gold, J. Am. Chem. Soc., vol. 129, No. 16, pp. 4876-4877, 2007.

Zhang, Mingfu, et al., Highly Ordered Nanoporous Thin Films from Cleavable Polystyrene-block-poly(ethylene oxide),Adv. Mater. 2007, 19, pp. 1571-1576.

Zhao et al., Colloidal Subwavelength Nanostructures for Antireflection Optical Coatings, Optics Letters, vol. 30, No. 14, pp. 1885-1887 (2005).

Zhou et al., Nanoscale Metal/Self-Assembled Monolayer/Metal Heterostructures, Appl. Phys. Lett., vol. 71, No. 5, 4 Aug. 1997, pp. 611-613.

Zhu, X.Y., et al., Grafting of High-Density Poly(Ethylene Glycol) Monolayers on Si(111), Langmuir, vol. 17, pp. 7798-7803, 2001.

Fujita et al., Thin Silica Film with a Network Structure as Prepared by Surface Sol-Gel Transcription on the Poly (styrene-b-4-vinylpyridine) Polymer Film, Chemistry Letters, vol. 32, No. 4, Dec. 31, 2003, pp. 352-353.

Melde et al., Silica Nanostructures Templated by Oriented Block Copolymer Thin Films Using Pore-Filling and Selective-Mineralization Routes, Chem. Mater., vol. 17, No. 18, Aug. 13, 2005, pp. 4743-4749.

Alger, Mark S. M., Polymer Science Dictionary, describing the Flory-Huggins interaction parameter (Chi value, • value) and the Flory-Huggins theory (1989), pp. 201-202.

Anonymous, Aluminium oxide, <http://en.wikipedia.org/wiki/Aluminium_oxide>, (visited Feb. 12, 2015), 9 pages.

Anonymous, Polydimethylsiloxane, <http://en.wikipedia.org/wiki/Polydimethylsiloxane>, (visited Feb. 12, 2015), 9 pages.

\* cited by examiner

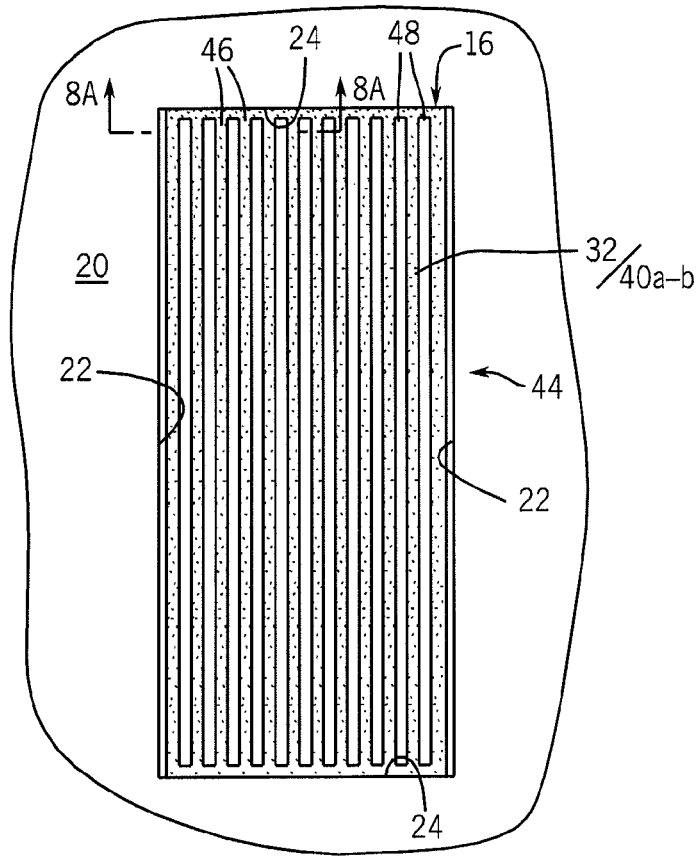
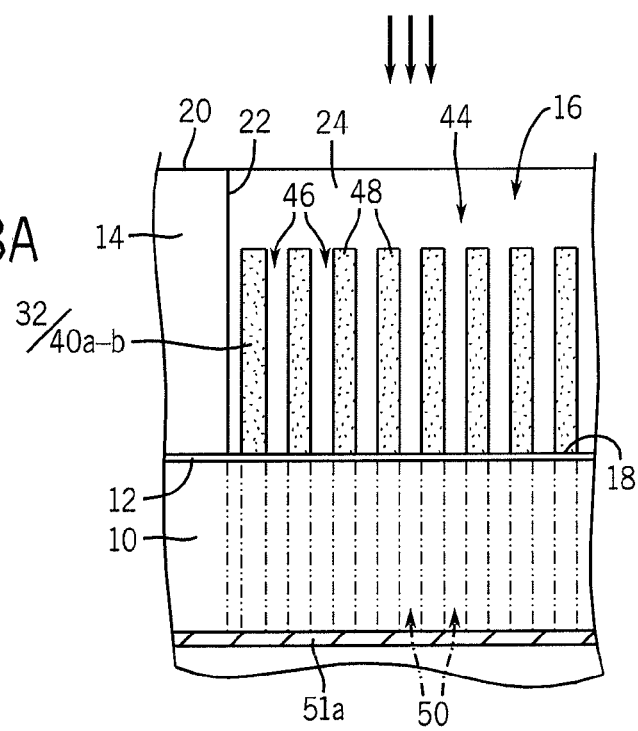

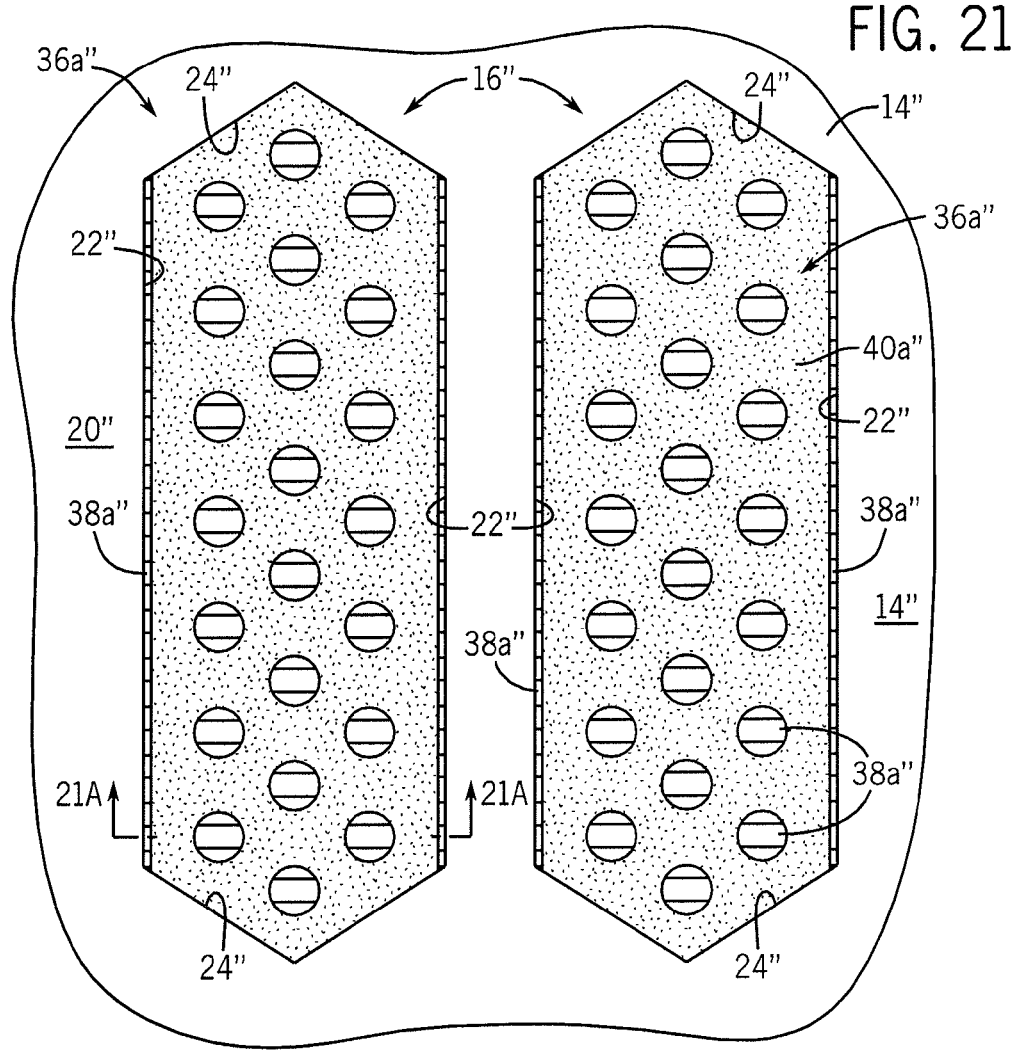
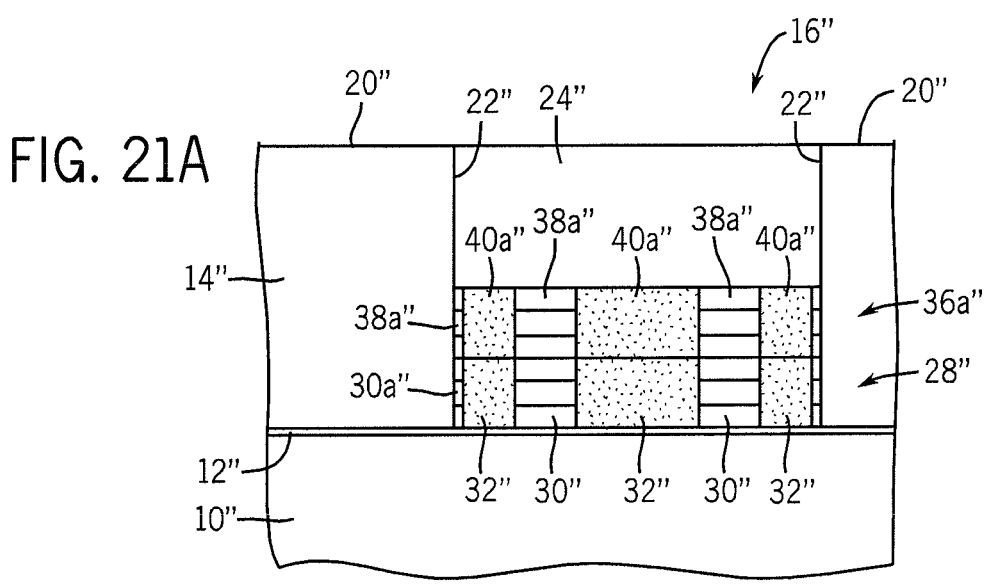

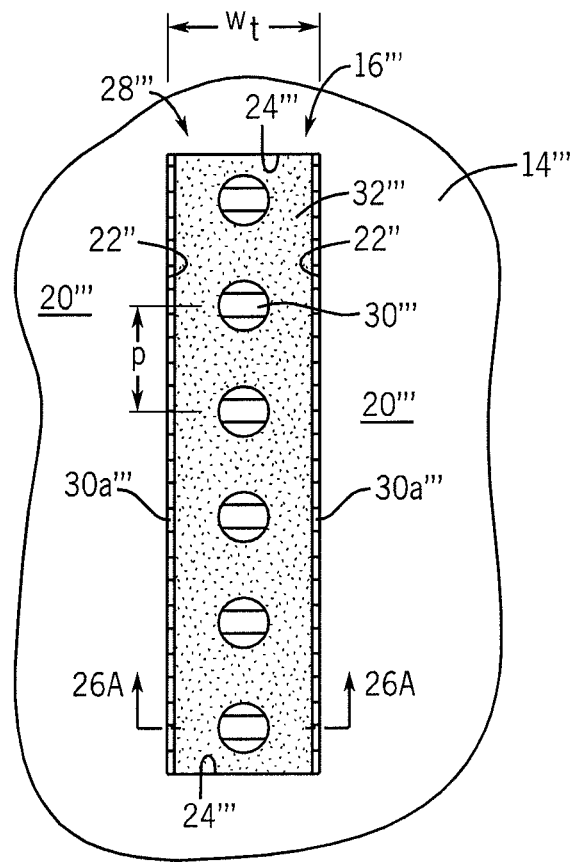
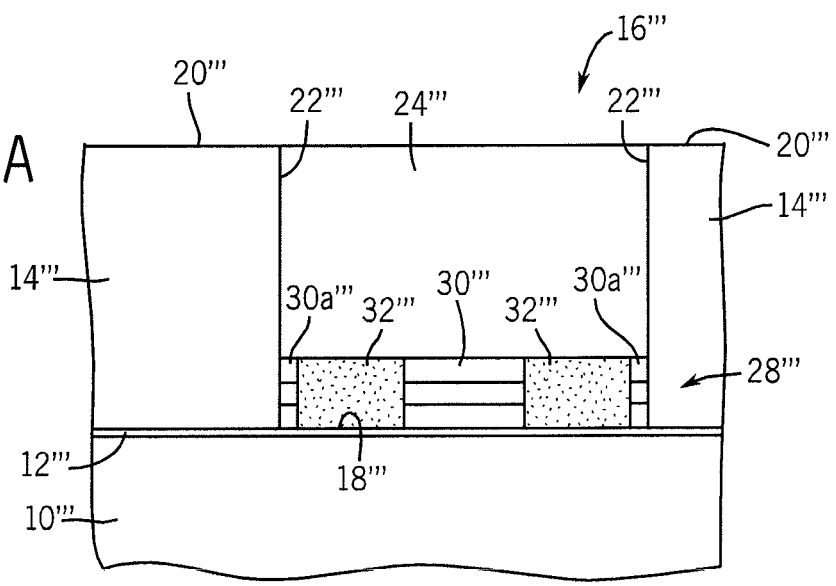

EXTENSIONS OF SELF-ASSEMBLED STRUCTURES TO INCREASED DIMENSIONS VIA A "BOOTSTRAP" SELF-TEMPLATING METHOD

CROSS-REFERENCE TO RELATED APPLICATION

This application is a division of U.S. patent application Ser. No. 11/738,169, filed Apr. 20, 2007, now U.S. Pat. No. 8,372,295, issued Feb. 12, 2013, the disclosure of which is hereby incorporated herein by this reference.

TECHNICAL FIELD

Embodiments of the invention relate to methods of fabricating nanoscale arrays of micro-vias, microchannels and microstructures by use of thin films of self-assembling block copolymers, and devices resulting from those methods.

BACKGROUND OF THE INVENTION

As the development of nanoscale mechanical, electrical, chemical and biological devices and systems increases, new processes and materials are needed to fabricate nanoscale devices and components. Conventional optical lithographic processing methods are not able to accommodate fabrication of structures and features much below the 100 nm level. The use of self-assembling diblock copolymers presents another route to patterning at nanometer dimensions. Diblock copolymer films spontaneously assembly into periodic structures by microphase separation of the constituent polymer blocks after annealing, for example, by thermal annealing above the glass transition temperature of the polymer or by solvent annealing, forming ordered domains at nanometer-scale dimensions. Following self-assembly, one block of the copolymer can be selectively removed and the remaining patterned film used as an etch mask for patterning nanosized features into the underlying substrate. Since the domain sizes and periods ($L_o$) involved in this method are determined by the chain length of a block copolymer (MW), resolution can exceed other techniques such as conventional photolithography, while the cost of the technique is far less than electron beam lithography or EUV photolithography, which have comparable resolution.

The film morphology, including the size and shape of the microphase-separated domains, can be controlled by the molecular weight and volume fraction of the AB blocks of a diblock copolymer to produce lamellar, cylindrical, or spherical morphologies, among others. For example, for volume fractions at ratios greater than about 80:20 of the two blocks (AB) of a diblock polymer, a block copolymer film will microphase separate and self-assemble into a periodic spherical domains with spheres of polymer B surrounded by a matrix of polymer A. For ratios of the two blocks between about 60:40 and 80:20, the diblock copolymer assembles into a periodic hexagonal close-packed or honeycomb array of cylinders of polymer B within a matrix of polymer A. For ratios between about 50:50 and 60:40, lamellar domains or alternating stripes of the blocks are formed. Domain size typically ranges from 5-50 nm.

Diblock copolymer thin films of cylindrical and lamellar phases may both form striped phases relative to an interface. For cylindrical phase films, a striped pattern results from parallel cylinder orientation, while for lamellar phase films, a striped pattern results from perpendicular domain orientation. From a top down view, perpendicular-oriented lamellae and parallel-oriented cylinders appear similar, e.g., as parallel lines.

Graphoepitaxy techniques using defined topography such as trench edges have been used in an attempt to orient and order copolymer domains and control registration and alignment of the self-assembled blocks to form a desired pattern.

While the self-assembly of diblock copolymers of tightly controlled composition and polydispersity has been demonstrated as a method of preparing a variety of nanoscale, sublithographic structures, the necessity of casting only very thin films limits the dimensions of the structures, particularly in the z-axis direction (i.e., perpendicular to the substrate surface). Openings produced by selective etching and removal of polymer domains of the films may not achieve the required aspect ratio for critical dimensions of desired features.

It would be useful to provide a method of fabricating films of arrays of ordered nanostructures that overcome these problems.

BRIEF DESCRIPTION OF THE DRAWINGS

Embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

FIGS. 2A-5A illustrate elevational, cross-sectional views of embodiments of a portion of the substrate depicted in FIGS. 2-5 taken, respectively, along line 2A-2A to line 5A-5A.

FIG. 8 illustrates a diagrammatic top plan view of a portion of the substrate of FIG. 7 at a subsequent stage. FIG. 8A is an elevational, cross-sectional view of the substrate depicted in FIG. 8 taken along line 8A-8A.

FIGS. 10A-13A illustrate elevational, cross-sectional views of embodiments of a portion of the substrate depicted in FIGS. 10-13 taken, respectively, along line 10A-10A to line 13A-13A.

FIG. 17 illustrates an intermediate structure showing the removal of half-cylindrical domains of the base layer.

FIGS. 19-21 illustrate diagrammatic top plan views of the substrate of FIG. 1 at various stages of the fabrication of a self-assembled block copolymer film according to another embodiment of the present disclosure utilizing a cylindrical-phase block copolymer for the base film. FIGS. 19A-21A illustrate elevational, cross-sectional views of embodiments of a portion of the substrate depicted in FIGS. 19-21 taken, respectively, along line 19A-19A to line 21A-21A.

FIG. 26 illustrates a diagrammatic top plan view of the substrate of FIG. 1 at a subsequent stage of the fabrication of a self-assembled block copolymer film according to another embodiment of the present disclosure utilizing a cylindrical-phase block copolymer for the base film. FIG. 26A illustrates an elevational, cross-sectional view of the substrate depicted in FIG. 26 taken along line 26A-26A.

DETAILED DESCRIPTION OF THE INVENTION

Figure 1:
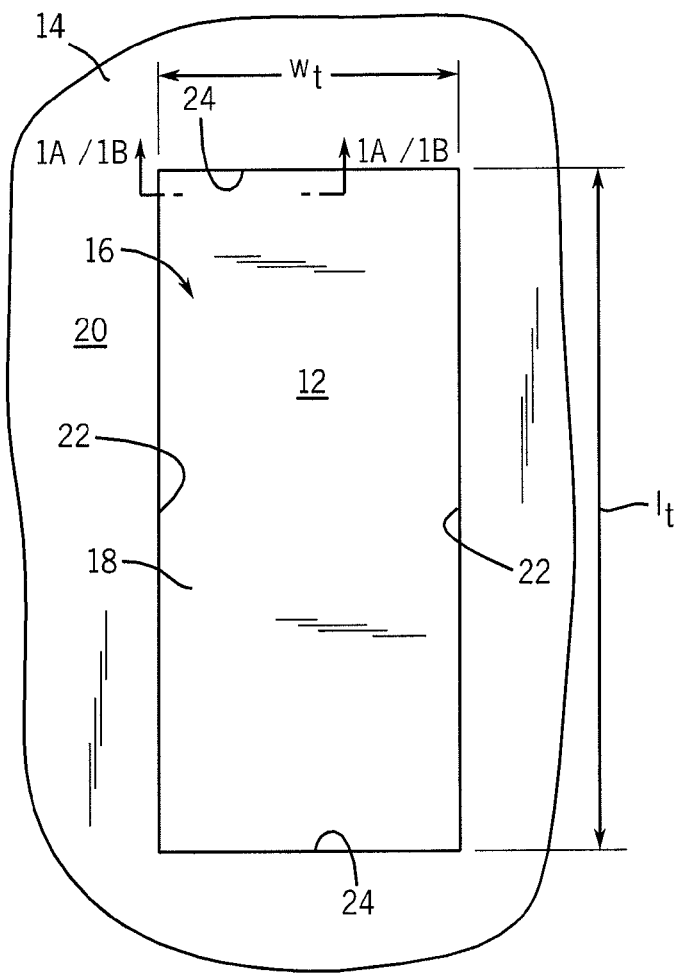
FIG. 1 illustrates a diagrammatic top plan view of a portion of a substrate at a preliminary processing stage according to an embodiment of the present disclosure, showing the substrate with a trench.

The following description with reference to the drawings provides illustrative examples of devices and methods according to embodiments of the invention. Such description is for illustrative purposes only and not for purposes of limiting the same.

In the context of the current application, the terms "semiconductor substrate" or "semiconductive substrate" or "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive substrates, wafer fragments or wafers described above.

"$L_o$" is the inherent pitch (bulk period or repeat unit) of structures that self-assemble upon annealing from a self-assembling (SA) block copolymer or a blend of a block copolymer with one or more of its constituent homopolymers.

Processing conditions of embodiments of the invention use a graphoepitaxy technique utilizing the sidewalls of trenches as constraints to induce orientation and registration of a first film of a self-assembling diblock copolymer to form an ordered array pattern registered to the trench sidewalls. The first polymer film is then used as a template or base layer for inducing the ordering of a subsequently deposited block copolymer film such that, upon annealing, the polymer domains orient and are registered to the underlying structures, resulting in a stacked double- or multi-layered structure with like polymer domains registered to each other. The procedure can be repeated as needed to achieve a desired structure pattern of a required dimension in the z-axis direction. In some embodiments, the desired patterned can be selectively etched by methods known in the art, and the resulting template structures can be used to prepare features within a substrate.

Steps in a method for fabricating thin films from self-assembling (SA) block copolymers that define nanometer-scale linear array patterns according to embodiments of the invention are illustrated in FIGS. 1-8.

The method forms a multi-layer pattern within trenches by forming a polymer base film or template with ordered structures within the trenches for inducing the ordering of an overlying lamellar phase block copolymer film such that the lamellar domains are oriented perpendicularly and registered to the underlying assembled domains of the base film.

The base layer within the trenches can be formed from a lamellar-phase block copolymer film, which upon annealing forms a registered lamellar array of alternating polymer-rich blocks that extend the length and are oriented parallel to the sidewalls and perpendicular to the floor of the trenches. In other embodiments, the base layer is &lined from a cylindrical-phase block copolymer material which, upon annealing, forms lines of half-cylinders in a polymer matrix extending the length and oriented parallel to the sidewalls and floor of the trenches. The assembled base film can then be used as a template for inducing the ordering of an overlying lamellar-phase block copolymer film such that the lamellar domains of the annealed film are oriented perpendicularly and registered to the underlying pattern of the base film within the trenches.

To produce a base polymer film within the trenches using a lamellar-phase block copolymer, the surface of the sidewalls and edges of the trenches are preferential wetting by one block of the copolymer and the trench floors are neutral wetting (equal affinity for both blocks of the copolymer) to allow both blocks of the copolymer material to wet the floor of the trench. Entropic forces drive the wetting of a neutral wetting surface by both blocks, resulting in the formation of a layer of perpendicular lamellae across the width of each trench.

Figure 1A:
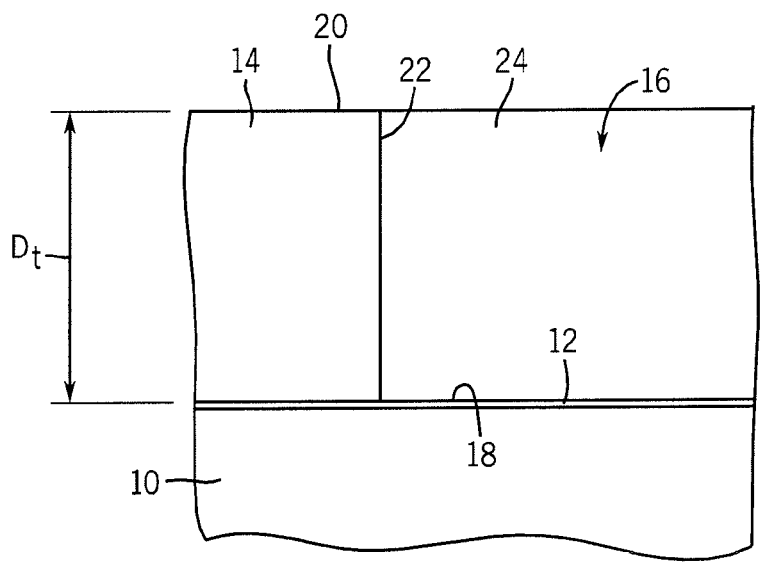
FIGS. 1A and 1B are elevational, cross-sectional views of embodiments of the substrate depicted in FIG. 1 taken along line 1A/1B-1A/1B.

In an embodiment shown in FIGS. 1 and 1A, a substrate 10 is provided bearing a neutral wetting surface. The substrate 10 can comprise, for example, silicon (with native oxide), oxide (e.g., silicon oxide, $SiO_x$) or an inorganic film. In the illustrated embodiment, a neutral wetting layer 12 is formed on the substrate 10 prior to forming an overlying material layer 14 (e.g., oxide). Etching through the material layer 14 to form a trench 16 exposes the underlying neutral wetting layer 12 as a floor or bottom surface 18 of the trench 16. Adjacent trenches are separated by a spacer or crest 20. The trench 16 is structured with opposing sidewalls 22, opposing ends 24, a width ($w_t$), a length ($l_t$) and a depth ($D_t$).

A neutral wetting surface can be provided, for example, by applying a neutral wetting polymer to form layer 12 on the surface of the substrate 10. In the use of a self-assembling (SA) diblock copolymer composed of PS-b-PMMA, a random PS:PMMA copolymer brush layer (PS-r-PMMA)), which exhibits non-preferential or neutral wetting toward PS and PMMA can be applied by spin-coating onto the surface of substrate 10. The brush can be affixed by grafting (on an oxide substrate) or by cross-linking (any surface) using UV radiation or thermal processing. For example, a random copolymer solution composed of PS and PMMA with hydroxyl group(s) (e.g., about 58% PS) can be applied to the surface of the substrate 10 as a layer about 5-10 nm thick and grafted by heating at about 160° C. for about 48 hours.

In another embodiment, a surface that is neutral wetting to PS-b-PMMA can be prepared by spin coating a blanket layer of a photo- or thermally cross-linkable random copolymer such as a benzocyclobutene- or azidomethylstyrene-functionalized random copolymer of styrene and methyl methacrylate (e.g., poly(styrene-r-benzocyclobutene-r-methyl methacrylate (PS-r-PMMA-r-BCB) onto the surface of the substrate 10 prior to forming the material layer 14. For example, such a random copolymer can comprise about 42% PMMA, about (58–x)% PS and x % (e.g., about 2-3%) of either polybenzocyclobutene or poly(para-azidomethylstyrene)). An azidomethylstyrene-functionalized random copolymer can be UV crosslinked (e.g., 1-5 MW/cm$^2$ exposure for about 15 seconds to about 30 minutes) or thermally crosslinked (e.g., at about 170° C. for about 4 hours). A benzocyclobutene-functionalized random copolymer can be thermally cross-linked (e.g., at about 200° C. for about 4 hours or at about 250° C. for about 10 minutes).

Another neutral wetting surface for PS-b-PMMA can be provided by hydrogen-terminated silicon, which can be prepared by a conventional process, for example, by a fluoride ion etch of a silicon substrate 10 (with native oxide present, about 12-15 Å) for example, by immersion in aqueous solution of hydrogen fluoride (HF) and buffered HF or ammonium fluoride (NH$_4$F), by HF vapor treatment, by exposure to hot H$_2$ vapor, or by a hydrogen plasma treatment (e.g., atomic hydrogen).

Figure 1B:
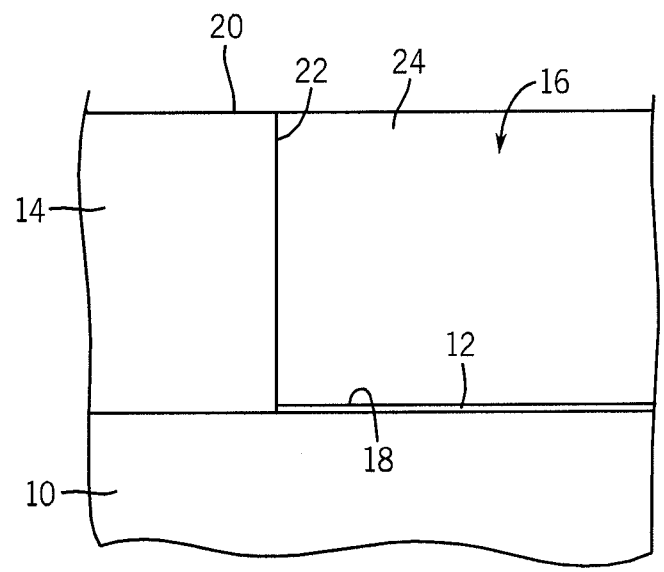

Referring now to FIG. 1B in another embodiment, the material layer 14 can be formed on the substrate 10 and etched to form the trench 16, and the neutral wetting material 12 then applied to the trench floor 18. For example, trench floors that are neutral wetting to PS-b-PMMA can be prepared by spin coating PS-r-PMMA-r-BCB onto the surface of the substrate 10 within the trenches and thermally crosslinking the polymer (e.g., 190° C., 4 hours) to form a crosslinked polymer mat as a neutral wetting layer 12. Capillary forces pull the random copolymer to the bottom of deep trenches. Non-crosslinked polymer material can be subsequently removed. A neutral-wetting polymer (NWP) such as random copolymer of P(S-r-MMA-r-HEMA) can also be grafted selectively to a material layer, e.g., an oxide floor. See, for example, In et al., Langmuir, 2006, 22, 7855-7860, the disclosure of which is incorporated by reference herein. In other embodiments, an olefinic monomer such as PMMA or PS can be grafted onto an H-terminated silicon substrate 10 (i.e., floor 18) by an in situ free radical polymerization using a di-olefinic linker such divinyl benzene to produce an about 10-15 nm thick film.

Trench sidewalls 22 and ends 24 are preferential wetting by one block of the copolymer to induce formation of lamellae as the blocks self-assemble. The material layer 14 defining the trench surfaces can be an inherently preferential wetting material, or in other embodiments, a layer of a preferential wetting material can be applied onto the surfaces of the trenches.

For example, in the use of poly(styrene-block-methyl methacrylate) (PS-b-PMMA), an oxide (e.g., silicon oxide, SiO$_x$) or a clean silicon surface (with native silicon oxide) exhibits preferential wetting toward the PMMA block to result in the assembly of a thin (e.g., ¼ pitch) interface layer of PMMA and alternating PMMA and PS lamellae (e.g., ½ pitch) within each trench in the use of a lamellar-phase block copolymer material. Other preferential wetting surfaces to PMMA can be provided, for example, by silicon nitride, silicon oxycarbide, polymethylmethacrylate (PMMA) polymer grafted to a sidewall material such as silicon oxide, and resist materials such as methacrylate-based resists. For example, a PMMA that is modified with a moiety containing one or more hydroxyl (—OH) groups (e.g., hydroxyethylmethacrylate) can be applied by spin coating and then heated (e.g., to about 170° C.) to allow the OH groups to end-graft to the oxide sidewalls 22 and ends 24 of the trenches. Non-grafted material can be removed from the neutral wetting layer 12 by rinsing with an appropriate solvent (e.g., toluene). See, for example, Mansky et al., Science, 1997, 275, 1458-1460, and In et al., Langmuir, 2006, 22, 7855-7860, the disclosures of which are incorporated by reference herein.

The trench sidewalls 22, edges and floors 18 influence the structuring of the array of nanostructures within the trenches 16. The boundary conditions of the trench sidewalls 22 in both the x- and y-axis impose a structure wherein each trench 16 contains n number of features (i.e., lamellae, cylinders, etc.). Factors in forming a single array or layer of nanostructures within the trenches 16 include the width and depth of the trench 16, the formulation of the block copolymer to achieve the desired pitch ($L_o$), and the thickness (t) of the copolymer film.

The trenches 16 are constructed with a width ($w_t$) such that a block copolymer (or blend) will self-assemble upon annealing into a single layer of "n" structures spanning the width ($w_t$) of the trench 16, with each structure (i.e., lamellae, cylinders, etc.) being separated by a value of $L_o$ (from center-to-center). The width ($w_t$) of the trenches 16 is a multiple of the inherent pitch value ($L_o$) of the polymer being equal to or about $nL_o$ ("n*$L_o$"), typically ranging from about n*10 to about n*100 nm (with n being the number of features or structures). The depth ($D_t$) of the trenches 16 is a multiple of the $L_o$ value of the block copolymer used for the base layer. The application and annealing of a block copolymer material having an inherent pitch value of $L_o$ in a trench having a width ($w_t$) at or about $L_o$ will result in the formation of a single layer of "n" structures spanning the width and registered to the sidewalls for the length of the trench. In some embodiments, the trench 16 dimension is about 50-500 nm wide ($w_t$) and about 1,000-10,000 μm in length (l), with a depth ($D_t$) of about 20-200 nm.

The trenches 16 can be formed using a lithographic tool having an exposure system capable of patterning at the scale of $L_o$ (10-100 nm). Such exposure systems include, for example, extreme ultraviolet (EUV) lithography, proximity X-rays, and electron beam (e-beam) lithography, as known and used in the art. Conventional photolithography can attain (at smallest) about 58 nm features.

Figure 2:
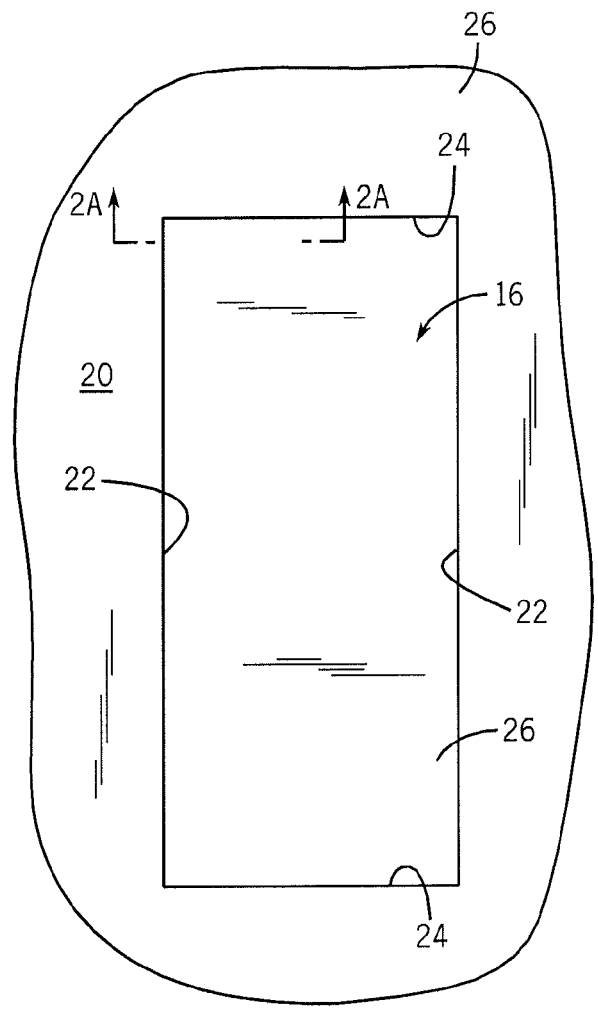
FIGS. 2-5 illustrate diagrammatic top plan views of the substrate of FIG. 1 at various stages of the fabrication of a self-assembled block copolymer film according to an embodiment of the present disclosure.
Figure 2A:
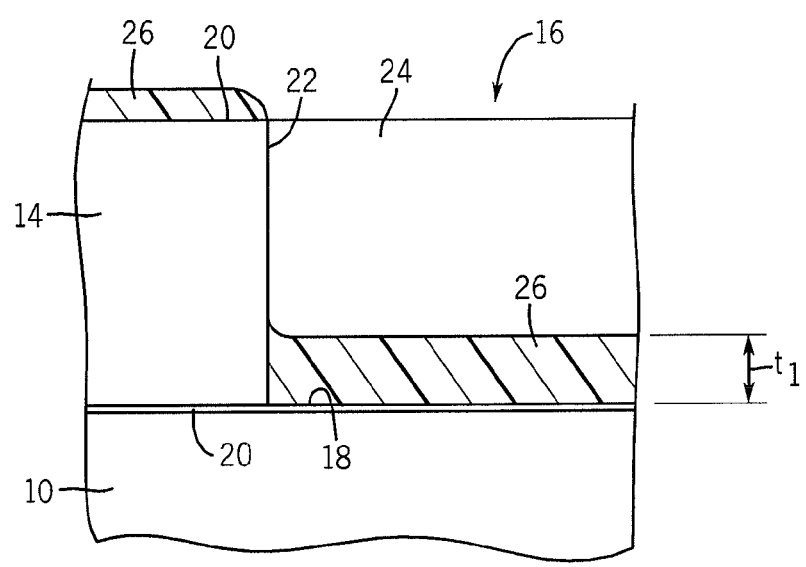

Referring now to FIGS. 2 and 2A, a layer 26 of a self-assembling (SA) lamellar-phase diblock copolymer material having an inherent pitch at or about $L_o$ (or a ternary blend of block copolymer and homopolymers blended to have a pitch at or about $L_o$) is then deposited, typically by spin casting (spin-coating) onto the floor 18 of the trench 16. The block copolymer material can be deposited onto the patterned surface by spin casting from a dilute solution (e.g., about 0.25-2 wt % solution) of the copolymer in an organic solvent such as dichloroethane ($CH_2Cl_2$) or toluene, for example.

The thickness ($t_t$) of the diblock copolymer layer 26 is less than the trench depth ($D_t$) and at or about the $L_o$ value of the copolymer material such that the diblock copolymer layer 26 will self-assemble upon annealing to form a single layer of lamellae across the width ($w_t$) of the trench. A typical thickness ($t_t$) of the diblock copolymer layer 26 is about 20% of the $L_o$ value of the copolymer (e.g., about 10-100 nm) to form alternating polymer-rich lamellar blocks having a width of about $L_o$ (e.g., 25-35 nm) in a matrix of another block within each trench. The thickness of the diblock copolymer layer 26 can be measured, for example, by ellipsometry techniques. As shown, a thin diblock copolymer layer 26 of the copolymer material can be deposited onto the spacers 20 of the material layer 14; this film layer will not self-assemble, as it is not thick enough to form structures.

Although diblock copolymers are used in the illustrative embodiments of this disclosure, other types of block copolymers (i.e., triblock or multiblock copolymers) can be used. Examples of diblock copolymers include poly(styrene-block-methyl methacrylate) (PS-b-PMMA), polyethyleneoxide-polyisoprene, polyethyleneoxide-polybutadiene, polyethyleoxide-polystyrene, polytheleneoxide-polymethylmethacrylate, polystyrene-polyvinylpyridine, polystyrene-polyisoprene (PS-b-PI), polystyrene-polybutadiene, polybutadiene-polyvinylpyridine, and polyisoprene-polymethylmethacrylate, among others. Examples of triblock copolymers include poly(styrene-block methyl methacrylate-block-ethylene oxide). One of the polymer blocks of the block copolymer should be selectively and readily removable in order to fabricate an etch mask or template from the annealed film.

In embodiments in which the base or template layer is formed from a lamellar-forming diblock copolymer, the volume fractions of the two blocks (AB) are generally at a ratio between about 50:50 and 60:40. To achieve an annealed base film in which the lamellae are surface oriented, the Chi value of the polymer blocks (e.g., PS and PMMA) at common annealing temperatures is generally small such that the air interface is equally or non-selectively wetting to both blocks. An example of a lamellae-forming symmetric diblock copolymer is PS-b-PMMA with a weight ratio of about 50:50 (PS:PMMA) and total molecular weight ($M_n$) of about 51 kg/mol.

In embodiments of the invention, the block copolymer material can also be formulated as a binary or ternary blend comprising a SA block copolymer and one or more homopolymers of the same type of polymers as the polymer blocks in the block copolymer, to produce blends that swell the size of the polymer domains and increase the $L_o$ value of the polymer. The volume fraction of the homopolymers can range from 0 to about 40%. An example of a ternary diblock copolymer blend is a PS-b-PMMA/PS/PMMA blend, for example, 46K/21K PS-b-PMMA containing 40% 20K polystyrene and 20K poly(methylmethacrylate). The $L_o$ value of the polymer can also be modified by adjusting the molecular weight of the block copolymer, e.g., for lamellae, $L_o \sim (MW)^{2/3}$.

Optionally, ellipticity ("bulging") can be induced in the structures by creating a slight mismatch between the trench and the spacer widths and the inherent pitch ($L_o$) of the block copolymer or ternary blend, as described, for example, by Cheng et al., "Self-assembled One-Dimensional Nanostructure Arrays," *Nano Lett.*, 2006, 6(9), 2099-2103, the disclosure of which are incorporated by reference herein, which then reduces the stresses that result from such mismatches.

Figure 3:
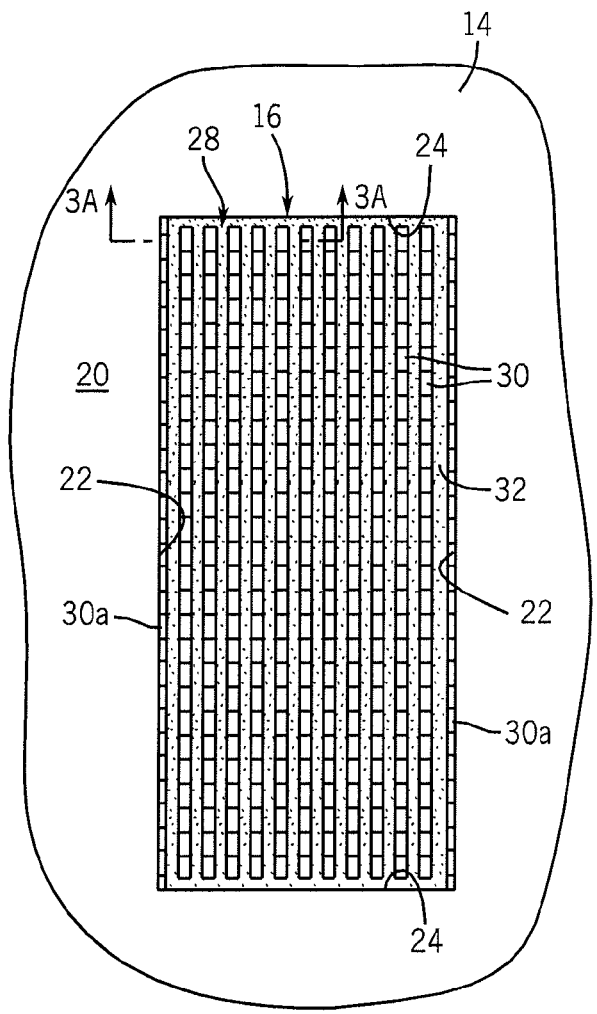
Figure 3A:
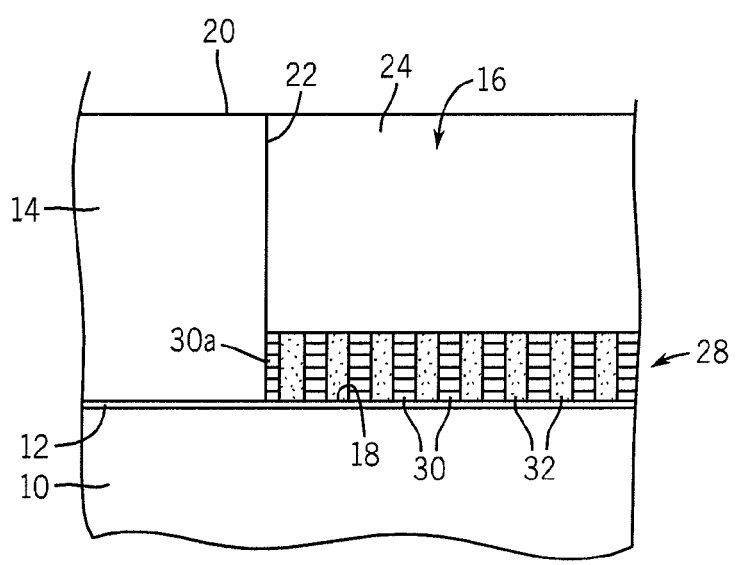

Referring now to FIGS. 3 and 3A, the first diblock copolymer layer 26 is then annealed, for example, by thermal annealing to above the glass transition temperature of the component blocks of the copolymer material to cause the polymer blocks to phase separate and self-assemble according to the preferential and neutral wetting of the trench surfaces 18, 22, 24 to form a self-assembled polymer structure 28. For example, a PS-b-PMMA copolymer film can be annealed at a temperature of about 180-285° C. in a vacuum oven for about 1-120 hours to achieve the self-assembled morphology. The film can also be solvent annealed, for example, by slowly swelling both blocks of the film with a solvent, then slowly evaporating the solvent.

The constraints provided by the width ($w_t$) of the trenches and the character of the copolymer composition combined with preferential or neutral wetting surfaces within the trenches results, upon annealing, in a single layer of n elements (lamellae) across the width ($w_t$) of the trench. The number "n" or pitches of elements (e.g., lamellar blocks) or half-cylinders within a trench is according to the width ($w_t$) of the trench and the molecular weight (MW) of the block copolymer. As shown in FIG. 3A, a lamellar-phase block copolymer material used to form the base layer 28 will, upon annealing, self-assemble into perpendicular-oriented, alternating polymer-rich blocks 30, 32 spanning the width ($w_t$) of the trench 16 at an average pitch value at or about $L_o$. For example, depositing and annealing an about 50:50 PS:PMMA block copolymer film ($M_n$=51 kg/mol; $L_o$=32 nm) in an about 250 nm wide trench will subdivide the trench into about eight (8) lamellar structures.

The resulting morphologies of the annealed base film 28 (i.e., perpendicular orientation of lamellae) can be examined, for example, using atomic force microscopy (AFM), transmission electron microscopy (TEM), scanning electron microscopy (SEM).

The annealed and ordered base film 28 is then treated to crosslink the polymer segments to fix and enhance the strength of the self-assembled polymer blocks 30, 32 within the trench 16 (e.g., to crosslink the PS segments). The polymers can be structured to inherently crosslink (e.g., upon exposure to ultraviolet (UV) radiation, including deep ultraviolet (DUV) radiation), or one or both of the polymer blocks 30, 32 of the copolymer material can be formulated to contain a crosslinking agent. The material of diblock copolymer layer 26 outside the trench (e.g., on spacer 20) can then be removed.

For example, in one embodiment, the trench regions can be selectively exposed through a reticle to crosslink only the self-assembled film 28 within the trench 16, and a wash can then be applied with an appropriate solvent (e.g., toluene), to remove the non-crosslinked portions of the film 28 (e.g., material of the diblock copolymer layer 26 on the spacer 20) leaving the registered self-assembled base film within the trench 16 and exposing the surface of material layer 14 above/outside the trench 16 (e.g., the spacer 20). In another embodiment, the annealed film 28 can be crosslinked globally, a photoresist layer can be applied to pattern and expose the areas of the film outside the trench regions (e.g., over the spacers 20), and the exposed portions of the film can be removed, for example by an oxygen ($O_2$) plasma treatment. In other embodiments, the spacers 20 are narrow in width, for example, a width ($w_s$) of one of the copolymer domains (e.g., about $L_o$) such that the material of diblock copolymer layer 26 on the spacers is minimal and no removal is required.

Figure 4:
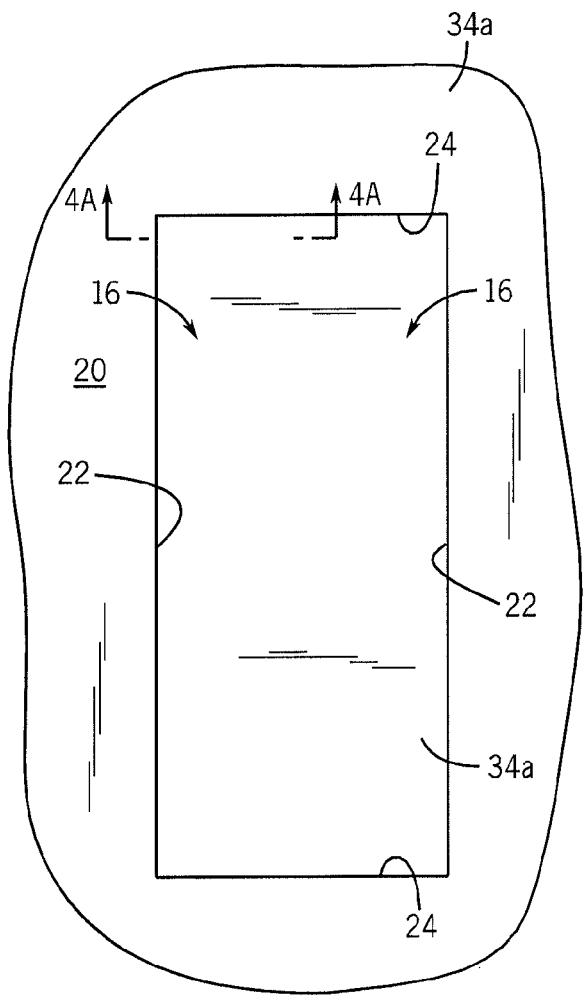
Figure 4A:
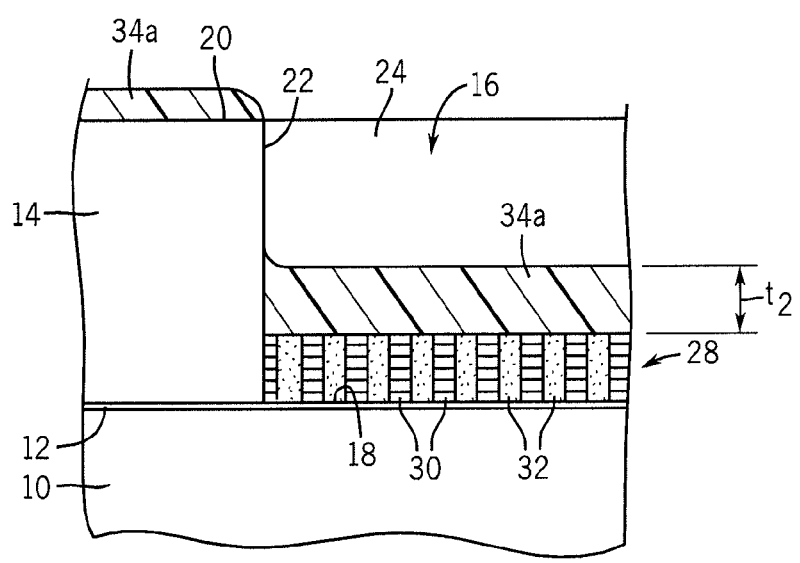

Referring now to FIGS. 4 and 4A, a layer 34a of a lamellar-phase block copolymer material having an inherent pitch at or about $L_o$ (or a ternary blend of block copolymer and homopolymers blended to have a pitch at or about $L_o$) is then deposited (e.g., by spin casting) onto the annealed and crosslinked base film 28 within the trench. The block copolymer material can be spin cast, for example, from a dilute solution of the copolymer in an organic solvent (e.g., about 0.25-2 wt % solution).

The lamellar-phase block copolymer layer 34a is cast onto the base film 28 within the trench 16 to a thickness ($t_2$) at or about the $L_o$ value of the block copolymer material such that, upon annealing, the lamellar-phase block copolymer layer 34a will self-assemble to form a single layer of perpendicular-oriented lamellar domains, each having a width ($w_2$) at or about $0.5\ L_o$.

Figure 5:
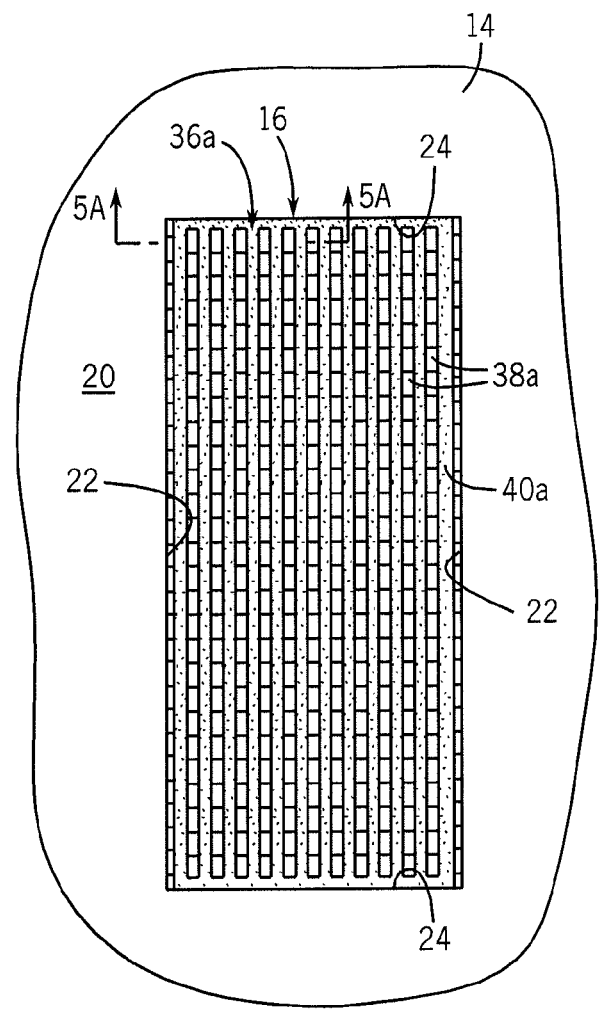
Figure 5A:
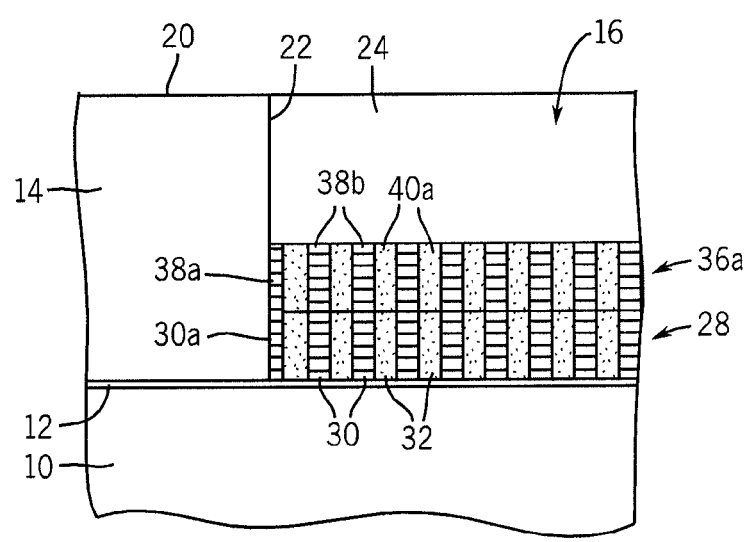

As shown in FIGS. 5 and 5A, annealing of the lamellar-phase block copolymer layer 34a is then conducted to cause the polymer blocks to separate and self-assemble into a film 36a composed of perpendicular-oriented lamellar-phase domains 38a, 40a in a striped pattern, which are ordered and registered, respectively, to the polymer domains 30, 32 by the base layer 28. Annealing can be conducted, for example, over a range of about 110-290° C. for a PS-b-PMMA copolymer film. The annealed film 36a is then crosslinked, and the non-ordered copolymer material 34a on the material layer 14 outside the trench 16 can be removed (e.g., by solvent wash, $O_2$ plasma treatment) resulting in the structure shown in FIG. 5A.

Figure 6:
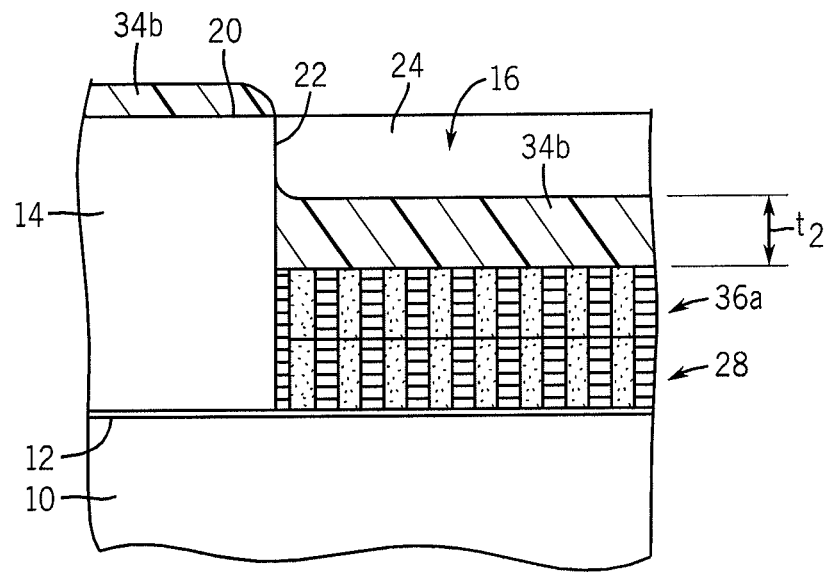
FIGS. 6 and 7 illustrate elevational, cross-sectional views of the substrate depicted in FIG. 5A, in subsequent stages.
Figure 7:
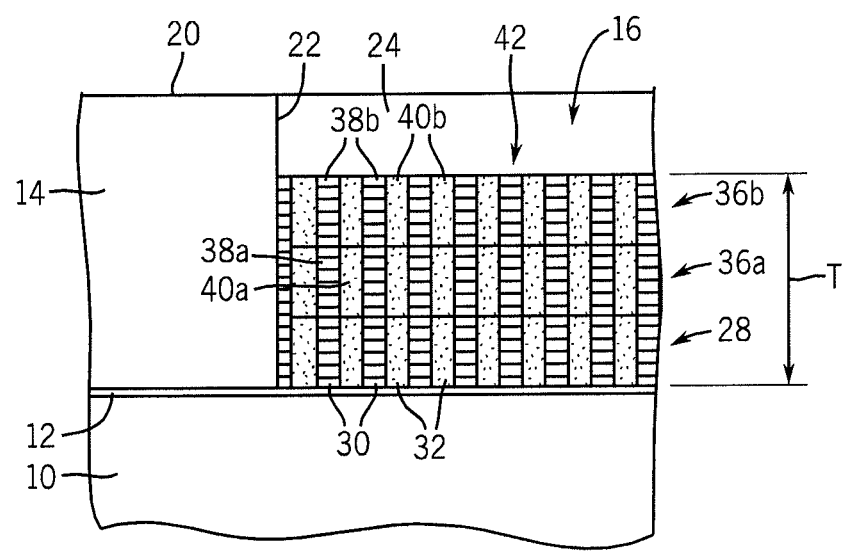

Referring now to FIG. 6, a second layer 34b of the lamellar-phase block copolymer material can be deposited to a thickness ($t_2$) at or about $L_o$ onto the annealed and crosslinked film 36a. The second lamellar-phase block copolymer layer 34b can then be annealed such that the polymer blocks self-assemble into a film 36b of perpendicular-oriented lamellar-phase domains 38b, 40b oriented and registered to the underlying polymer blocks 38a, 40a, whereupon the film 36b can be a crosslinked and non-ordered copolymer material of second lamellar-phase block copolymer layer 34b outside the trench 16 can be removed, as illustrated in FIG. 7. This process can be repeated as desired to deposit and form additional layers of the lamellar-phase block copolymer to result in a film structure 42 of a desired thickness (T). In embodiments of the invention, the aspect ratio of the openings formed in the multilayered film is at least about two times the aspect ratio that can be provided by similar single layer films, and can be increased with the addition of film layers, generally at least about 1:2 and ranging from about 1:2 to about 1:20.

Referring now to FIGS. 8 and 8A, one of the block components can be selectively removed to produce a thin film 44 that can be used, for example, as a lithographic template or mask to pattern the underlying substrate 10 in a semiconductor processing to define regular patterns in the nanometer size range (i.e., about 10-100 nm). Within the trench 16, selective removal of one of the polymer blocks of each of the layers 36a, 36b and the base film 28 is performed.

For example, as illustrated in FIG. 8A, selective removal of one of the polymer domains 30, 38a-b (e.g., PMMA) will result in openings (slits) 46 separated by vertically oriented walls 48 composed of polymer domains 32, 40a-b (e.g., PS), and the trench floor 18 (e.g., neutral wetting layer 12) exposed. Removal of PMMA phase domains can be performed, for example, by application of an oxygen ($O_2$) or $CF_4$ plasma.

In embodiments in which the PS phase domains are removed, the openings (slits) are separated by walls composed of the PMMA domains.

In some embodiments, the resulting film 44 has a corrugated surface that defines a linear pattern of fine, nanometer-scale, parallel slits (openings) 46 about 5-50 nm wide and several microns in length (e.g., about 10-4000 μm), the individual slits separated by walls 48 about 5-50 nm wide, providing an aspect ratio ranging from about 1:2 to about 1:20. For example, removal of the PMMA domains affords a PS mask of sublithographic dimensions, for example, a pitch of about 35 nm (17.5 nm PS domain). A smaller pitch can be dialed in by using lower molecular weight diblock copolymers.

Figure 8B:
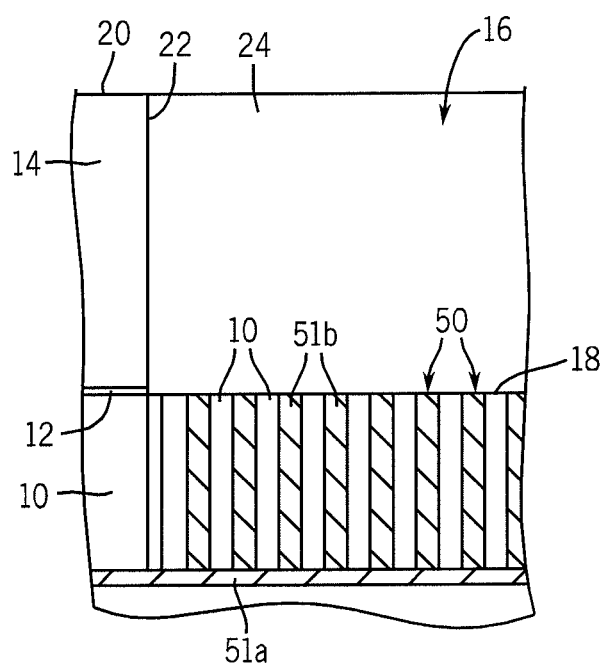
FIG. 8B is a view of FIG. 8A in a subsequent processing step.

The films can be used, for example, as a lithographic template or etch mask to pattern (arrows ↓↓) the underlying substrate 10, for example, by a non-selective RIE etching process, to delineate a series of channels or grooves 50, shown in phantom in FIG. 8A, and extending to an active area or element 51a. In some embodiments, the channels 50 can then be filled with a material 51b as illustrated in FIG. 8B, for example, a conductive material (e.g., metal) to form nanowire channel arrays for transistor channels, semiconductor capacitors, and other structures, or with a dielectric material to separate active areas (e.g., substrate 10). Further processing can then be performed as desired.

The films provide linear arrays having long range ordering and registration for a wide field of coverage for templating a substrate. The films are useful as etch masks for producing close pitched nanoscale channel and grooves that are several microns in length, for producing features such as floating gates for NAND flash with nanoscale dimensions. By comparison, photolithography techniques are unable to produce channels much below 60 nm wide without high expense. Resolution can exceed other techniques such as conventional photolithography, while fabrication costs utilizing methods of the disclosure are far less than electron beam (E-beam) or EUV photolithographies which have comparable resolution.

A method according to another embodiment of the invention for forming a thin film that defines a linear array pattern utilizing a base layer formed from a cylindrical-phase block copolymer is illustrated with reference to FIGS. 9-18. The base layer, upon annealing, forms lines of half-cylinders in a polymer matrix extending the length and oriented parallel to the sidewalls and floor of the trenches. The assembled base film can then be used as a template for inducing the ordering of an overlying lamellar-phase block copolymer film such that the lamellar domains of the annealed film are oriented perpendicularly and registered to the underlying pattern of the half-cylinders of the base film.

Figure 9:
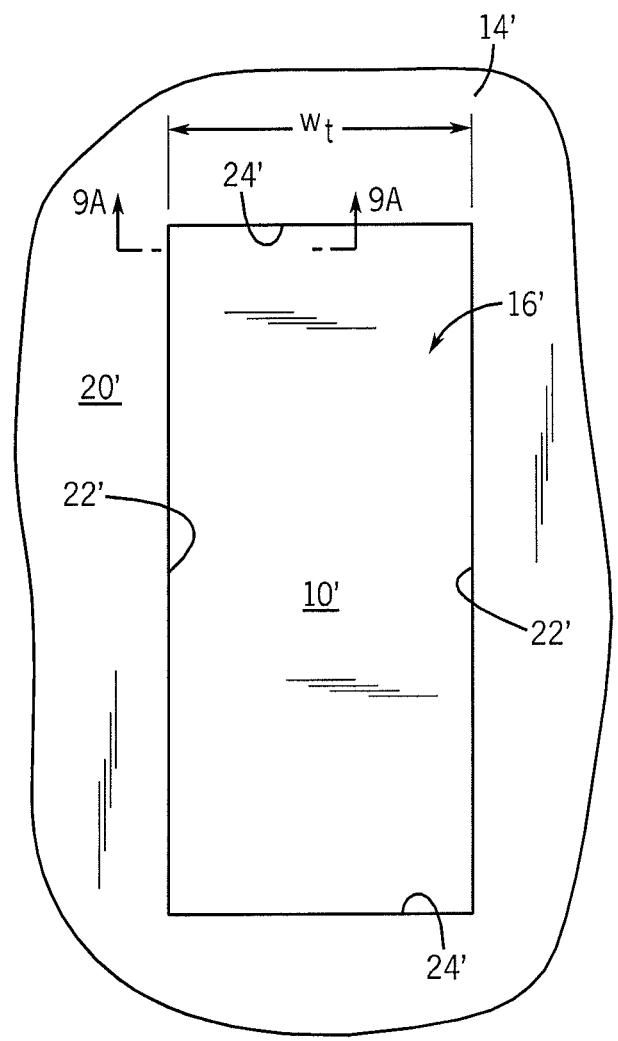
FIG. 9 illustrates a diagrammatic top plan view of a portion of a substrate at a preliminary processing stage according to another embodiment of the present disclosure, showing the substrate with a trench.
Figure 9A:
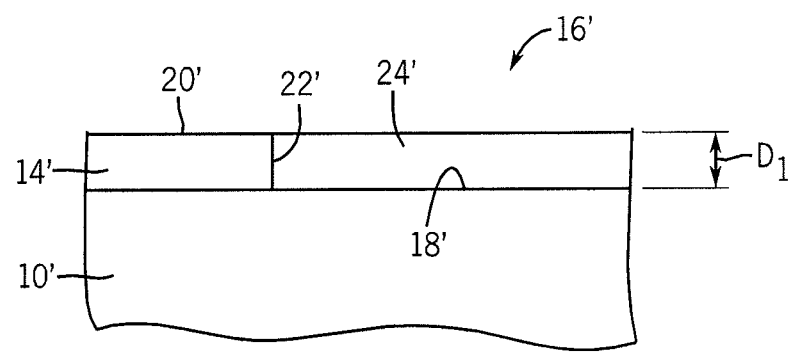
FIG. 9A is an elevational, cross-sectional view of the substrate depicted in FIG. 9 taken along line 9A-9A.

Referring to FIGS. 9 and 9A, in embodiments using a cylindrical-phase block copolymer to form the base polymer film 26' within the trench 16', the surfaces of the floor 18', sidewalls 22' and ends 24' of the trench are preferential wetting by the minority block of the copolymer to induce formation of parallel lines of half-cylinders of the minority block wetting the air interface (surface exposed) down the middle of each trench aligned parallel to the trench sidewalls and floor. For example, substrate 10' can be composed of an inherently preferential wetting material such as a clean silicon surface (with native silicon oxide) and material layer 14' can be composed of oxide (e.g., $SiO_x$). Both materials exhibit preferential wetting toward the PMMA block to result in the assembly of a thin interface layer of PMMA on the trench sidewalls as well as PMMA cylinders in the center of a PS matrix within each trench. Other preferential wetting surfaces to PMMA can be provided, for example, by silicon nitride, silicon oxycarbide, and PMMA polymer grafted to a sidewall material such as silicon oxide, and resist materials such as such as methacrylate-based resists. See, for example, C. T. Black and O. Bezencenet, "Nanometer-Scale Pattern Registration and Alignment by Directed Diblock Copolymer Self-Assembly," IEEE Transactions on Nanotechnology, 2004, 3(3), 412-415; C. T. Black, "Self-Aligned self-assembly of multi-nanowire silicon field effect transistors," Applied Physics Letters, 2005, 87, 163116; R. Ruiz, R. L. Sandstrom and C. T. Black, "Induced Orientational Order in Symmetric Diblock Copolymer Thin-Films," Advanced Materials, 2007, 19(4), 587-591, the disclosures of which are incorporated by reference herein.

Figure 10:
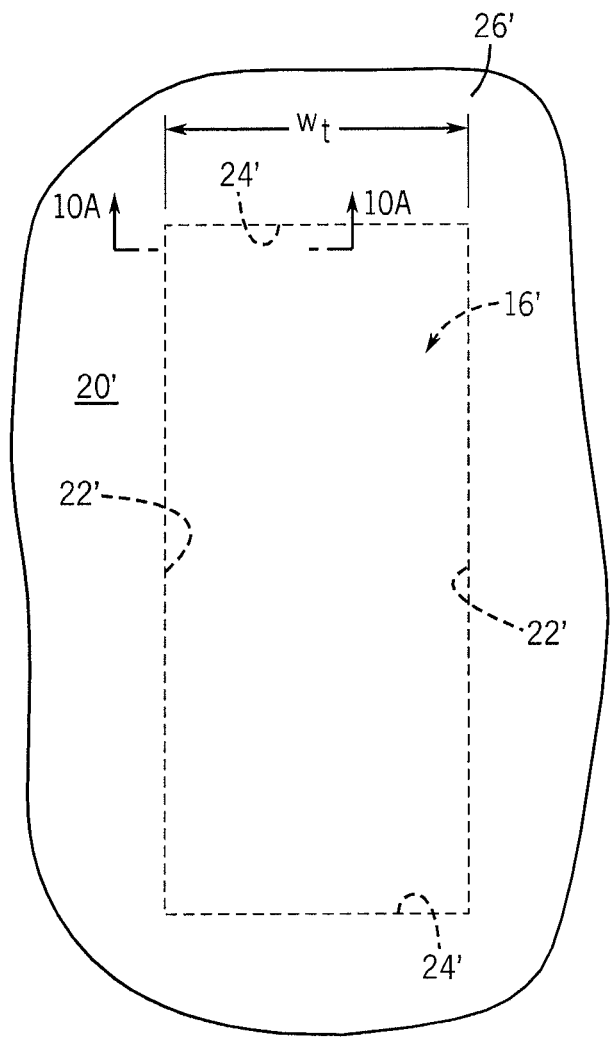
FIGS. 10-13 illustrate diagrammatic top plan views of the substrate of FIG. 9 at various stages of the fabrication of a self-assembled block copolymer film according to an embodiment of the present disclosure utilizing a cylindrical-phase block copolymer for the base film.
Figure 10A:
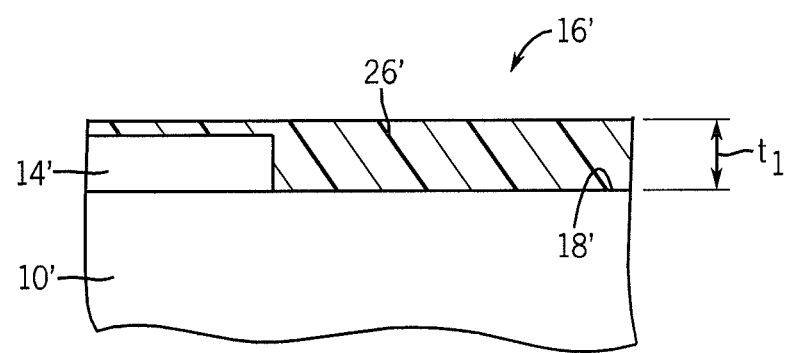

In using a cylindrical-phase block copolymer, the depth ($D_t$) of the trench 16' is less than $L_o$. In some embodiments, the trench dimension is about 50-2000 nm wide ($w_1$) with a depth ($D_t$) of about 15-25 nm. As shown in FIGS. 10 and 10A, a layer 26' of the cylinder-forming block copolymer material (inherent pitch at or about $L_o$) is deposited onto the floor 18' of the trench 16' to a thickness ($t_1$) greater than the trench depth ($D_t$) but less than about the $L_o$ value of the block copolymer material such that the copolymer cylindrical-phase block layer 26' will self-assemble upon annealing to form a single layer of parallel-oriented half-cylinders of one block having a diameter of about $L_o$ in a matrix of another block as parallel lines across the width ($w_t$) of the trench. The number "n" or pitches of half-cylinders within a trench is according to the width ($w_t$) of the trench (e.g., about $nL_o$) and the molecular weight (MW) of the block copolymer.

The cylindrical-phase block copolymer can be a diblock or multiblock copolymer, and the copolymer material can be formulated as a binary or ternary blend comprising a homopolymer(s), as previously described. In embodiments in which the base layer is formed using a cylindrical-phase diblock copolymer, the volume fractions of the two blocks (AB) are generally at a ratio between about 60:40 and 80:20. An example of a cylindrical phase diblock copolymer material is PS-b-PMMA ($L_o$=35 nm) composed of about 70% PS and 30% PMMA (weight ratio of 70:30) with a total molecular weight ($M_n$) of 67 kg/mol to form about 20 nm diameter half-cylinder PMMA domains in a matrix of PS. To achieve an annealed base film in which the half-cylinders are surface exposed, the Chi value of the polymer blocks (e.g., PS and PMMA) at common annealing temperatures and the difference between interfacial energies of each block and the air is generally small, such that the air interface is equally or non-selectively wetting to both blocks.

Figure 11:
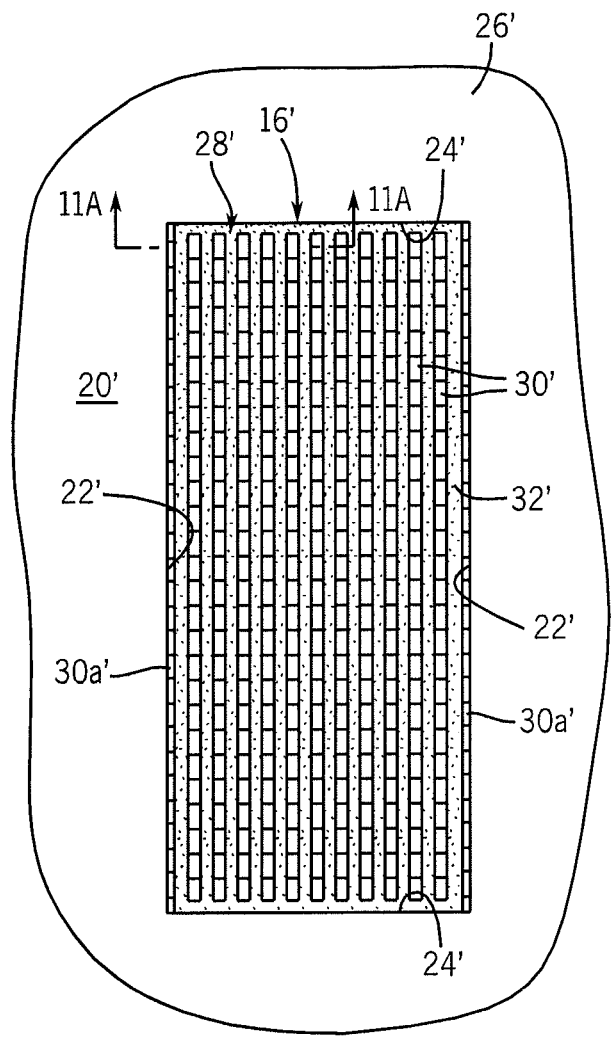
Figure 11A:
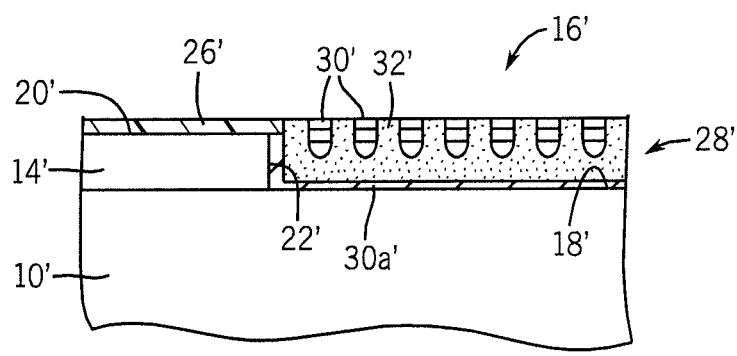

Referring now to FIGS. 11 and 11A, the cylindrical-phase block copolymer film 26' is annealed to form the base layer 28', resulting in parallel-oriented half-cylinders 30' within a polymer matrix 32' spanning the width ($w_t$) of the trench 16', with each cylinder being separated by an average value of at or about $L_o$, and an interface layer 30a' along the sidewalls 22' and floor 18'. For example, depositing and annealing a 70/30 PS:PMMA block copolymer film ($M_n$=67 kg/mol; $L_o$=35 nm) in an about 250 nm wide trench will subdivide the trench into about seven (7) half-cylinder structures. As shown, a thin cylindrical-phase block copolymer film 26' of the copolymer material deposited on the spacers or crests 20' of the material 14' between trenches is not thick enough to self-assemble. In some embodiments, the spacers 20' between the trenches are narrow, for example, having a width ($w_s$) of one of the copolymer domains such that the material of cylindrical-phase block copolymer film 26' on the spacers 20' is essentially nonexistent.

The annealed base film 28' is then be treated to crosslink the polymer segments (e.g., to crosslink the PS matrix 32'). As previously described, the polymers can be structured to inherently crosslink, or one or both of the polymer blocks of the copolymer material can be formulated to contain a crosslinking agent.

Figure 12:
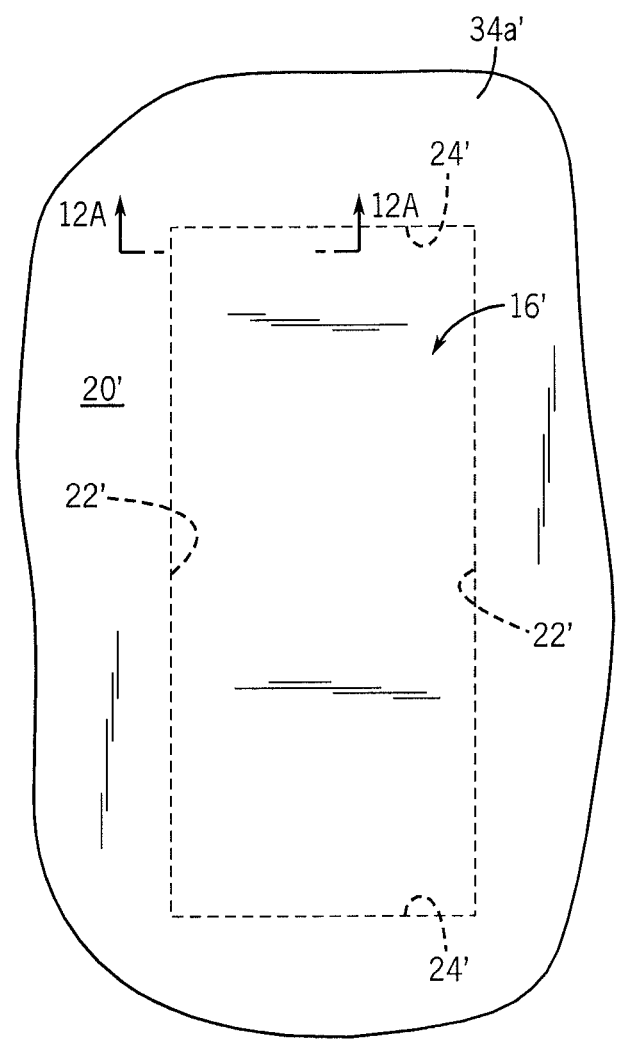
Figure 12A:
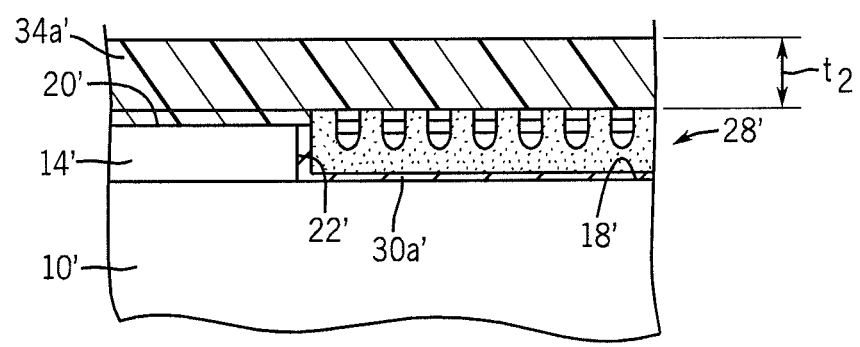

As shown in FIGS. 12 and 12A, a layer 34a' of a lamellar-phase block copolymer material (inherent pitch at or about $L_o$) is then deposited onto the annealed and crosslinked base film 28' to a thickness ($t_2$) at or about the $L_o$ value of the lamellar-phase block copolymer material. The lamellar-phase block copolymer material can be structured and formulated as previously described with respect to the embodiment of FIGS. 1-8. The volume fractions of the two blocks (AB) of a lamellar-forming diblock copolymer are generally at a ratio between about 50:50 and 60:40, an example being a PS-b-PMMA copolymer at a 50:50 weight ratio ($M_n$ of about 51 kg/mol), with a generally small difference in interfacial energies of each block with air to produce surface-exposed lamellae.

Figure 13:
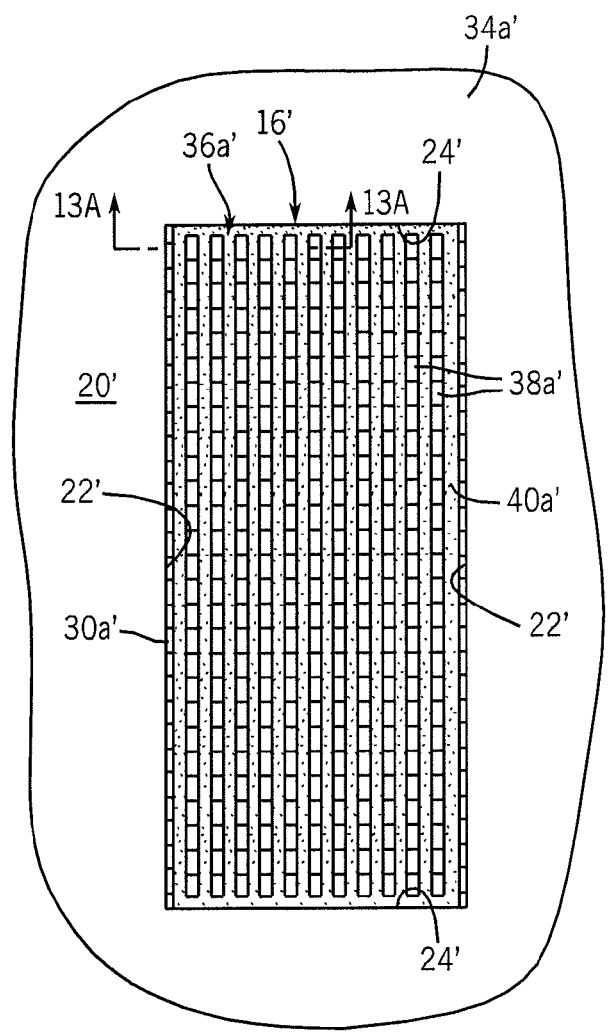
Figure 13A:
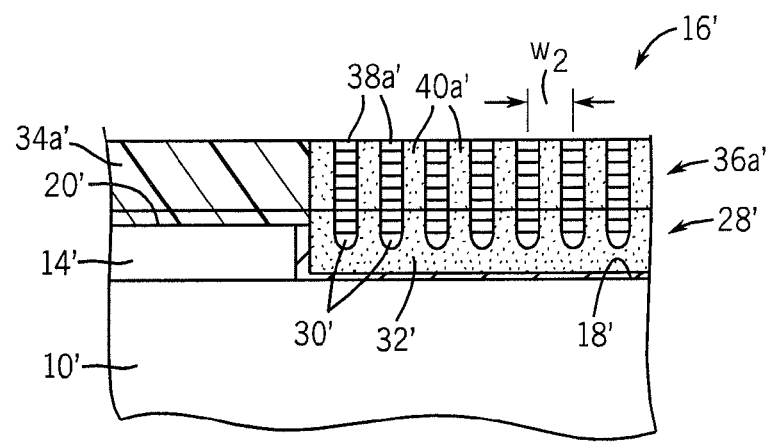

Subsequent annealing of the material of lamellar-phase block copolymer layer 34a' results in a self-assembled film 36a' composed of a single layer of perpendicular-oriented lamellar-phase domains 38a', 40a' in a striped pattern, which are ordered and registered, respectively, to the polymer domains 30', 32' of the cylindrical-phase base layer 28', as illustrated in FIGS. 13 and 13A, with each domain having a width ($w_2$) of about $L_o$. The copolymer material of lamellar-phase block copolymer layer 34a' on the spacers 20' may self-assemble but without registration or long-range order. The annealed film 36a' is then treated to crosslink the polymer segments (e.g., PS domains 40a'), as previously described.

Figure 14:
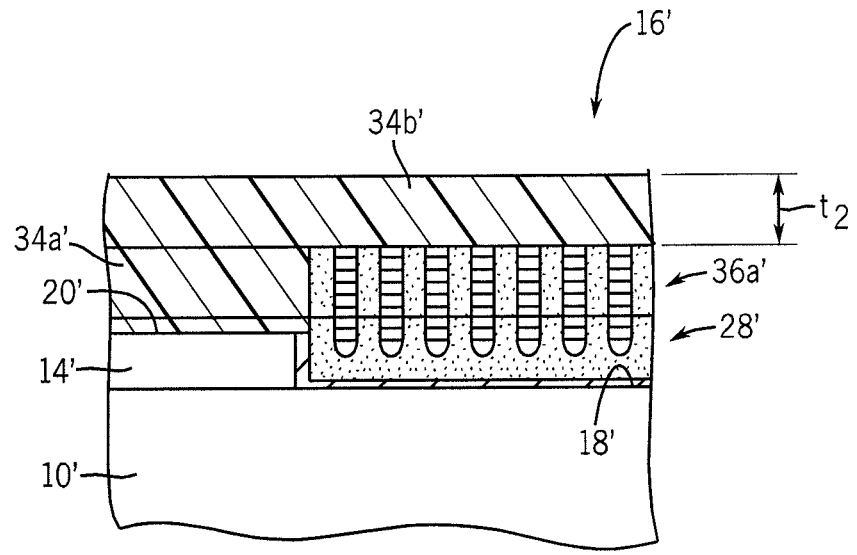
FIGS. 14-17 illustrate elevational, cross-sectional views of the substrate depicted in FIG. 13A, in subsequent stages.
Figure 15:
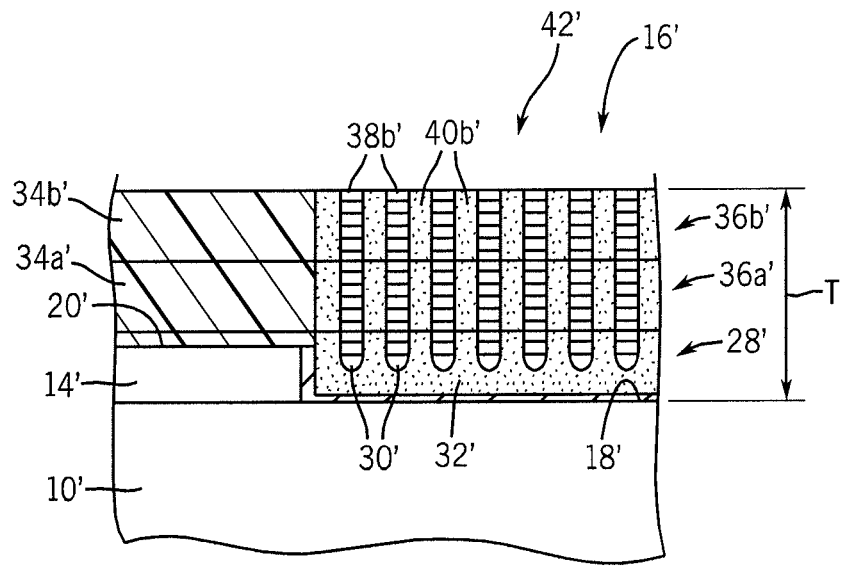

Referring now to FIG. 14, a second layer 34b' of a lamellar-phase block copolymer material can then be deposited onto the previously annealed and crosslinked film 36a' to a thickness ($t_2$) at or about $L_o$. The second lamellar-phase block copolymer layer 34b' can then be annealed to form a second film layer 36b' composed of lamellar-phase domains 38b', 40b' oriented and registered to the underlying polymer blocks 38a', 40a', resulting in the structure shown in FIG. 15. The copolymer material 34b' over the copolymer layer 34a' on the spacers 20' may self-assemble but without registration or long-range order. The film 36b' can then be crosslinked, and additional layers of the lamellar-phase block copolymer can be deposited, annealed and crosslinked to form a film structure 42' of the desired thickness (T). The additional layers of the self-assembled and crosslinked film can be added to increase the aspect ratio of the openings subsequently formed in the multilayered film.

Figure 16:
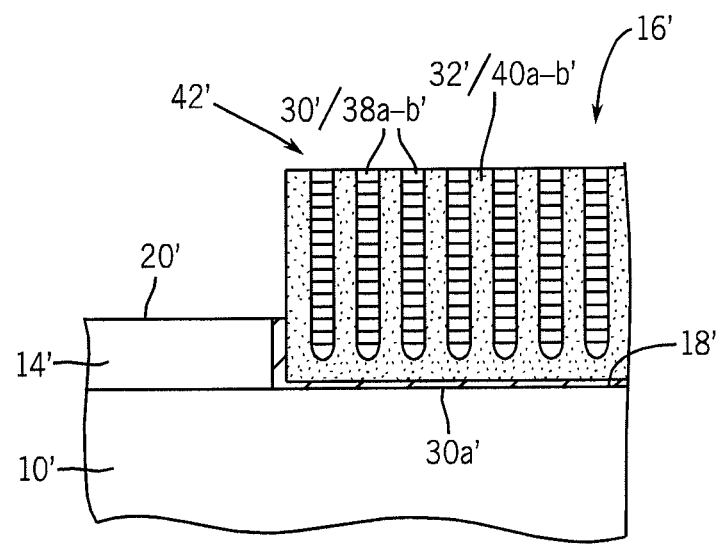
Figure 17:
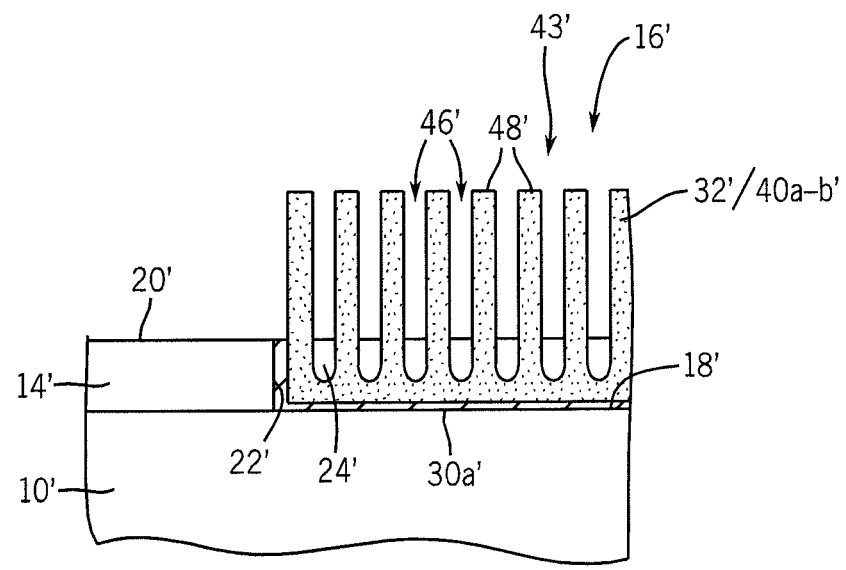

The non-ordered material of lamellar-phase block copolymer layers 34a', 34b' remaining on the spacers 20' can then be removed resulting in the structure shown in FIG. 16. For example, a solvent wash can be applied to remove residual copolymer material from the spacers 20' that has not been cross-linked (e.g., it was masked during crosslinking of the polymer layers). Photo-patterning and a selective $O_2$ plasma etch can be used to remove crosslinked polymer material from the spacers 20'.

Selective removal of one of the polymer blocks of the layers 36a-36b' and the base film 28' can then be performed to produce the thin film 44' with openings/slits that expose the underlying substrate 10' and can be used as an etch mask. In the removal of the lamellar domains 38a-38b' and the half-cylinders domains 30' (e.g., PMMA), the matrix 32' (e.g., PS) situated underneath the half-cylinders 30' and over the trench floor 18' remains as shown by the intermediate structure 43' in FIG. 17. That portion of matrix 32' can be removed, for example, by a plasma $O_2$ or $CF_4$ etch, prior to a patterning process to expose the underlying substrate 10', resulting in the film 44' illustrated in FIGS. 18 and 18A.

Figure 18:
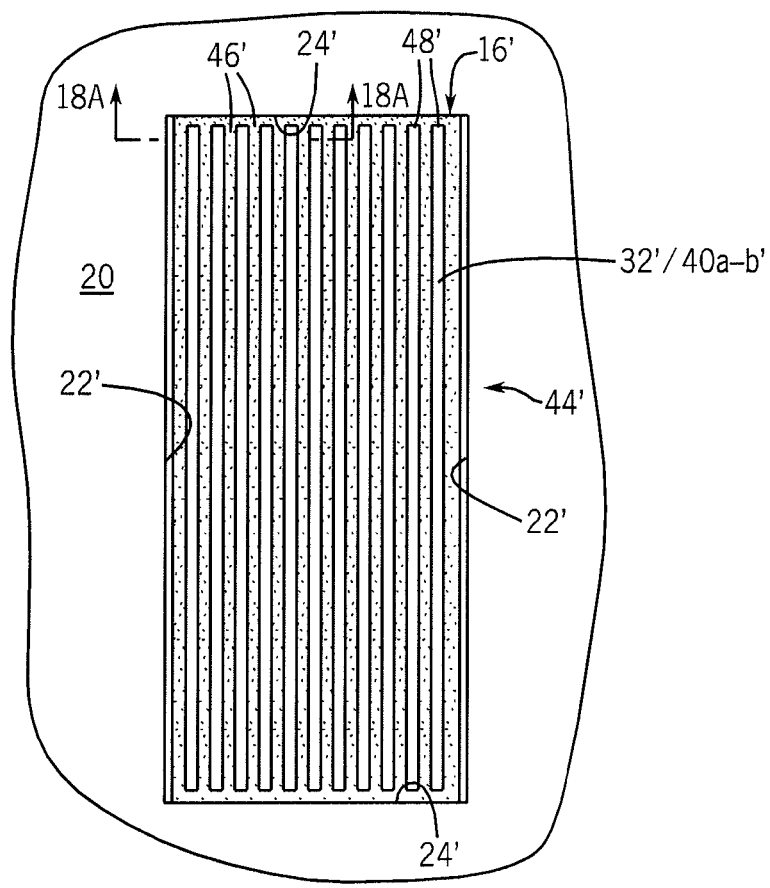
FIG. 18 illustrates a diagrammatic top plan view of a portion of the substrate of FIG. 17 at a subsequent stage.
Figure 18A:
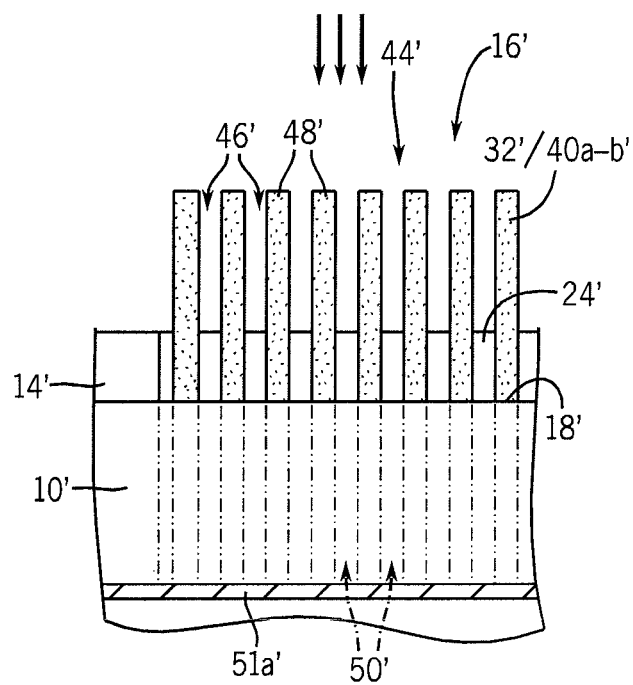
FIG. 18A illustrates an elevational, cross-sectional view of the substrate depicted in FIG. 18 taken along line 18A-18A.
Figure 18B:
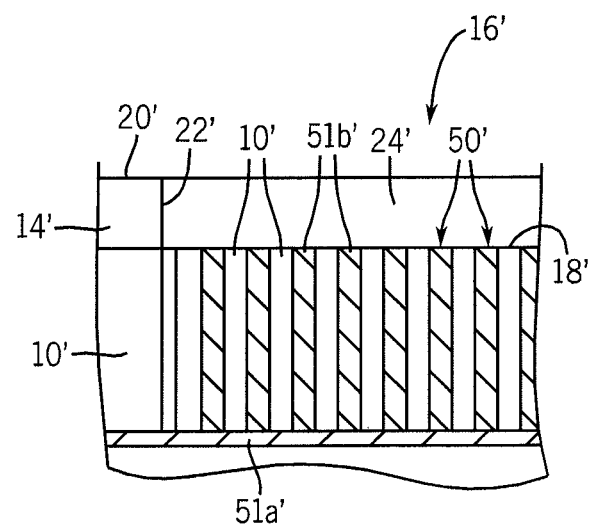
FIG. 18B is a view of FIG. 18A in a subsequent processing step.

The film can be used, for example, to pattern (arrows ↓↓) the underlying substrate 10' to delineate a series of channels or grooves 50', shown in phantom in FIG. 18A, to an active area or element 51a', which can then be filled with a material 51b', for example, a conductive metal or dielectric material, as depicted in FIG. 18B.

A method according to another embodiment of the invention for forming thin films of a cylindrical-phase self-assembling block copolymer that define an array of perpendicularly-oriented cylinders in a polymer matrix is illustrated with reference to FIGS. 19-25. The described embodiment utilizes topographical features, the sidewalls and ends of trenches, as constraints to induce orientation and registration of cylindrical copolymer domains to achieve a hexagonal array of perpendicularly-oriented cylinders within a polymer matrix registered to the trench sidewalls.

As described with reference to FIGS. 1 and 1A, a trench 16" is etched in a material layer 14" to expose a neutral wetting surface on an underlying substrate 10". The width ($w_t$) of the trench 16" is at or about $nL_o$. The ends 24" are angled to the sidewalls 22" as shown, for example, at an about 60° angle, and in some embodiments are slightly rounded.

The trenches are also structured such that the trench floor 18" is neutral wetting to both blocks of the copolymer material, and the sidewalls 22" and ends 24" are preferential wetting by the minority block of the copolymer. Entropic forces drive the wetting of a neutral-wetting surface by both blocks, resulting in a perpendicular orientation of the self-assembled cylinders. In the illustrated example, the material layer 14" is composed of silicon oxide ($SiO_x$) and the substrate 10" is composed of silicon. As previously described, a neutral wetting layer 12" can be provided, for example, by applying a neutral wetting polymer on the surface of the substrate 10" before forming the material layer 14", and the trenches 16" can be etched expose the neutral wetting layer 12" forming the trench floors 18". For example, in the use of a PS-b-PMMA diblock copolymer, a random copolymer brush layer (e.g., PS-r-PMMA, PS-r-PMMA-r-BCB, etc.) can be blanket deposited and grafted/crosslinked to the substrate 10". Another neutral wetting surface for PS-b-PMMA can be provided by hydrogen-terminated silicon, or by PS-r-PMMA (~60 mol % PS) graft polymerized in situ onto H-terminated silicon.

As previously described, sidewalls 22" and ends 24" that are preferential wetting toward the PMMA block of a PS-b-PMMA diblock copolymer can be provided by a material layer 14" composed of silicon oxide ($SiO_x$), silicon nitride, silicon oxycarbide, a PMMA polymer modified with a moiety containing hydroxyl (—OH) group(s) (e.g., hydroxyethylmethacrylate) grafted to a sidewall material such as silicon oxide, and resist materials such as such as methacrylate based resists. Upon annealing, the PMMA block of the PS-b-PMMA copolymer layer will segregate to the sidewalls and ends of the trench to form a wetting layer (30a" in FIGS. 19 and 19A).

As illustrated in FIGS. 2 and 2A, a cylindrical-phase diblock copolymer material 26" having an inherent pitch at or about $L_o$ (or blend with homopolymers) is deposited onto the neutral wetting layer 12" on the floor 18" of the trench 16" to a thickness ($t_1$) of less than or about equal to the $L_o$ value of the copolymer material to up to about $1.5 \times L_o$, such that the copolymer film layer will self-assemble upon annealing to form a hexagonal array of perpendicular cylindrical domains having a diameter of about 0.5 $L_o$ (e.g., about 20 nm) in the middle of a polymer matrix within each trench (e.g., with the adjacent cylindrical domains having a center-to-center distance of at or about $L_o$ (e.g., about 35 nm). In embodiments in which the base or template layer is formed from a cylinder-forming diblock copolymer, the volume fractions of the two blocks (AB) are generally at a ratio between about 60:40 and 80:20. An example of a cylindrical-phase PS-b-PMMA copolymer material ($L_o$=35 nm) is composed of about 70% PS and 30% PMMA with a total molecular weight ($M_n$) of 67 kg/mol, to form about 20 nm diameter cylindrical PMMA domains in a matrix of PS.

Figure 19:
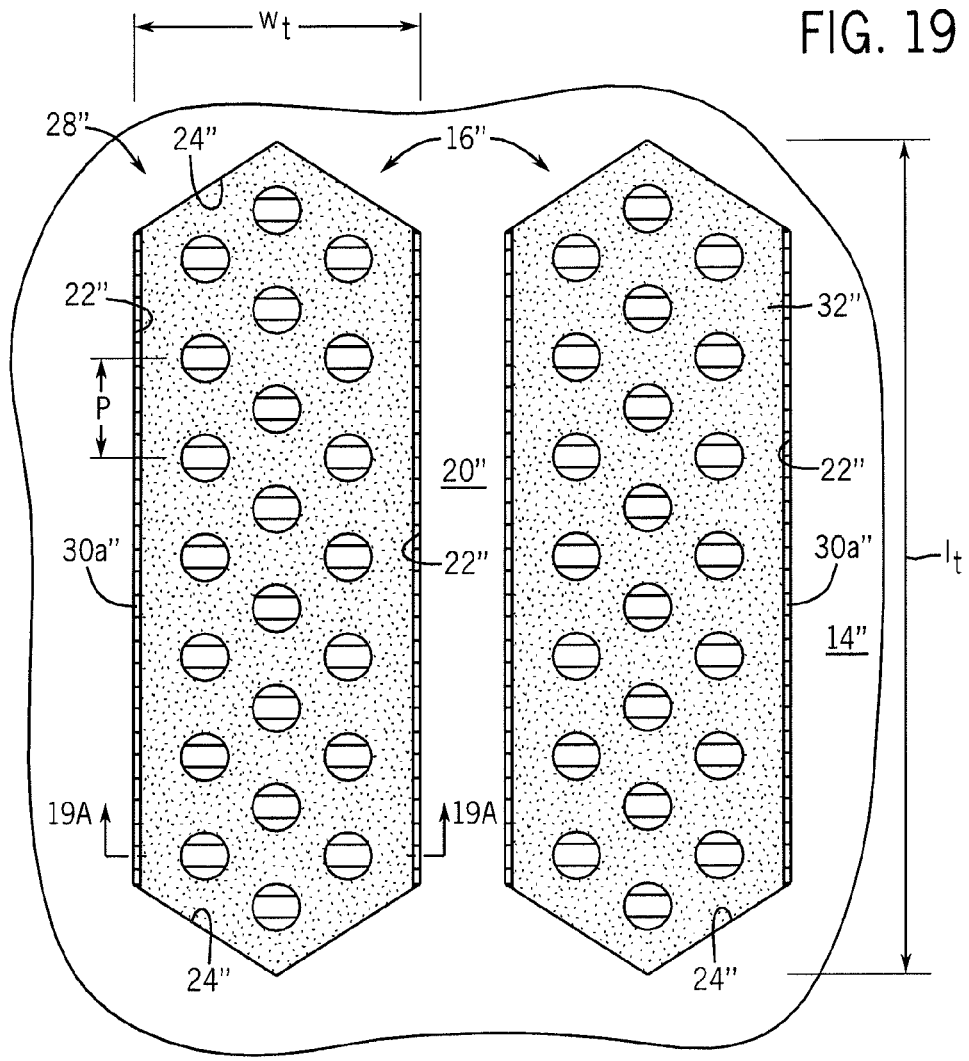
Figure 19A:
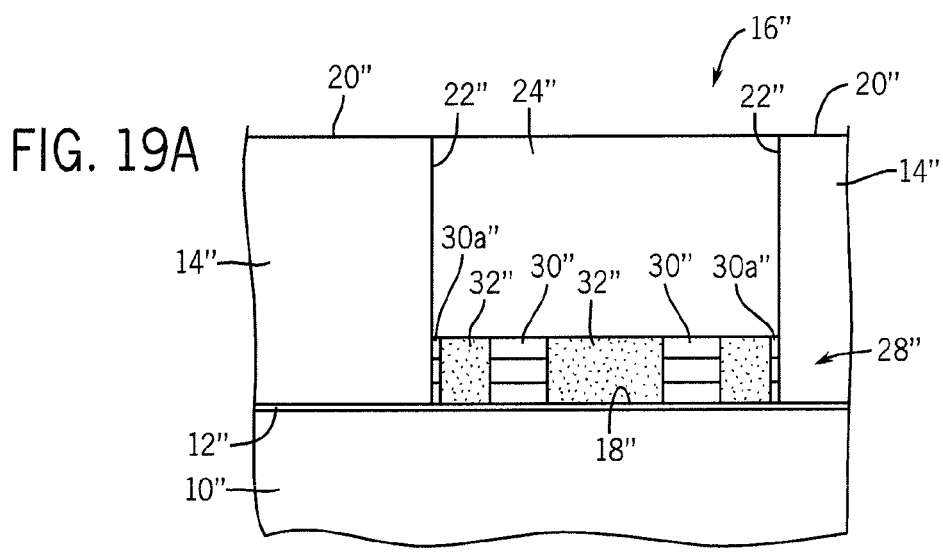

Referring now to FIGS. 19 and 19A, the cylindrical-phase diblock copolymer film 26" is then annealed, resulting in a base film 28". The character of the cylindrical-phase diblock copolymer composition 26" combined with a neutral wetting trench floor 18" and preferential wetting sidewalls 22" and ends 24", and constraints provided by the width ($w_t$) of trench 16" results, upon annealing, in a hexagonal array of perpendicularly-oriented cylindrical domains 30" of the minor polymer block (i.e., like domains) (e.g., PMMA) within a matrix 32" of the major polymer block (e.g., PS). A thin layer 30a" of the minor polymer block (e.g., PMMA) wets the sidewalls 18". The hexagonal array contains n single rows of cylinders according to the width ($w_t$) of the trench with the cylinders 30" in each row being offset by about $L_o$ (pitch distance or center-to-center distance) from the cylinders in the adjacent rows. Each row contains a number of cylinders, generally m cylinders, which number can vary according to the length ($l_t$) of the trench and the shape of the trench end (e.g., rounded, angled, etc.) with some rows having greater or less than m cylinders. The pitch distance between each cylinder 30" (within a row) is generally at or about $L_o$.

The annealed cylindrical-phase base film 28" is then treated to crosslink the polymer segments (e.g., to crosslink the PS matrix 32"). As previously described, the polymers can be structured to inherently crosslink, or one or both of the polymer blocks of the copolymer material can be formulated to contain a crosslinking agent. The polymer material remaining on the spacers 20" can then be removed as previously described.

Figure 20:
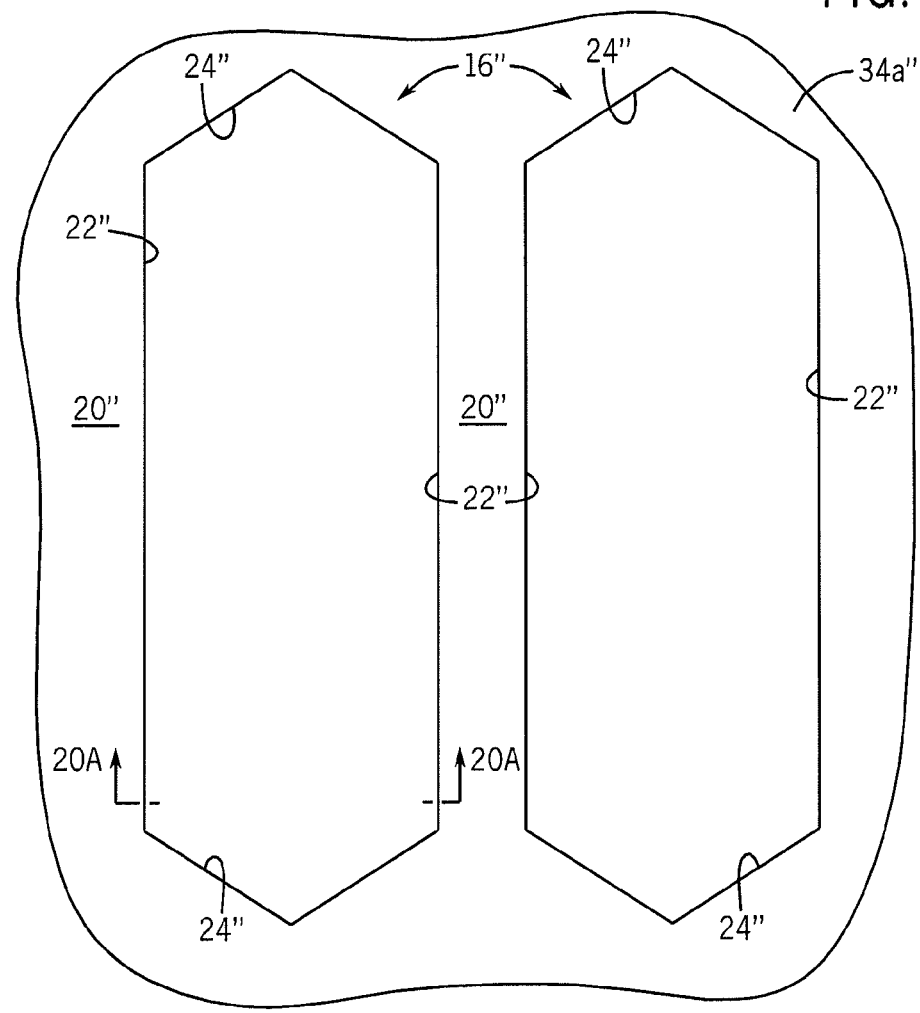
Figure 20A:
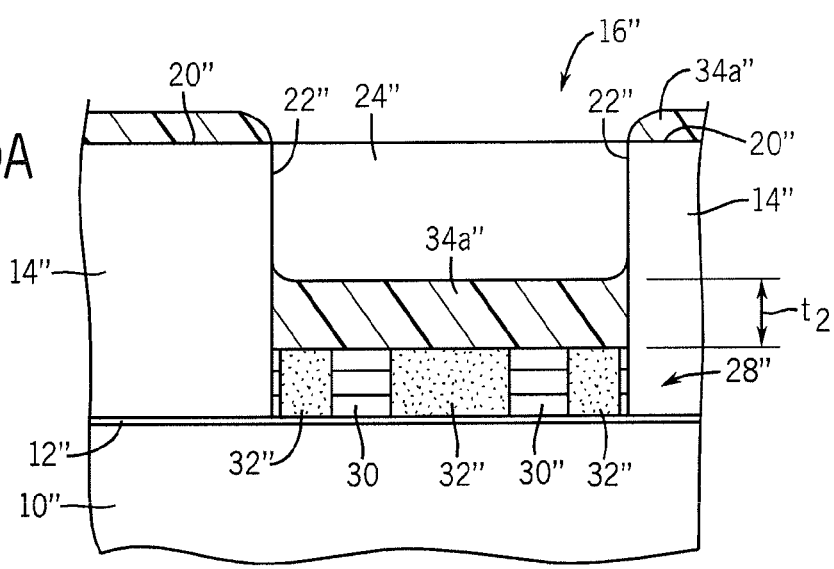
Figure 22:
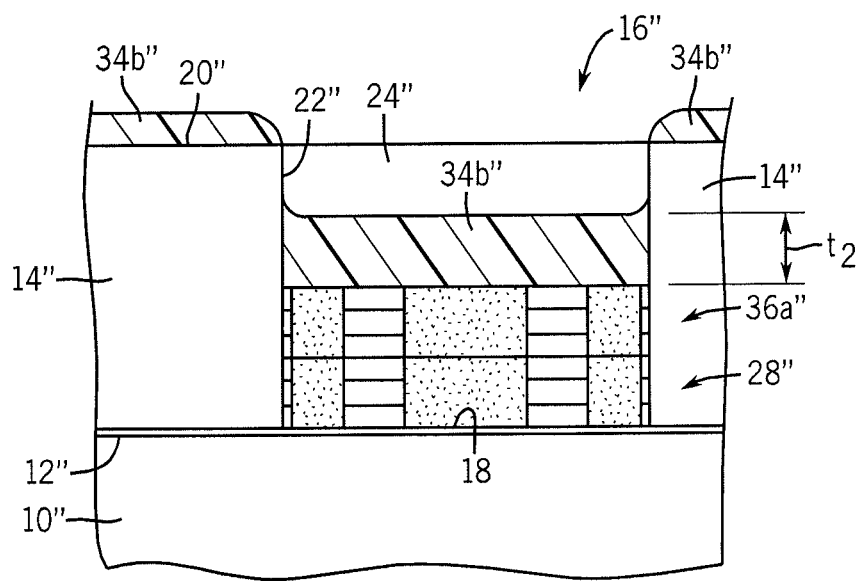
FIGS. 22 and 23 illustrate elevational, cross-sectional views of the substrate depicted in FIG. 21A, in subsequent stages.

As shown in FIGS. 20 and 20A, a layer 34a" of a cylindrical-phase block copolymer material (inherent pitch at or about $L_o$) is then deposited onto the annealed and crosslinked base film 28" to a thickness ($t_2$) at or about the $L_o$ value of the cylindrical-phase block copolymer material 36a". Subsequent annealing of the material of cylindrical-phase block copolymer layer 34a" results in a film 36a" composed of a single layer of a hexagonal array of perpendicular-oriented cylindrical domains 38a" within a polymer matrix 40a" which are ordered and registered to the underlying cylindrical domains 30" and matrix 32" of the base layer 28", as illustrated in FIGS. 21 and 21A, with the cylinders 38a" spaced apart and aligned with the cylinders 30" of the base layer 28", e.g., at a pitch distance (p) at or about $L_o*\cos(\pi/6)$ or 0.833 $L_o$ distance between two parallel lines where one line bisects the cylinders in a given row and the other line bisects the cylinders in an adjacent row, and at a pitch distance (p) at or about $L_o$ between cylinders in the same row and an adjacent row.

Figure 23:
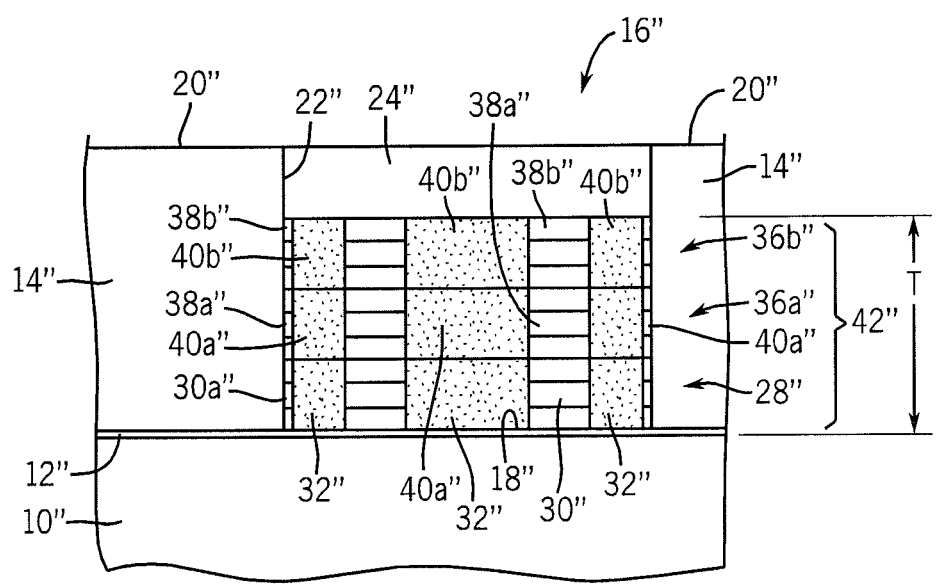

The annealed film 36a" is then treated to crosslink the polymer segments (e.g., PS matrix 40a") and the polymer material on the spacers 20" removed, as previously described. A second layer 34b" of the cylindrical-phase block copolymer material can be deposited onto the annealed and crosslinked film 36a" to a thickness ($t_2$) at or about $L_o$ (FIG. 22), and annealed to form a second film layer 36b" composed of perpendicular-oriented cylindrical domains 38b" in a matrix 40b" which are oriented and registered to the underlying cylinders 38a" and matrix 40a", as depicted in FIG. 23.

The film 36b" is then crosslinked, and the polymer material on the spacers 20" can be removed to produce the film structure 42" as shown. Additional layers of the cylindrical-phase diblock copolymer can be deposited, annealed and crosslinked to form a film structure of a desired thickness (7) and to increase the aspect ratio of the openings formed in the multilayered film.

Figure 24:
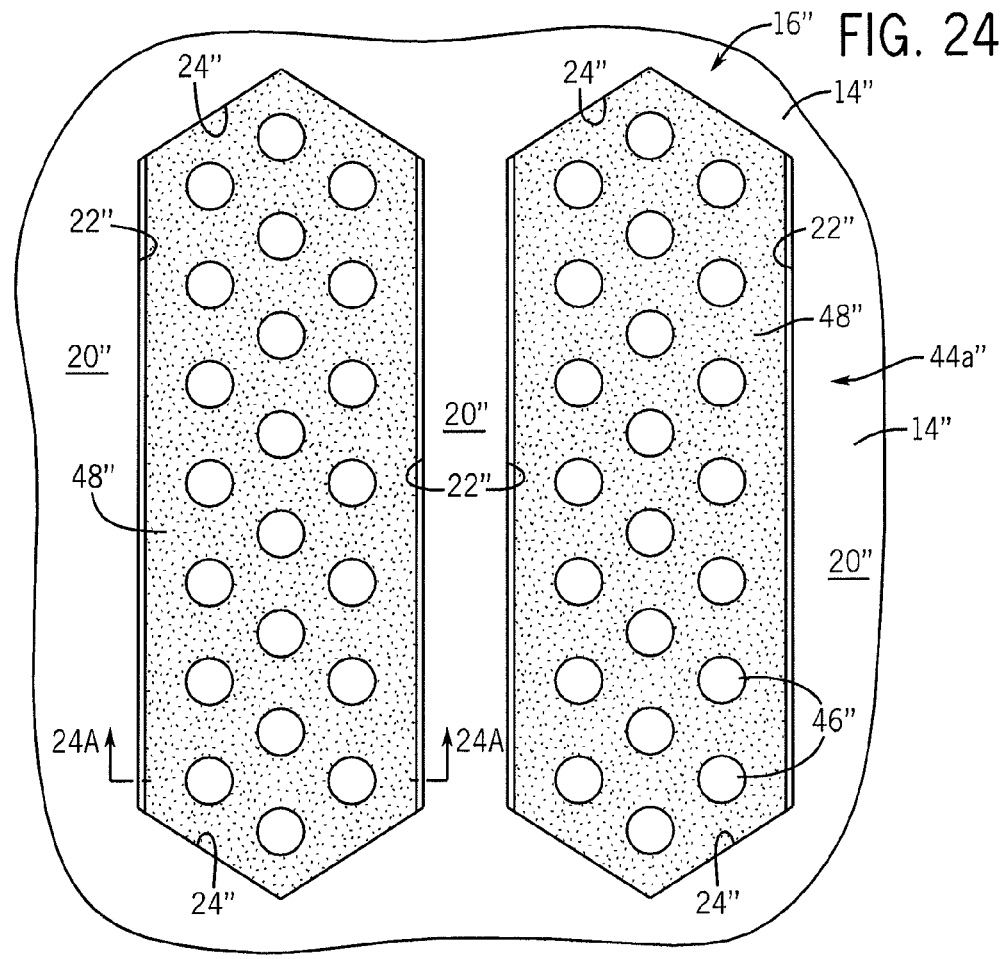
FIG. 24 illustrates a diagrammatic top plan view of a portion of the substrate of FIG. 23 showing the removal of cylindrical domains at a subsequent stage according to an embodiment of the invention.
Figure 24A:
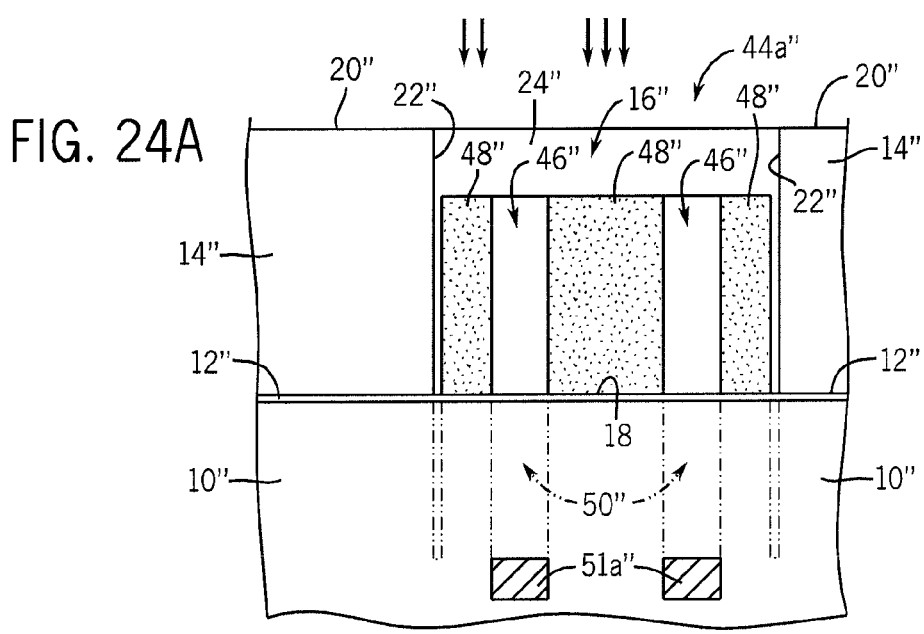
FIG. 24A illustrates an elevational, cross-sectional view of the substrate depicted in FIG. 24 taken along line 24A-24A.
Figure 25B:
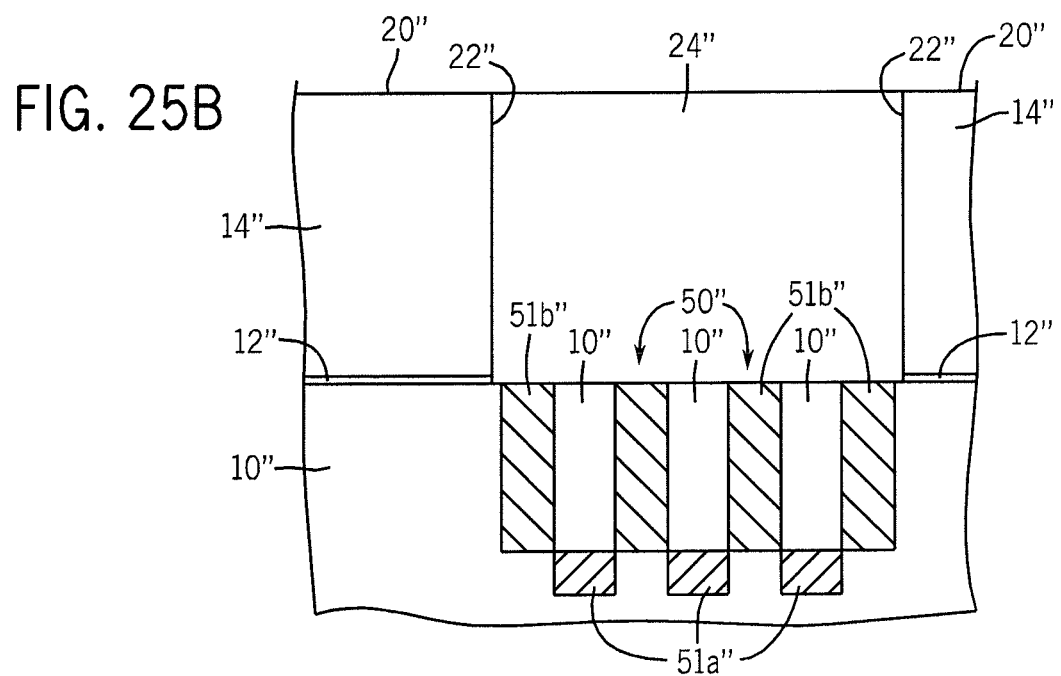
FIG. 25B is a view of FIG. 25A in a subsequent processing step.
Figure 25:
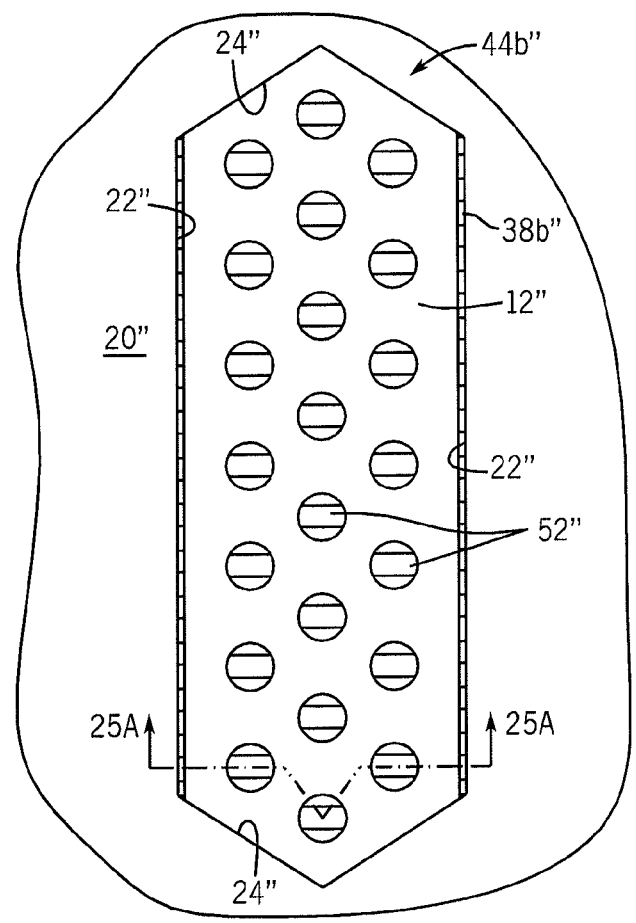
FIG. 25 illustrates a diagrammatic top plan view of a portion of the substrate of FIG. 24 showing the removal of the matrix domain at a subsequent stage according to another embodiment of the invention.
Figure 25A:
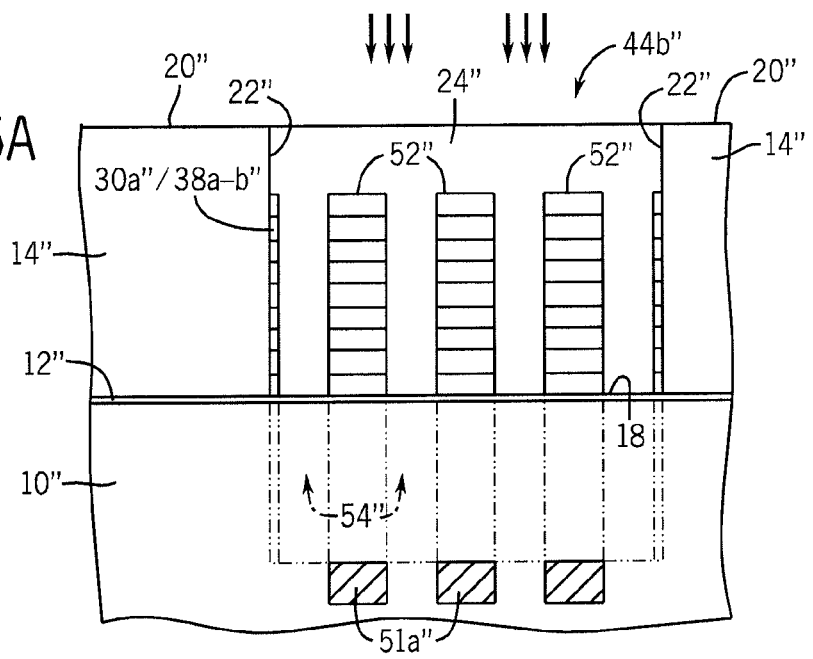
FIG. 25A illustrates an elevational, cross-sectional view of the substrate depicted in FIG. 25 taken along line 25A-25A.
Figure 27:
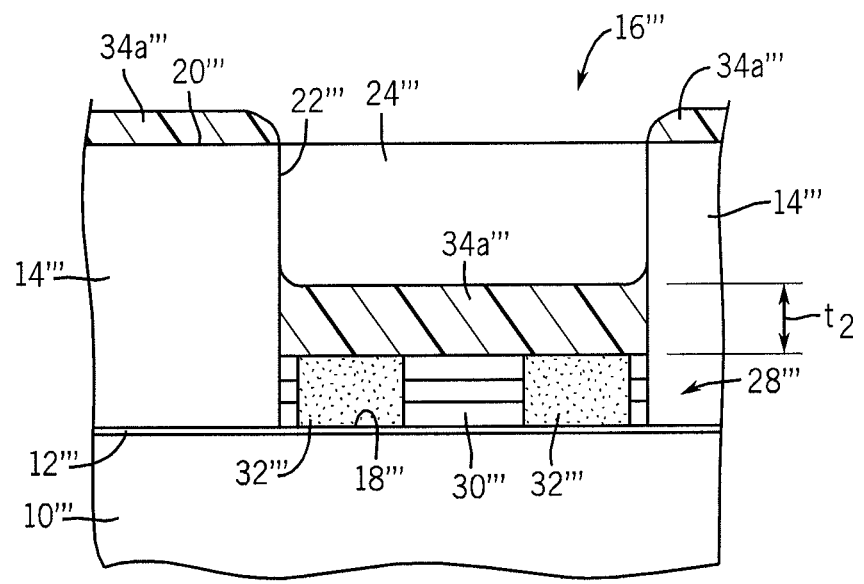
FIGS. 27-30 illustrate elevational, cross-sectional views of the substrate depicted in FIG. 26A, in subsequent stages.

One of the block components can then be selectively removed from the film 42", leaving either the matrix 48" to produce a film 44a" composed of a hexagonal array of cylindrical openings 46" as in FIGS. 24 and 24A, or the cylindrical domains 52" to produce a film 44b" as in FIGS. 25 and 25A. After selective removal of one of the polymer domains, the resulting films 44a", 44b" can be used, for example, as a lithographic template or mask to pattern the underlying substrate 10" in a semiconductor processing to define regular patterns in the nanometer size range (i.e., about 5-50 nm).

Figure 24B:
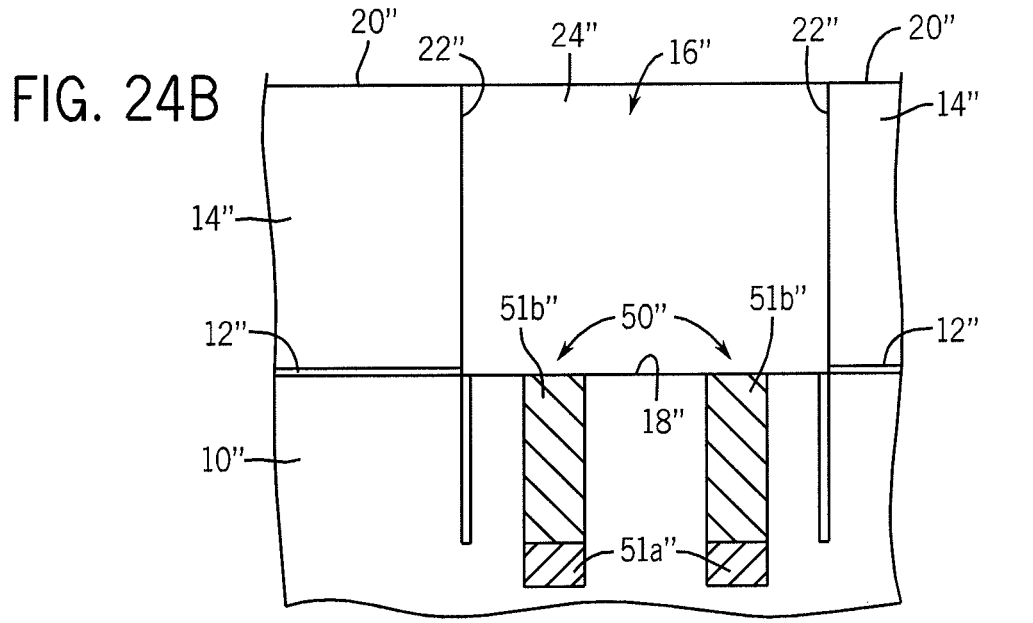
FIG. 24B is a view of FIG. 24A in a subsequent processing step.

For example, referring to FIGS. 24 and 24A, selective removal of the minor block cylinders 30", 38a-38b" (e.g., PMMA) will result in a film 44a" composed of a hexagonal array of openings 46" within the matrix 48" of the major block (e.g., PS), the openings having a diameter of about 5-50 nm and an aspect ratio generally at least about 1:2 and ranging from about 1:2 to about 1:20. The film 44a" can be used as an etch mask to pattern (arrows ↓↓) the underlying substrate 10" to form an array of openings 50" in the substrate 10" (shown in phantom in FIG. 24A) to an active area or element 51a". Further processing can then be performed as desired, for example, the removal of the residual matrix 48" (e.g., PS) and filling of the openings 50" in substrate 10" with a material 51b", as shown in FIG. 24B, for example, with a metal or conductive alloy such as Cu, Al, W, Si, and $Ti_3N_4$, among others, to form contacts, for example, to an underlying active area or conductive line 51a", or with a metal-insulator-metal-stack to form capacitors with an insulating material such as $SiO_2$, $Al_2O_3$, $HfO_2$, $ZrO_2$, $SrTiO_3$, among other dielectrics.

In another embodiment illustrated in FIGS. 25 and 25A, the selective removal of the major block matrix 32"/40a-40b" (e.g., PMMA) will provide a film 44b" composed of a hexagonal array of minor block cylinders 52" (e.g., PS). Such an embodiment would require a majority PMMA block copolymer and sidewalls composed of a material that is selectively PS-wetting (e.g., a gold sidewall or PS-grafted to the sidewall material). The film 44b" composed of cylinders 52" can be used as an etch mask (arrows 11) to etch a patterned opening 54" in the underlying substrate 10" (shown in phantom in FIG. 25A) with the substrate 10" etched to form cylinders masked by the cylindrical elements 52" of the film 44b". Further processing can then be conducted, for example, the removal of the residual cylinders 52" of the polymer mask 44b" and the deposition of a material 51b" distinct from substrate 10" into the opening 54" to provide a differential surface, as illustrated in FIG. 25B. For example, openings 54" in a silicon substrate 10" can be filled with a dielectric material such as $SiO_2$, with the cylinders of the residual substrate 10" (e.g., of silicon) providing contacts to an underlying active area or metal lines 51a'".

In an embodiment of a method to produce a one-dimensional (1-D) array of perpendicularly-oriented cylinders as illustrated in FIGS. 26-32, the foregoing process for forming a hexagonal array of cylinders with a cylindrical-phase block copolymer can be modified by utilizing the trench sidewalls and ends as constraints to induce orientation and registration of cylindrical copolymer domains in a single row parallel to the trench sidewalls.

In embodiments to provide a single row of cylinders within a polymer matrix, a trench 16'" is structured to have a width ($w_t$) that is at or about the $L_o$ value of the block copolymer material, a floor 18'" that is neutral wetting to both blocks of the copolymer material, and sidewalls 22'" and ends 24'" that are preferential wetting by the minority block of the copolymer. In the illustrated example, the material layer 14'" (e.g., $SiO_x$, SiN, etc.) exposed on the sidewalls 22'" and ends 24'" is preferential wetting toward the PMMA block of a PS-b-PMMA diblock copolymer, and the substrate 10'" (e.g., silicon) bears a neutral wetting layer 12'" (e.g., a neutral wetting polymer, H-terminated silicon) which is exposed at the trench floors 18'".

A cylindrical-phase diblock copolymer material film 26'" having an inherent pitch at or about $L_o$ (or blend with homopolymers) can be deposited onto the neutral wetting layer 12'" on the trench floor 18' to a thickness ($t_1$) of less than or about equal to the $L_o$ value of the copolymer material to up to about $1.5 \times L_o$ (as shown in FIGS. 2 and 2A). The cylindrical-phase diblock copolymer material film 26'" is then annealed, whereupon the copolymer film layer will self-assemble to form a base film 28', as illustrated in FIGS. 26 and 26A. The constraints provided by the width ($w_t$) of trench 16'" and the character of the cylindrical-phase diblock copolymer material film 26" combined with a neutral wetting trench floor 18' and preferential wetting sidewalls 22' and ends 24'" results in a one-dimensional (1-D) array or single row of perpendicularly-oriented cylindrical domains 30'" of the minority polymer block (e.g., PMMA) within a matrix 32'" of the major polymer block (e.g., PS), with the minority block segregating to the sidewalls 18'" of the trench to form a wetting layer 30a". In some embodiments, the cylinders have a diameter at or about $0.5\,L_o$ (e.g., about 20 nm), the number n of cylinders in the row is according to the length of the trench, and the center-to-center distance (pitch distance) (p) between each like domain (cylinder) is at or about $L_o$ (e.g., about 35 nm). The annealed cylindrical-phase base film 28' is then treated to crosslink the polymer segments (e.g., the PS matrix 32").

Figure 28:
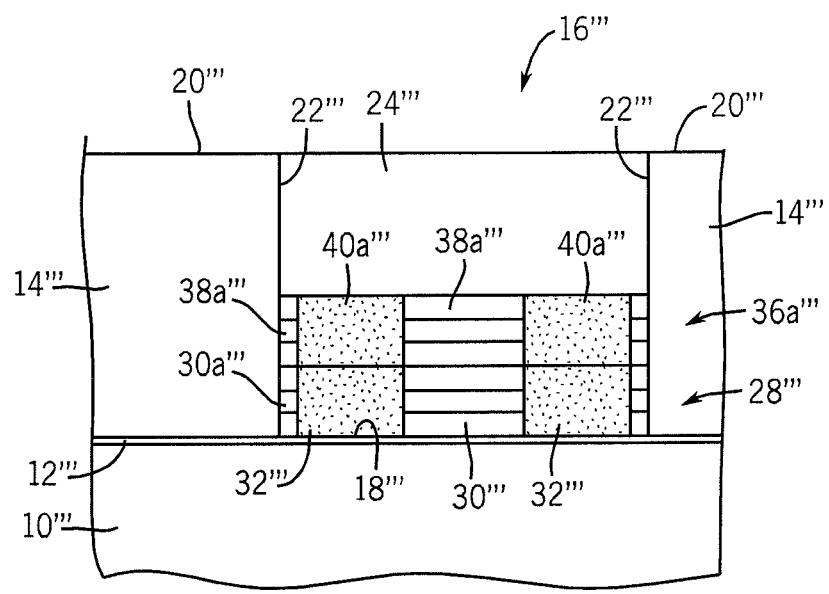
Figure 29:
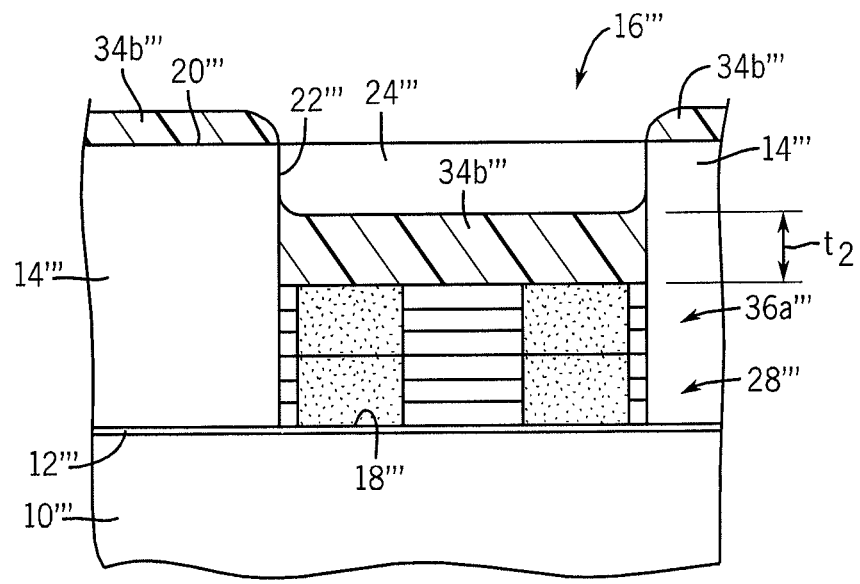
Figure 30:
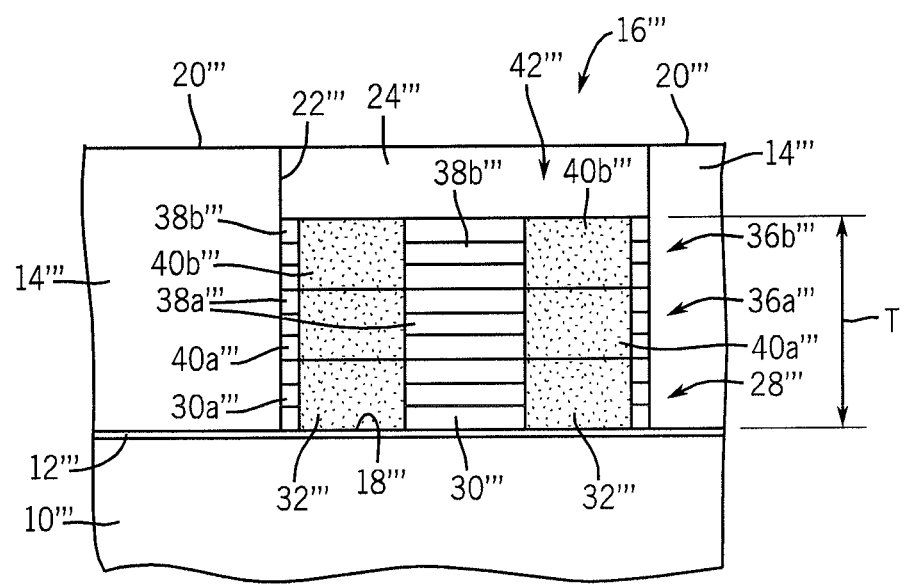

Processing can then be continued to form a cylindrical-phase block copolymer layer 36a'" on the base film (FIG. 27), which upon annealing results in a single layer of perpendicular cylindrical domains 38a'" within a polymer matrix 40a'", which are ordered and registered to the underlying cylindrical domains 30'" and matrix 32'" of the base layer 28'" (FIG. 28). The film 36a'" is then treated to crosslink the polymer segments (e.g., PS matrix 40a.'") as previously described. A second layer 34b'" of the cylindrical-phase block copolymer can then be deposited onto the annealed/crosslinked film 36a'" to a thickness ($t_2$) at or about $L_o$ (FIG. 29) and annealed. The resulting film 36b'" (FIG. 30) is composed of perpendicular-oriented cylindrical domains 38lf in a matrix 40b'" oriented and registered to the underlying cylinders 38a'" and matrix 40a'" of film 36a'". The film 36b'" is crosslinked, and non-ordered polymer material on the spacers 20'" can be removed to produce the film structure 42'. Additional layers of the cylindrical-phase diblock copolymer can be deposited, annealed and crosslinked to form a film structure of a desired thickness (T).

Figure 31:
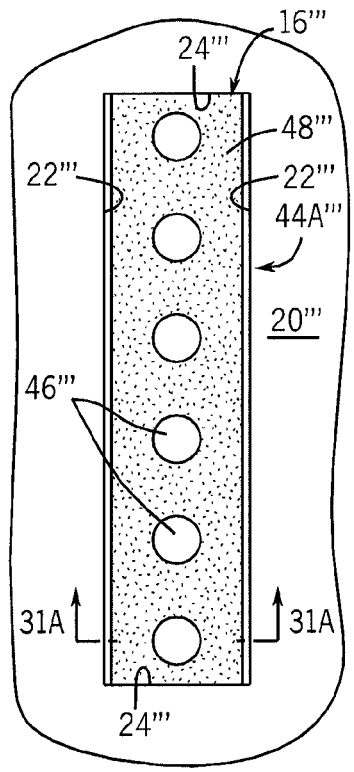
FIG. 31 illustrates a diagrammatic top plan view of a portion of the substrate of FIG. 30 showing the removal of cylindrical domains at a subsequent stage according to an embodiment of the invention.
Figure 31A:
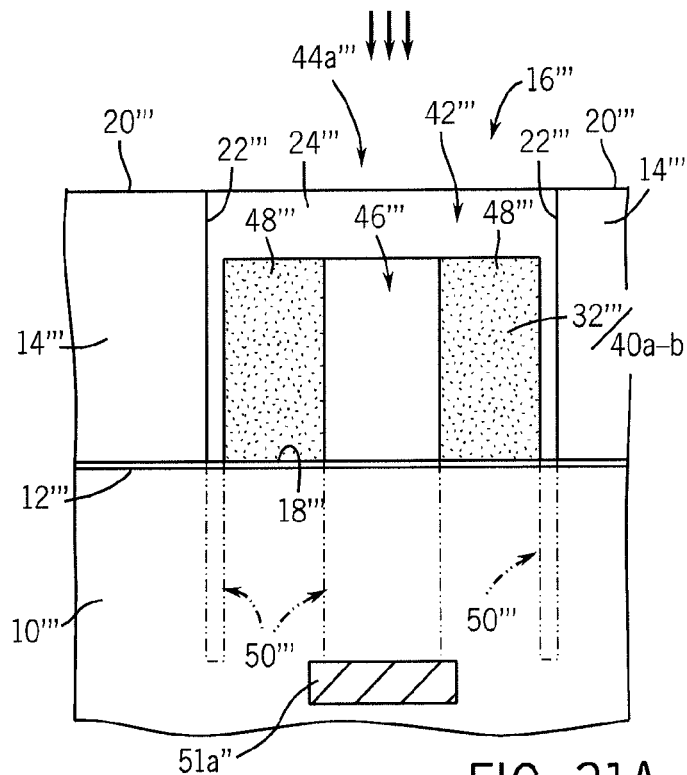
FIG. 31A illustrates an elevational, cross-sectional view of the substrate depicted in FIG. 31 taken along line 31A-31A.

Selective removal of one of the block components can then be performed resulting in a film 44a'" composed of the matrix 48'" with a 1-D array of cylindrical openings 46'" as in FIGS. 31 and 31A. In another embodiment, selective removal of the matrix components 32"/40a-40b'" produces a film 44b'" composed of a 1-D array of cylinders 52'" as in FIGS. 32 and 32A. The film can be used as a mask to etch the underlying substrate 10'".

Figure 31B:
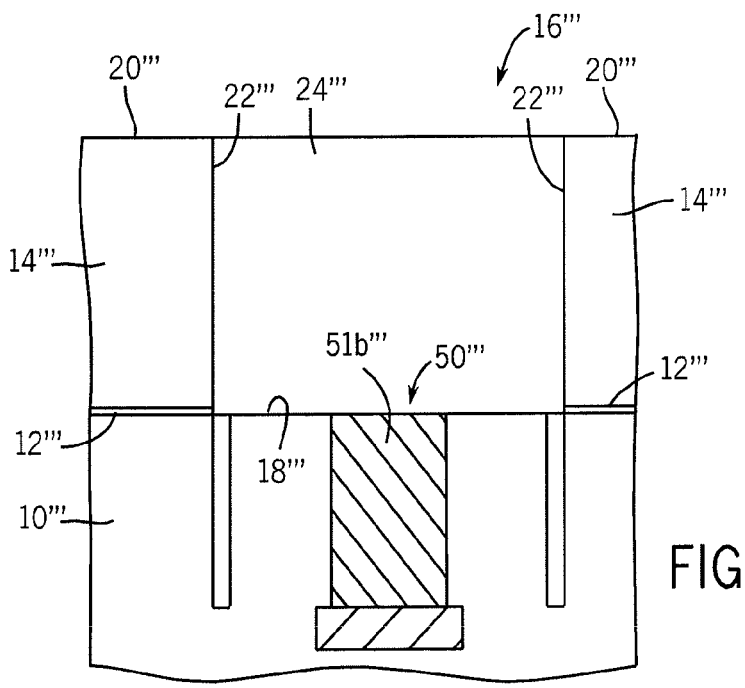
FIG. 31B is a view of FIG. 31A in a subsequent processing step.

For example, referring to FIGS. 31 and 31A, selective removal of the minor block cylinders 30'", 38a-38b'" (e.g., PMMA) will result in a film 44A'" composed of a 1-D array of openings 46''' within the matrix 48''' of the major block (e.g., PS), the openings having a diameter of about 5-50 nm and an aspect ratio of about 1:2 to about 1:20. The film 44A''' can be used as an etch mask to pattern (arrows ↓↓) the underlying substrate 10''' to form an array of openings 50''' (shown in phantom in FIG. 31A) extending to an active area or element 51a'''. The residual film 44A''' can then be removed and the openings 50''' in the substrate 10''' can be filled as shown in FIG. 31B with a material 51b''', for example, a metal or conductive alloy to provide a 1-D array of contacts to an underlying active area or line contact 51a''', for example, or with metal-insulator-metal-stacks to form capacitors. Further processing can then be performed as desired.

Figure 32:
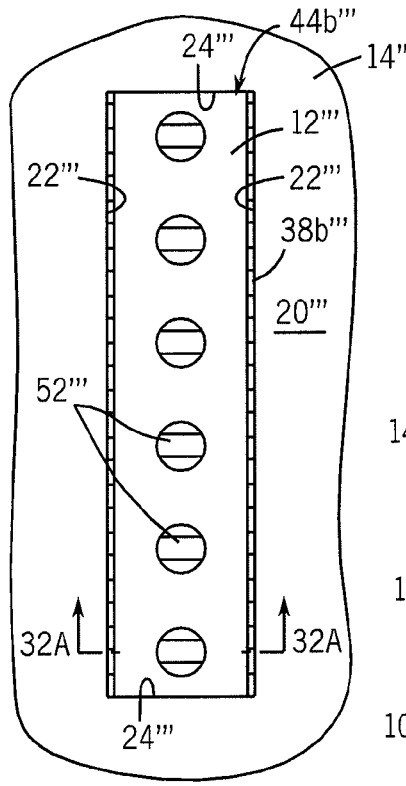
FIG. 32 illustrates a diagrammatic top plan view of a portion of the substrate of FIG. 30 showing the removal of the matrix domain at a subsequent stage according to another embodiment of the invention.
Figure 32A:
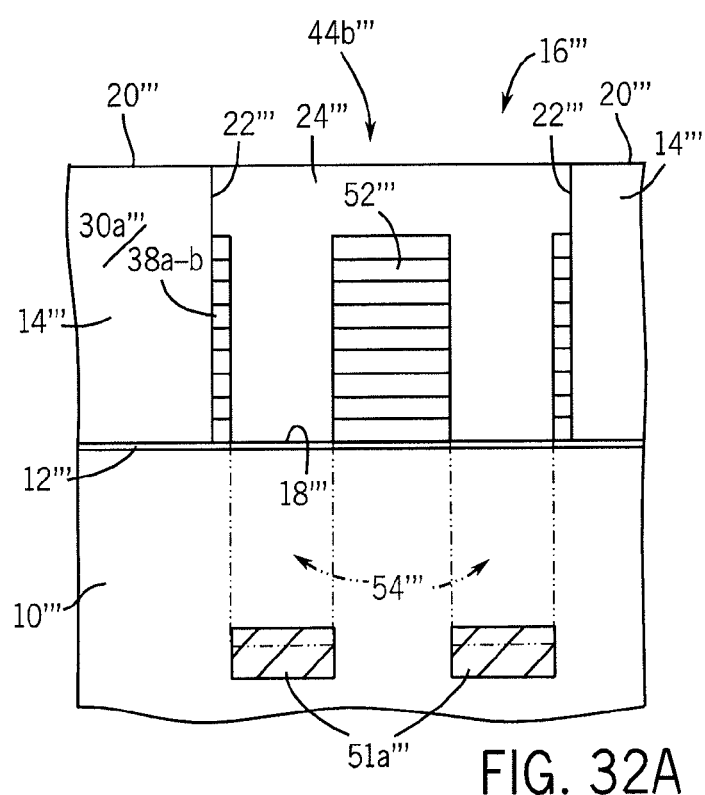
FIG. 32A illustrates an elevational, cross-sectional view of the substrate depicted in FIG. 32 taken along line 32A-32A.
Figure 32B:
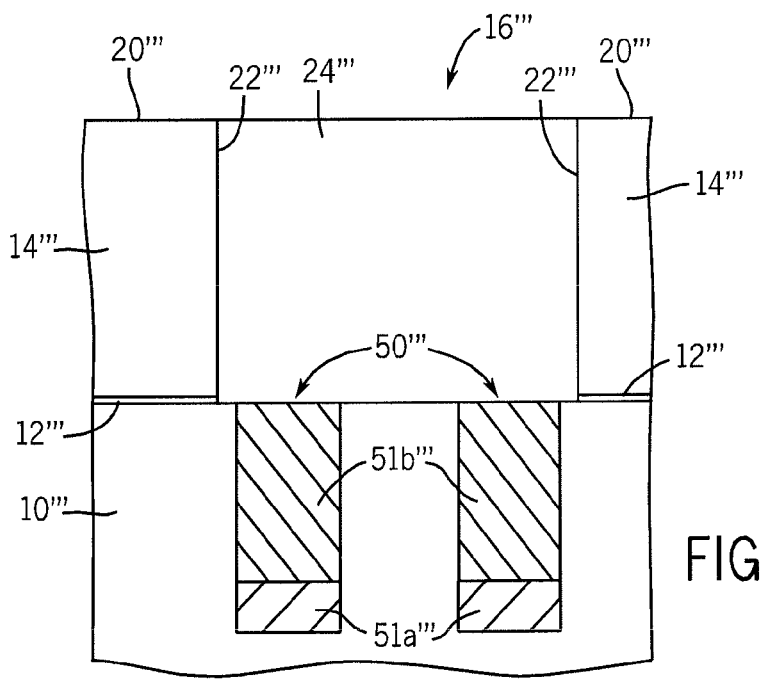
FIG. 32B is a view of FIG. 32A in a subsequent processing step.

In another embodiment depicted in FIGS. 32 and 32A, the selective removal of the major block matrix components 32''', 40a-40b''' (e.g., PMMA) will provide a film 44b''' composed of a 1-D array of the minor block cylinders 52''' (e.g., PS). The film 44b''' can be used as a mask or template in an etch process (arrows ↓↓) to form a patterned opening 54''' (shown in phantom in FIG. 32A) in the underlying substrate 10''', with the masked substrate 10''' etched to form cylinders. The residual cylinders 52''' of the polymer mask 44b''' can then be removed and a material 51b''' such as a dielectric material (e.g., oxide) that is distinct from the substrate 10''' (e.g., silicon) can be deposited to fill the opening 54'' as shown in FIG. 32B, to provide a differential surface to the substrate 10'' cylinders, which can provide contacts to an underlying active area or metal line 51a''', for example.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations that operate according to the principles of the invention as described. Therefore, it is intended that this invention be limited only by the claims and the equivalents thereof. The disclosures of patents, references and publications cited in the application are incorporated by reference herein.

What is claimed is:

1. A self-assembled block copolymer structure, comprising:
a first self-assembled block copolymer material within a trench in a substrate, the first self-assembled block copolymer material having a thickness greater than a depth of the trench, the first self-assembled block copolymer material comprising half-cylindrical domains parallel to sidewalls and extending a length of the trench; and
a second self-assembled block copolymer material overlying the first self-assembled block copolymer material and above the trench, the second self-assembled block copolymer material comprising a different material than the first self-assembled block copolymer material, the second self-assembled block copolymer material comprising lamellar domains perpendicular to a floor of the trench, the lamellar domains of the second self-assembled block copolymer material registered to the half-cylindrical domains of the first self-assembled block copolymer material.

2. The self-assembled block copolymer structure of claim 1, wherein the sidewalls are preferentially wetting sidewalls.

3. The self-assembled block copolymer structure of claim 1, wherein the half-cylindrical domains of the base block copolymer material are in a single row within the trench.

4. A self-assembled block copolymer structure within a trench in a substrate, the self-assembled block copolymer structure comprising:
alternating lamellar domains of a first polymer block and a second polymer block of a first block copolymer material, the alternating lamellar domains perpendicular to a floor of the trench at a pitch distance of about $L_o$ across a width and extending a length of the trench in a substantially parallel orientation to sidewalls of the trench, the alternating lamellar domains of the first block copolymer material registered to
underlying half-cylinders in a polymer matrix of a second block copolymer material, the half-cylinders extending the length of the trench and oriented parallel to the sidewalls and floor of the trench,
wherein the first block copolymer material comprises a different material than the second block copolymer material, and the self-assembled block copolymer structure comprises a thickness of at least about $2L_o$ of the second block copolymer material.

5. A multi-layered self-assembled block copolymer structure, comprising:
alternating lamellar domains of a first polymer block and a second polymer block of a lamellar-phase block copolymer material, the alternating lamellar domains above a trench and perpendicular to a floor of the trench; and
half-cylinder domains in a polymer matrix of a base block copolymer, the base block copolymer comprising a different material than the lamellar-phase block copolymer material, the half-cylinder domains underlying the alternating lamellar domains, the underlying half-cylinders within the trench and parallel to the floor and sidewalls of the trench, the alternating lamellar domains at a pitch distance of about $L_o$ of the base block copolymer material.

6. A template, comprising a self-assembled block copolymer structure within a trench, the self-assembled block copolymer structure comprising a plurality of lines spanning a width of the trench, the plurality of lines extending a length of the trench and separated by openings exposing a floor of the trench, the plurality of lines having a greater height than a depth of the trench,
the self-assembled block copolymer structure comprising a cylindrical-phase base block copolymer material and a lamellar-phase block copolymer material overlying the cylindrical-phase base block copolymer material, the lamellar-phase block copolymer material comprising a different material than the cylindrical-phase base block copolymer material,
the cylindrical-phase base block copolymer material comprising half-cylindrical polymer domains parallel to sidewalls and the floor of the trench,
the lamellar-phase block copolymer material comprising lamellar polymer domains perpendicular to the floor of the trench and registered to the half-cylindrical polymer domains of the cylindrical-phase base block copolymer material.

7. The template of claim 6, wherein the plurality of lines are separated by the openings exposing the floor of the trench, the openings comprising a width of from about 5 nm to 50 nm.

* * * * *

UNITED STATES PATENT AND TRADEMARK OFFICE
CERTIFICATE OF CORRECTION

PATENT NO.         : 9,142,420 B2                                         Page 1 of 1
APPLICATION NO.    : 13/470459
DATED              : September 22, 2015
INVENTOR(S)        : Dan B. Millward It is certified that error appears in the above-identified patent and that said Letters Patent is hereby corrected as shown below:

In the specification:

| | | |
|---|---|---|
| COLUMN 4,  | LINE 43, | change "&lined" to --formed-- |
| COLUMN 16, | LINE 15, | change "floor 18'''" to --floor 18□-- |
| COLUMN 16, | LINE 20, | change "film 28'," to --film 28□,-- |
| COLUMN 16, | LINE 23, | change "film 26''''" to --film 26□-- |
| COLUMN 16, | LINE 24, | change "18'''" to --18□-- |
| | | change "sidewalls 22'''" to --sidewalls 22□-- |
| COLUMN 16, | LINE 29, | change "layer 30$a$''." to --layer 30$a$□.-- |
| COLUMN 16, | LINE 35, | change "film 28'''" to --film 28□-- |
| COLUMN 16, | LINE 36, | change "matrix 32'')." to --matrix 32□).-- |
| COLUMN 16, | LINE 40, | change "matrix 40$a$''," to --matrix 40$a$□,-- |
| COLUMN 16, | LINE 49, | change "domains 381$f$" to --domains 38$b$□-- |
| COLUMN 16, | LINE 53, | change "structure 42'." to --structure 42□.- |
| COLUMN 16, | LINE 61, | change "32''/40$a$-40$b$□ to --32□/40$a$-40$b$□-- |

In the claims:

CLAIM 3, COLUMN 18,   LINE 2,    change "base block" to --first self-assembled block--

Signed and Sealed this
Fifteenth Day of March, 2016

Michelle K. Lee
*Director of the United States Patent and Trademark Office*

UNITED STATES PATENT AND TRADEMARK OFFICE
CERTIFICATE OF CORRECTION

PATENT NO.         : 9,142,420 B2
APPLICATION NO.    : 13/470459
DATED              : September 22, 2015
INVENTOR(S)        : Dan B. Millward Page 1 of 1

It is certified that error appears in the above-identified patent and that said Letters Patent is hereby corrected as shown below:

In the specification:

| | | |
|---|---|---|
| COLUMN 4, | LINE 43, | change "&lined" to --formed-- |
| COLUMN 16, | LINE 15, | change "floor 18′′′" to --floor 18′′′′-- |
| COLUMN 16, | LINE 20, | change "film 28′," to --film 28′′′,-- |
| COLUMN 16, | LINE 23, | change "film 26′′′′" to --film 26′′′-- |
| COLUMN 16, | LINE 24, | change "18′′′" to --18′′′′-- |
| | | change "sidewalls 22′′′" to --sidewalls 22′′′′-- |
| COLUMN 16, | LINE 29, | change "layer 30a′′." to --layer 30a′′′.-- |
| COLUMN 16, | LINE 35, | change "film 28′′′" to --film 28′′′′-- |
| COLUMN 16, | LINE 36, | change "matrix 32′′)." to --matrix 32′′′).-- |
| COLUMN 16, | LINE 40, | change "matrix 40a′′," to --matrix 40a′′′,-- |
| COLUMN 16, | LINE 49, | change "domains 381f" to --domains 38b′′′-- |
| COLUMN 16, | LINE 53, | change "structure 42′." to --structure 42′′′.-- |
| COLUMN 16, | LINE 61, | change "32′′/40a-40b′′′′" to --32′′′/40a-40b′′′-- |

In the claims:

| | | | |
|---|---|---|---|
| CLAIM 3, | COLUMN 18, | LINE 2, | change "base block" to --first self-assembled block-- |

Signed and Sealed this
Ninth Day of August, 2016

Michelle K. Lee
*Director of the United States Patent and Trademark Office*